(12) United States Patent
Tan et al.

(10) Patent No.: US 6,740,470 B2
(45) Date of Patent: May 25, 2004

(54) LITHOGRAPHIC PRINTING PLATE PRECURSOR

(75) Inventors: Shiro Tan, Shizuoka (JP); Tadahiro Sorori, Shizuoka (JP); Akira Nishioka, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 43 days.

(21) Appl. No.: 10/067,862

(22) Filed: Feb. 8, 2002

(65) Prior Publication Data

US 2003/0075066 A1 Apr. 24, 2003

(30) Foreign Application Priority Data

Feb. 8, 2001 (JP) ..................................... P.2001-032856

(51) Int. Cl.⁷ ................................................. G03F 7/09
(52) U.S. Cl. ................. 430/271.1; 430/278.1; 430/281.1; 430/286.1; 101/454
(58) Field of Search .................... 430/270.1, 271.1, 430/275.1, 278.1, 281.1, 285.1, 286.1, 287.1, 288.1, 302, 348, 944, 945, 964; 101/453, 454, 457, 463.1, 465, 466, 467

(56) References Cited

U.S. PATENT DOCUMENTS

| | | | | |
|---|---|---|---|---|
| 6,110,640 A | * | 8/2000 | Kawamura et al. | 430/270.1 |
| 6,242,155 B1 | * | 6/2001 | Yamasaki et al. | 430/270.1 |
| 2002/0055058 A1 | * | 5/2002 | Sorori et al. | 430/270.1 |
| 2003/0073034 A1 | * | 4/2003 | Tan et al. | 430/278.1 |

FOREIGN PATENT DOCUMENTS

| | | | | |
|---|---|---|---|---|
| EP | 1 246 012 A2 | * 10/2002 | ........... G03F/7/033 |
| JP | 54-135004 | 10/1979 | |
| JP | 62-170950 | 7/1987 | |
| JP | 8-15858 | 1/1996 | |
| JP | 10-142778 | * 5/1998 | ........... G03F/7/004 |
| JP | 2000-19724 | 1/2000 | |
| JP | 2000-187318 | 7/2000 | |
| JP | 2002-296774 | * 10/2002 | ........... G03F/7/033 |

* cited by examiner

*Primary Examiner*—Barbara Gilliam
(74) *Attorney, Agent, or Firm*—Sughrue Mion, PLLC

(57) ABSTRACT

A lithographic printing plate precursor comprises: a support; and an image-forming layer including a copolymer containing a specific fluoroaliphatic group and a repeating unit corresponding to at least one of a poly(oxyalkylene) acrylate and a poly(oxyalkylene) methacrylate.

21 Claims, No Drawings

LITHOGRAPHIC PRINTING PLATE PRECURSOR

FIELD OF THE INVENTION

The present invention relates to a novel lithographic printing plate precursor using an image-forming layer containing a polymer compound having a fluoroaliphatic group (hereinafter sometimes referred to as a "fluorine-based polymer"). More specifically, the present invention relates to a lithographic printing plate precursor capable of providing a lithographic printing plate ensured with uniform coated surface state free of occurrence of production failures such as bubbling and favored with excellent inking property.

BACKGROUND OF THE INVENTION

A lithographic printing plate precursor has a structure such that an image-forming composition is provided on a substrate. In a typical manufacturing process therefor, an image-forming composition dispersed or dissolved in an organic solvent and, if desired, an upper layer such as protective layer are coated and dried on a surface of a support appropriately subjected to surface treatment, undercoating, back coating and the like. In a typical platemaking process, physical properties of an image-forming composition on a support are changed imagewise by the surface exposure of contact or projection system through an image mask, or by the direct exposure using scanning or modulation of an electromagnetic wave based on image information from a computer, and thereafter, the image-forming composition in the non-image area is removed (developed), if desired, followed by a treatment for providing hydrophilic state, ink-receptive state or forming a protective film, whereby a lithographic printing plate precursor having a non-image area comprising a hydrophilic support surface layer and an image area comprising a hydrophobic composition surface layer is obtained. In a typical printing process of the lithographic printing plate obtained as such, the hydrophilic non-image area receives a fountain solution and the lipophilic image area receives an ink, whereby an ink image is formed on the surface. The obtained ink image is directly or indirectly transferred to a desired printing medium and thereby, a printed matter is obtained.

With respect to the image-forming layer used herein, various techniques are already known, for example, a technique of causing a negative change from soluble to insoluble or positive change from insoluble to soluble as physical properties on exposure, a technique of using a photochemical reaction or a heat mode process as a principle for the change in physical properties, or a technique of using a heat-sensitive recording system. Whichever image formation layer is used, technical problems to be solved are present in common for realizing a lithographic printing plate precursor having high usefulness. Namely, the technical problems are (1) that the image-forming layer has high uniformity and (2) that the image area has high hydrophobicity and the non-image area has high development removability. The uniformity of the image area is mainly related to the above-described production process in view of technique. A plate precursor insufficient in the uniformity seriously reduces the basic performance required for the printing plate such that a large number of homogeneous printed matters having a high-quality image are stably provided, and this plate precursor is not preferred. The high hydrophobicity of the image area is very important from the standpoint of elevating the durability against developer in the platemaking process and thereby obtaining excellent resolution or obtaining a sufficiently long press line or a sufficiently high inking property in the printing process. However, the high hydrophobicity of the image area may cause reduction of the solubility in an alkali aqueous solution usually used as a developer and in turn, undesirable results may be brought about, such as development failure of the non-image area or generation of sludge ingredient in the developer. In other words, the hydrophobicity of the image area and the removability of the non-image area are simply conflicting properties required for the image-forming layer, and a technique capable of achieving these properties at the same time is difficult to develop but is an important matter.

Regarding to this technical problem, a composition containing a polymer compound having a fluoroaliphatic group is known to be useful as an image-forming composition. For example, JP-A-54-135004 (the term "JP-A" as used herein means an "unexamined published Japanese patent application") discloses this composition as an effective technique for improving the uniformity of the image-forming layer. JP-A-62-170950, JP-A-8-15858 and JP-A-2000-19724 disclose a copolymer containing a monomer unit having a fluoroaliphatic group and a monomer unit having a specific functional group, with its usefulness. In these techniques, the deficient point in prior techniques disclosing the use of a polymer compound having a fluoroaliphatic group is improved merely by selecting an additional substituent capable of reducing the adverse effect of the polymer having a fluoroaliphatic group on the plate-making and printing processes or the other way effectively utilizing the polymer. To speak specifically, JP-A-62-170950 discloses an effect of more improving the function of bringing out the layer uniformity, resulting from the improvement of surface activation, JP-A-8-15858 discloses an effect of eliminating the retardation of developability ascribable to the hydrophobicity and JP-A-2000-19724 discloses an effect of forming a high-contrast image by utilizing the hydrophobicity and the orientation force and thereby achieving the hydrophobicity of the image area and the removability of the non-image area. Among these effects of the polymer compound having a fluoroaliphatic group, the layer uniformity is considered to come out by virtue of the surface activation capability of the polymer compound having a fluoroaliphatic group, in other word, a capability of reducing the surface tension of an organic solvent dispersion solution of image-forming composition in the production process. Other effects of the polymer compound having a fluoroaliphatic group are considered attributable to the high hydrophobicity of the fluoroaliphatic group-containing polymer compound contained in the image-forming layer of a lithographic printing plate precursor and also to its capability of orienting, deviating or localizing toward the surface of the image-forming layer. That is, the fluoroaliphatic group-containing polymer compound distribution in the image-forming layer can be made relatively high in the vicinity of the surface and therefore, high hydrophobicity can be imparted particularly to the surface while maintaining the development removability of the photosensitive layer as a whole. For improving the polymer compound having a fluoroaliphatic group, means other than the selection of copolymerization components may also be used. For example, JP-A-2000-187318 discloses a technique where an image-forming material having excellent discrimination in solubility between the image area and the non-image area can be obtained by a polymer compound using a monomer unit having two or more fluoroaliphatic groups.

As such, when the image-forming layer containing a fluoroaliphatic compound is used for a lithographic printing plate precursor, this image-forming layer is effective means for solving the above-described technical problems (1) and (2). However, the effects thereof are not sufficiently high and in fact, more improvements are demanded.

For example, in the case of using a positive image-forming layer, for obtaining a good printed matter, the image obtained after exposure and development preferably has a discrimination as high as possible between the image area and the non-image area, namely, a gradation (contrast) as high as possible, in view of image reproducibility and scratch resistance. At the same time, the requirements for high sensitivity, no blurring, white light safety and wide development latitude must be satisfied, however, a technique capable of fully satisfying these requirements has not yet been developed.

The term "soft image" as used herein means that when an image is exposed through a step wedge and then developed, the difference between the step number where the image starts remaining and the step number where the layers completely remain is large. The term "high-contrast image" as used herein means that the difference between the step number where the image starts remaining and the step number where the layers completely remain is small.

The "blurring" occurs when a lith film floats up due to a gas generated by the decomposition of a photosensitive substance and a complete contact exposure cannot be performed. In general, as the image has higher contrast with equal clear sensitivity, the blurring can be more easily eliminated. The "white light safety" indicates the safety of sensitivity of an image against exposure of the printing plate to white light such as fluorescent lamp and as the image has higher contrast, the white light safety is higher. The "step wedge" is a strip film having steps changed in the density with a variation of 0.15 one by one and this film is used for determining the relationship between the exposure amount and the amount of photosensitive layers remaining after the exposure and development. The "clear sensitivity" means the sensitivity when an image starts to form after the exposure and development. The "development latitude" is used for examining how much the image sensitivity is changed after the exposure and development with the change in the concentration of the developer and as the change in sensitivity is smaller, the development latitude is higher.

In a photopolymerization-type printing plate containing a polymerizable monomer having a double bond and a photopolymerization initiator as a representative negative lithographic printing plate, particularly a laser direct exposure-type printing plate having high sensitivity to a laser beam in the visible light region, the gradation thereof is conventionally soft and therefore, if a printing plate is fixed and the image exposure is performed by an inner drum-type laser plate setter which performs the exposure while rotating a mirror at a high speed, fogging is readily generated due to scattered or reflected light. In order to elevate the impression capacity of the printing plate, it is preferred to perform the exposure with a high energy, however, since fogging due to scattered or reflected light goes for the worth, the exposure amount cannot be increased to elevate the impression capacity. The impression capacity must be elevated without causing any generation of fogging due to scattered or reflected light even at a high exposure amount. This problem may be overcome by creating a high-contrast graduation. In the image exposure by a laser, the exposure time is about $1\mu$ second order per 1 dot and fogging due to scattered or reflected light occurs when a photosensitive material is exposed to extremely weak light for a long period of time such as a few minutes order and the photosensitive layer is thereby photocured. When the gradation of a photosensitive material is contrasted, the photosensitive material is hardly photocured by the weak light and can be removed by the development, as a result, fogging does not occur. In the case of a heat-sensitive lithographic printing plate on which the drawing is performed using an infrared laser, the discrimination between the image area and the non-image area is low, that is, the graduation is low (soft), and therefore, the portion touched with a hand may undergo slipping of an image or suffer from bad stability against external scratching.

SUMMARY OF THE INVENTION

The object of the present invention is to construct a technique capable of solving the above-described technical problems (1) and (2) to a level surpassing conventional techniques. More specifically, the object of the present invention is to provide a lithographic printing plate precursor ensured with excellent uniformity of the image-forming layer, capable of forming a high-contrast image without reducing the sensitivity, and favored with good inking property.

As a result of extensive investigations, the present inventors have found that the above-described objects can be attained by adding a specific fluorine-based polymer to the image-forming layer. The present invention has been accomplished based on the finding obtained by particularly studying on specific fluoroaliphatic groups and copolymer components.

More specifically, it has been found that a lithographic printing plate precursor having a construction such as (A) or (B) described later exerts an excellent effect on the above-described technical problems (1) and ail (2).

For example, a positive photosensitive resin composition capable of giving a uniform coated surface state free of any surface failure due to bubbling during the production, and ensuring good inking property without reducing the sensitivity, can be obtained.

Furthermore, it has been found that by adding the fluorine-based polymer according to the present invention, in addition to the above-described improvements in the surface state and inking property, the gradation of a negative lithographic printing plate precursor is increased and particularly, in the case of a laser light-sensitive photopolymerization-type printing plate, a printing plate showing high sensitivity to laser light, providing good effect against fogging due to scattered or reflected light and having high impression capability can be obtained.

It has been also found that in the case of a heat-sensitive lithographic printing plate precursor, in addition to the above-described improvements in the surface state and inking property, a printing plate having large discrimination and high image strength and therefore, being free of occurrence of image slipping on the portion touched with a hand and improved in the stability against external scratches can be obtained.

The lithographic printing plate precursor of the present invention comprises the following construction (A) or (B).

(A) A lithographic printing plate precursor comprising:
  a support; and
  an image-forming layer including a fluoroaliphatic group-containing copolymer,
  wherein the fluoroaliphatic group-containing copolymer contains a repeating unit corresponding to monomer (i) and a repeating unit corresponding to monomer (ii):

(i) a fluoroaliphatic group-containing monomer represented by formula (1) below, and
(ii) at least one of a poly(oxyalkylene) acrylate and a poly(oxyalkylene) methacrylate:

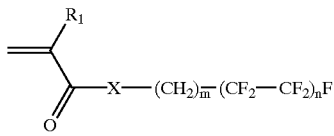

(1)

wherein $R_1$ represents a hydrogen atom or a methyl group; X represents an oxygen atom, a sulfur atom or $-N(R_2)-$; m represents an integer of 1 to 6; n represents an integer of 2 or 3; and $R_2$ represents a hydrogen atom or an alkyl group having 1 to 4 carbon atoms.

(B) A lithographic printing plate precursor comprising:
a support; and
an image-forming layer including a fluoroaliphatic group-containing polymer,
wherein the fluoroaliphatic group-containing polymer contains a repeating unit corresponding to monomer (i), a repeating unit corresponding to monomer (ii) and a repeating unit corresponding to monomer (iii):
  (i) a fluoroaliphatic group-containing monomer represented by formula (1) below,
  (ii) at least one of a poly(oxyalkylene)acrylate and a poly(oxyalkylene)methacrylate, and
  (iii) a monomer: copolymerizable with the monomers (i) and (ii); and represented by formula (2) below:

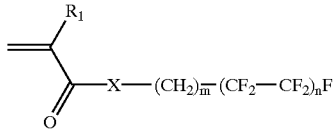

(1)

wherein $R_1$ represents a hydrogen atom or a methyl group; X represents an oxygen atom, a sulfur atom or $-N(R_2)-$; m represents an integer of 1 to 6; n represents an integer of 2 or 3; and $R_2$ represents a hydrogen atom or an alkyl group having 1 to 4 carbon atoms,

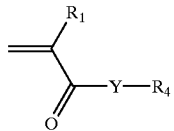

(2)

wherein $R_3$ represents a hydrogen atom or a methyl group, Y represents a divalent linking group, $R_4$ represents a linear, branched or cyclic alkyl group having 4 to 20 carbon atoms.

(1) The lithographic printing plate precursor as described in above (A) or (B), wherein the alkylene group in each of the poly(oxyalkylene) acrylate and the poly(oxy-alkylene) methacrylate has 2 to 4 carbon atoms.

(2) The lithographic printing plate precursor as described in above (A) or (B), wherein the poly(oxyalkylene) group in each of the poly(oxyalkylene) acrylate and the poly(oxyalkylene) methacrylate has a weight average molecular weight of 250 to 3,000.

(3) The lithographic printing plate precursor as described in above (A) or (B), wherein the fluoroaliphatic group-containing copolymer contains the repeating unit corresponding to the monomer (i) in an amount of 5 mol % or more, based on total amount of repeating units in the polymer.

(4) The lithographic printing plate precursor as described in above (A) or (B), wherein the fluoroaliphatic group-containing copolymer contains the repeating unit corresponding to the monomer (ii) in an amount of 10 mol % or more, based on total amount of repeating units in the polymer.

(5) The lithographic printing plate precursor as described in above (B), wherein the fluoroaliphatic group-containing copolymer contains the repeating unit corresponding to the monomer (iii) in an amount of 3 mol % or more, based on total amount of repeating units in the polymer.

(6) The lithographic printing plate precursor as described in above (A) or (B), wherein the fluoroaliphatic group-containing copolymer has a weight average molecular weight of 3,000 to 100,000.

(7) The lithographic printing plate precursor as described in above (A) or (B), wherein the image forming layer includes the fluoroaliphatic group-containing copolymer in an amount of 0.005 to 8 weight %, based on the weight of the image forming layer.

(8) The lithographic printing plate precursor as described in above (A), wherein the fluoroaliphatic group-containing copolymer contains:
  the repeating unit corresponding to monomer (i);
  the repeating unit corresponding to monomer (ii); and
  a repeating unit corresponding to at least one of a poly(oxyethylene) acrylate and a poly(oxyethylene) methacrylate.

(9) The lithographic printing plate precursor as described in above (B), wherein the fluoroaliphatic group-containing copolymer contains:
  the repeating unit corresponding to monomer (i);
  the repeating unit corresponding to monomer (ii);
  the repeating unit corresponding to monomer (iii); and
  a repeating unit corresponding to at least one of a poly(oxyethylene) acrylate and a poly(oxyethylene) methacrylate.

(10) The lithographic printing plate precursor as described in above (A) or (B), wherein the support is an aluminum substrate, and the image forming layer is a photosensitive layer containing a light-heat converting agent and a binder resin, in which the photosensitive layer can increase or decrease in the solubility in an alkaline developer upon exposure to laser beams.

(11) The lithographic printing plate precursor as described in above (A) or (B), wherein the support is an aluminum substrate, and the image forming layer is a photosensitive layer containing a light-heat converting agent, a heat radical generator and a radical polymerizable compound, in which the photosensitive layer can decrease in the solubility in an alkaline developer upon exposure to laser beams.

DETAILED DESCRIPTION OF THE INVENTION

The copolymer having a fluoroaliphatic group (sometimes simply referred to as a "fluorine-based polymer") according to the present invention is described in detail below.

As for the fluorine-based polymer for use in the present invention, acrylic resin, methacrylic resin, and copolymers with a vinyl-based monomer copolymerizable with the acrylic or the methacrylic resin, each of which can satisfy the requirements described in (A) or (B), are useful.

One of the fluoroaliphatic groups in the fluorine-based polymer according to the present invention is derived from a fluoroaliphatic compound produced by a telomerization method (also called telomer method) or an oligomerization method (also called oligomer method). The method for producing these fluoroaliphatic compounds is described, for example, in Nobuo Ishikawa (supervisor), *Fukka Kagoubutsu no Gosei to Kinou* (*Synthesis and Function of Fluorocompounds*), CMC, pp. 117–118 (1987), and Milos Hudlicky and Attila E. Pavlath (compiler), *Chemistry of Organic Fluorine Compounds II*, Monograph 187, pp. 747–752, American Chemical Society (1995). The telomerization method is a method for synthesizing a telomer by performing a radical polymerization of a fluorine-containing vinyl compound such as tetrafluoroethylene using an alkyl halide having a large chain transfer constant, such as iodide, as the telogen (an example is shown in Scheme-1).

Scheme 1:

The obtained terminal iodinated telomer is usually subjected to an appropriate chemical modification of the terminal, for example, as in [Scheme 2] and thereby led to a fluoroaliphatic compound. This compound is furthermore converted into a desired monomer structure, if desired, and used in the production of a fluoroaliphatic group-containing polymer.

Scheme 2:

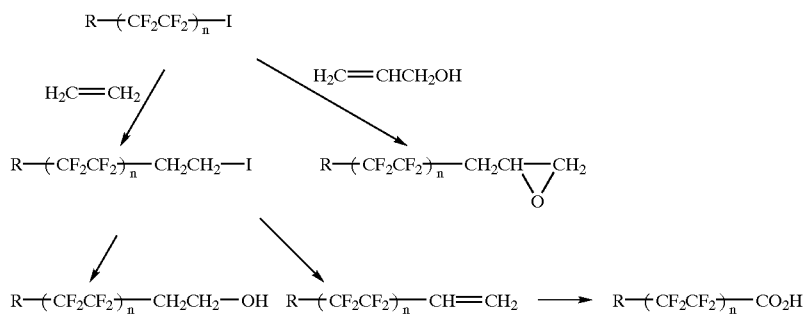

In formula (1) of the present invention, $R_1$ represents a hydrogen atom or a methyl group and X represents an oxygen atom, a sulfur atom or $-N(R_2)-$, wherein $R_2$ represents a hydrogen atom or an alkyl group having from 1 to 4 carbon atoms, specifically a methyl group, an ethyl group, a propyl group or a butyl group, preferably a hydrogen atom or a methyl group. X is preferably an oxygen atom.

In formula (1), m is preferably an integer of 1 to 6, more preferably 2.

In formula (1), n is 2 or 3, and the monomer may be a mixture of a monomer where n is 2 and a monomer where n is 3.

Specific examples of the fluoroaliphatic group-containing monomer represented by formula (1) are set forth below, however, the present invention is not limited thereto.

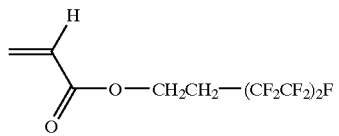

F-1

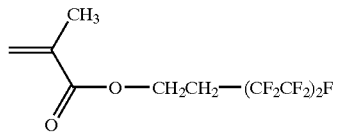

F-2

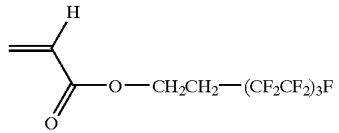

F-3

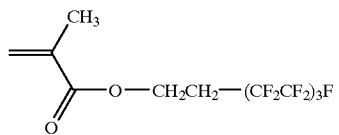

F-4

-continued

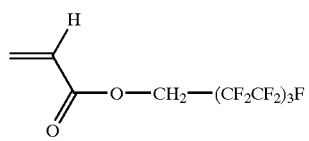

F-5

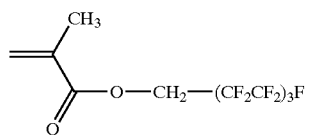

F-6

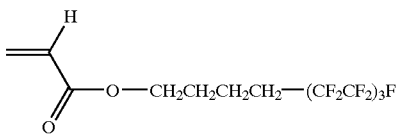

F-7

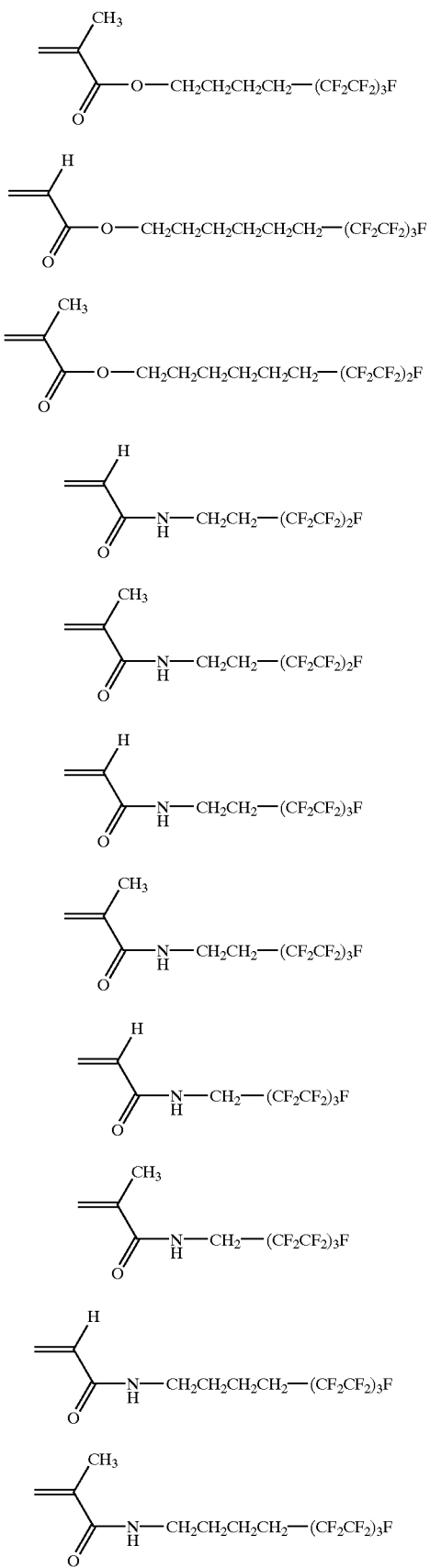
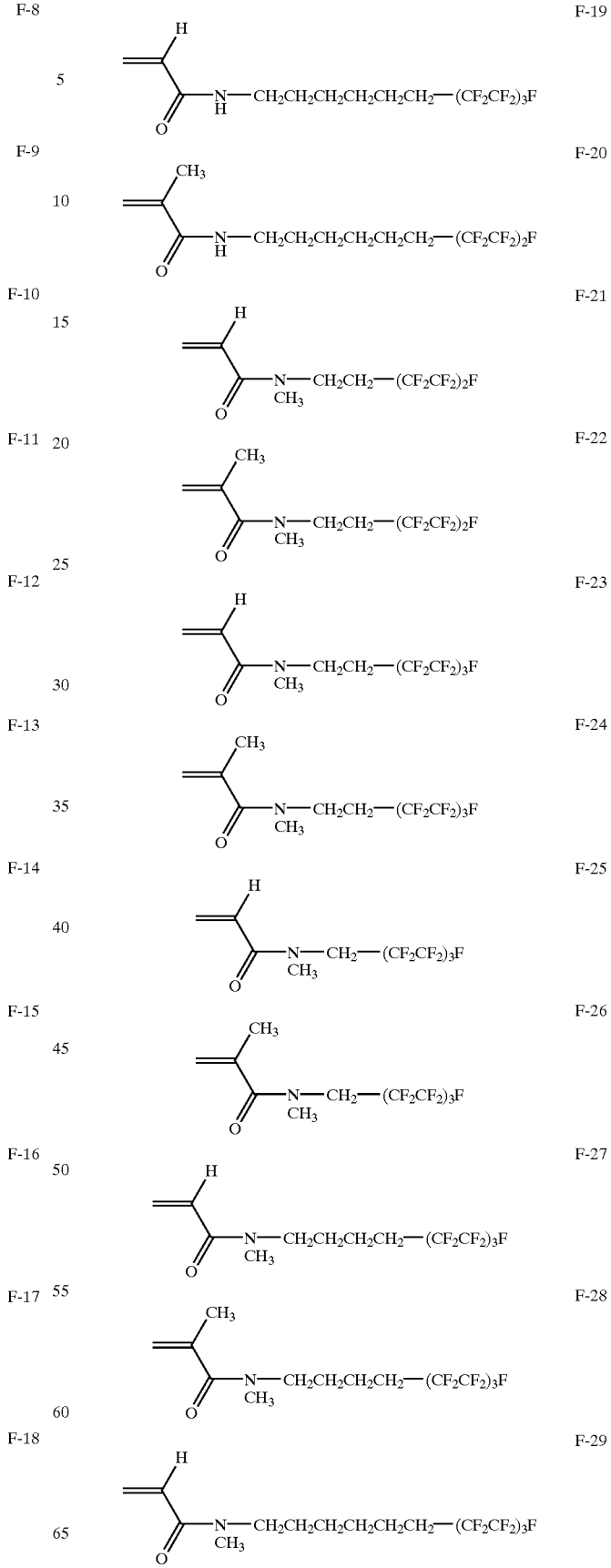

| | |
|---|---|
| F-30  CH₂=C(CH₃)−C(=O)−N(CH₃)−CH₂CH₂CH₂CH₂CH₂CH₂−(CF₂CF₂)₂F | F-41  CH₂=CH−C(=O)−N(CH₂CH₂CH₃)−CH₂CH₂−(CF₂CF₂)₂F |
| F-31  CH₂=CH−C(=O)−N(CH₂CH₃)−CH₂CH₂−(CF₂CF₂)₂F | F-42  CH₂=C(CH₃)−C(=O)−N(CH₂CH₂CH₃)−CH₂CH₂−(CF₂CF₂)₂F |
| F-32  CH₂=C(CH₃)−C(=O)−N(CH₂CH₃)−CH₂CH₂−(CF₂CF₂)₂F | F-43  CH₂=CH−C(=O)−N(CH₂CH₂CH₃)−CH₂CH₂−(CF₂CF₂)₃F |
| F-33  CH₂=CH−C(=O)−N(CH₂CH₃)−CH₂CH₂−(CF₂CF₂)₃F | F-44  CH₂=C(CH₃)−C(=O)−N(CH₂CH₂CH₃)−CH₂CH₂−(CF₂CF₂)₃F |
| F-34  CH₂=C(CH₃)−C(=O)−N(CH₂CH₃)−CH₂CH₂−(CF₂CF₂)₃F | F-45  CH₂=CH−C(=O)−N(CH₂CH₂CH₃)−CH₂−(CF₂CF₂)₃F |
| F-35  CH₂=CH−C(=O)−N(CH₂CH₃)−CH₂−(CF₂CF₂)₃F | F-46  CH₂=C(CH₃)−C(=O)−N(CH₂CH₂CH₃)−CH₂−(CF₂CF₂)₃F |
| F-36  CH₂=C(CH₃)−C(=O)−N(CH₂CH₃)−CH₂−(CF₂CF₂)₃F | F-47  CH₂=CH−C(=O)−N(CH₂CH₂CH₃)−CH₂CH₂CH₂CH₂−(CF₂CF₂)₃F |
| F37  CH₂=CH−C(=O)−N(CH₂CH₃)−CH₂CH₂CH₂CH₂−(CF₂CF₂)₃F | F-48  CH₂=C(CH₃)−C(=O)−N(CH₂CH₂CH₃)−CH₂CH₂CH₂CH₂−(CF₂CF₂)₃F |
| F38  CH₂=C(CH₃)−C(=O)−N(CH₂CH₃)−CH₂CH₂CH₂CH₂−(CF₂CF₂)₃F | F-49  CH₂=CH−C(=O)−N(CH₂CH₂CH₃)−CH₂CH₂CH₂CH₂CH₂CH₂−(CF₂CF₂)₃F |
| F-39  CH₂=CH−C(=O)−N(CH₂CH₃)−CH₂CH₂CH₂CH₂CH₂−(CF₂CF₂)₃F | F-50  CH₂=C(CH₃)−C(=O)−N(CH₂CH₂CH₃)−CH₂CH₂CH₂CH₂CH₂CH₂−(CF₂CF₂)₂F |
| F-40  CH₂=C(CH₃)−C(=O)−N(CH₂CH₃)−CH₂CH₂CH₂CH₂−(CF₂CF₂)₂F | F-51  CH₂=CH−C(=O)−N(CH₂CH₂CH₂CH₃)−CH₂CH₂−(CF₂CF₂)₂F |

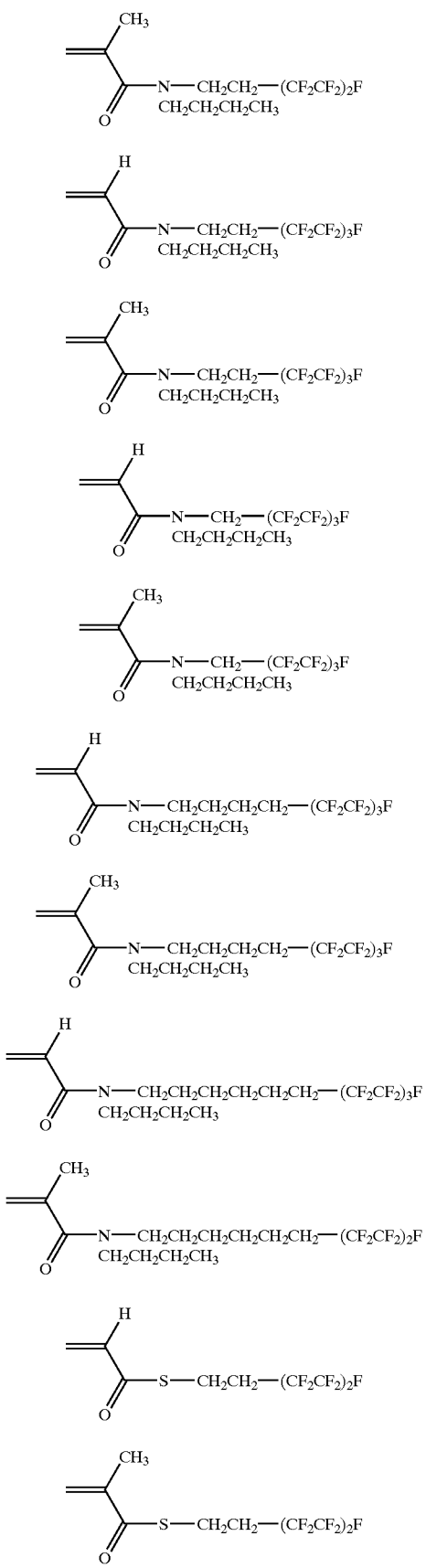

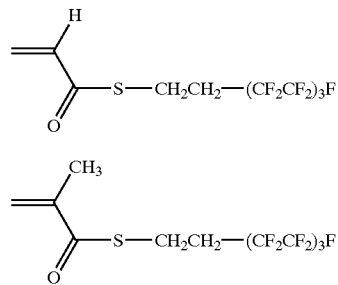

In formula (2), $R_3$ represents a hydrogen atom or a methyl group, and Y represents a divalent linking group. Preferred examples of the divalent linking group include an oxygen atom, a sulfur atom and —N($R_5$)—, wherein $R_5$ is preferably a hydrogen atom or an alkyl group having from 1 to 4 carbon atoms, such as methyl group, ethyl group, propyl group or butyl group, and $R_5$ is more preferably a hydrogen atom or a methyl group.

Y is preferably an oxygen atom, —N(H)— or —N(CH$_3$)—.

$R_4$ represents a linear, branched or cyclic alkyl group having from 4 to 20 carbon atoms, which may have a substituent. Examples of the substituent of the alkyl group represented by $R_4$ include a hydroxyl group, an alkylcarbonyl group, an arylcarbonyl group, a carboxyl group, an alkyl ether group, an aryl ether group, a hydrogen atom such as fluorine, chlorine and bromine, a nitro group, a cyano group and an amino group, however, the present invention is not limited thereto. Suitable examples of the linear, branched or cyclic alkyl group having from 4 to 20 carbon atoms include monocyclic cycloalkyl groups such as butyl group, pentyl group, hexyl group, heptyl group, octyl group, nonyl group, decyl group, undecyl group, dodecyl group, tridecyl group, tetradecyl group, pentadecyl group, octadecyl group and eicosanyl group, which may be linear or branched, and polycyclic cycloalkyl groups such as bicycloheptyl group, bicyclodecyl group, tricycloundecyl group, tetracyclododecyl group, adamantyl group, norbornyl group and tetracyclodecyl group.

More specific examples of the monomer represented by formula (2) include the following monomers, however, the present invention is not limited thereto.

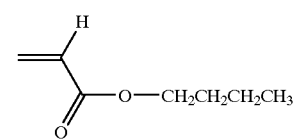

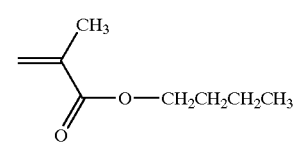

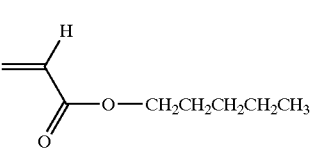

-continued
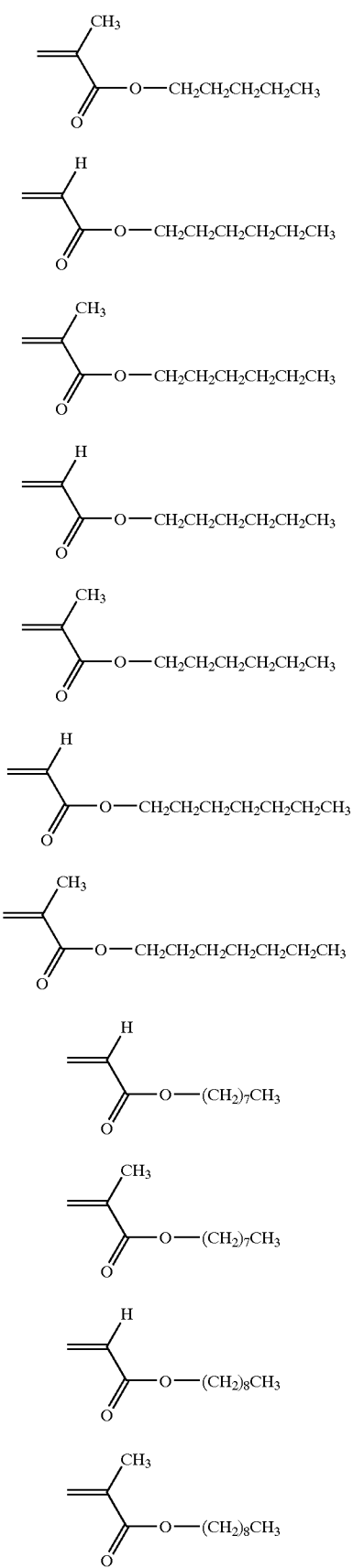
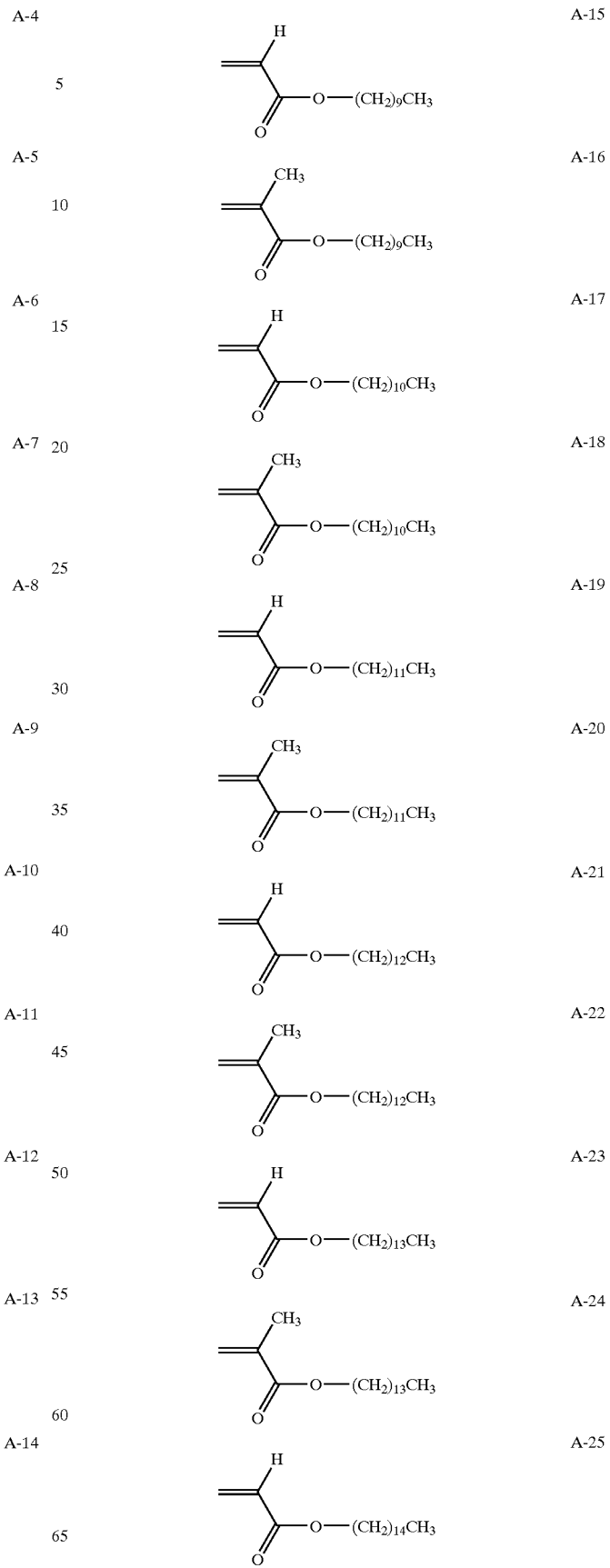

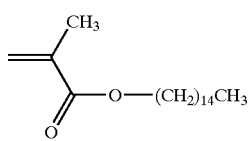 A-26
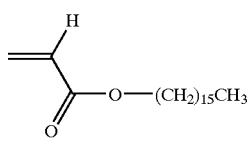 A-27
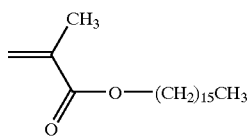 A-28
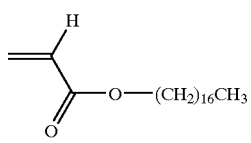 A-29
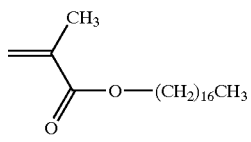 A-30
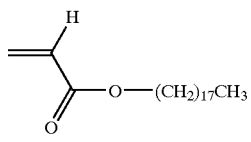 A-31
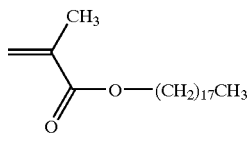 A-32
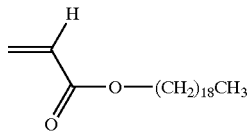 A-33
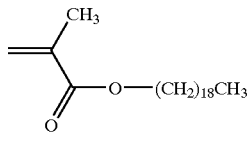 A-34
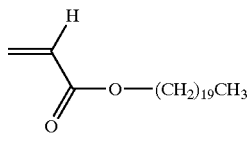 A-35
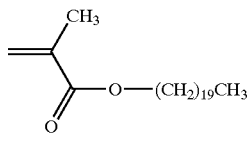 A-36
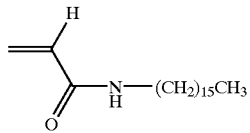 A-37
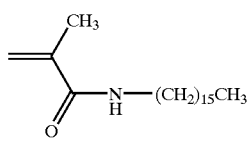 A-38
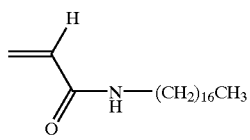 A-39
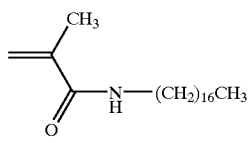 A-40
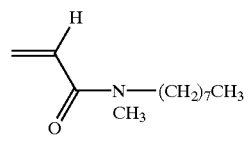 A-41
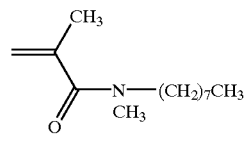 A-42
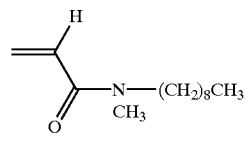 A-43
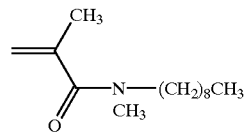 A-44
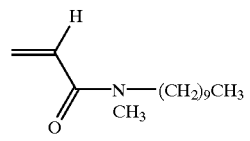 A-45
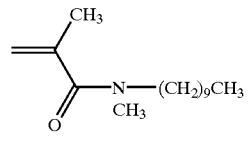 A-46
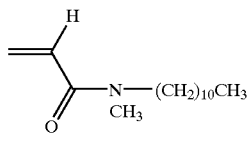 A-47

-continued

A-48: CH2=C(CH3)-C(=O)-N(CH3)-(CH2)10CH3

A-49: CH2=CH-C(=O)-NH-(CH2)11CH3

A-50: CH2=C(CH3)-C(=O)-NH-(CH2)11CH3

A-51: CH2=CH-C(=O)-N(C4H9)-(CH2)7CH3

A-52: CH2=C(CH3)-C(=O)-N(C4H9)-(CH2)7CH3

A-53: CH2=CH-C(=O)-N(C4H9)-(CH2)8CH3

A-54: CH2=C(CH3)-C(=O)-N(C3H7)-(CH2)8CH3

A-55: CH2=CH-C(=O)-N(C3H7)-(CH2)9CH3

A-56: CH2=C(CH3)-C(=O)-N(C2H5)-(CH2)9CH3

A-57: CH2=CH-C(=O)-N(C2H5)-(CH2)10CH3

A-58: CH2=C(CH3)-C(=O)-N(C2H5)-(CH2)10CH3

-continued

A-59: CH2=CH-C(=O)-N(CH3)-(CH2)11CH3

A-60: CH2=C(CH3)-C(=O)-N(CH3)-(CH2)11CH3

A-61: CH2=CH-C(=O)-O-cyclopentyl

A-62: CH2=C(CH3)-C(=O)-O-cyclopentyl

A-63: CH2=CH-C(=O)-NH-cyclopentyl

A-64: CH2=C(CH3)-C(=O)-NH-cyclopentyl

A-65: CH2=CH-C(=O)-N(CH3)-cyclopentyl

A-66: CH2=C(CH3)-C(=O)-N(CH3)-cyclopentyl

A-67

A-68

A-69

A-70

A-71

A-72

A-73

A-74

A-75

A-76

A-77

A-78

A-79

A-80

A-81 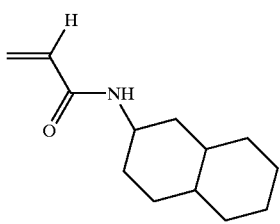
A-82 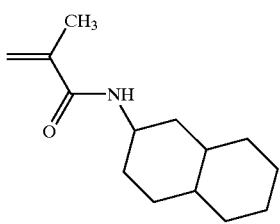
A-83 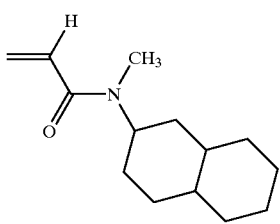
A-84 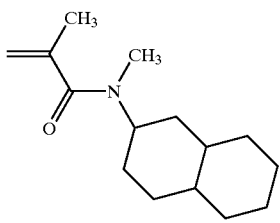
A-85 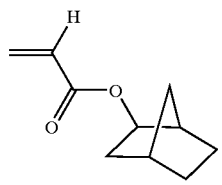
A-86 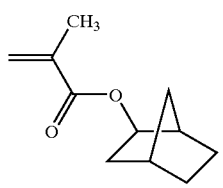
A-87 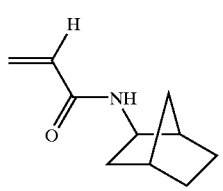
A-88 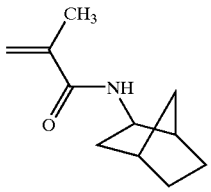
A-89 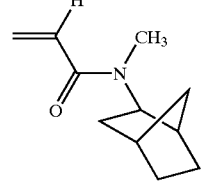
A-90 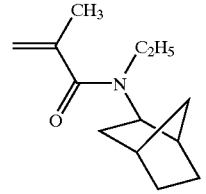
A-91 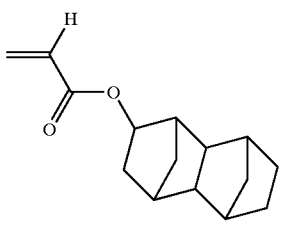
A-92 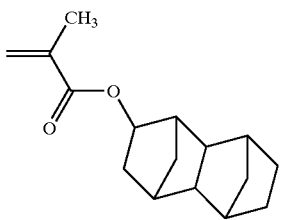
A-93 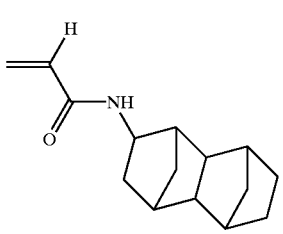
A-94 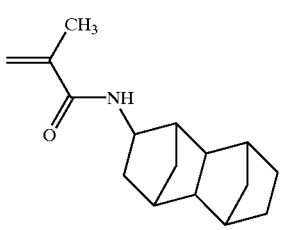

A-95
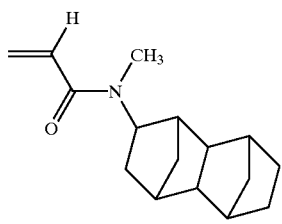
A-96
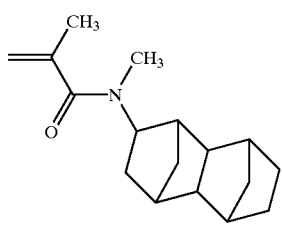
A-97
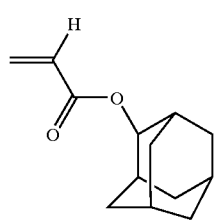
A-98
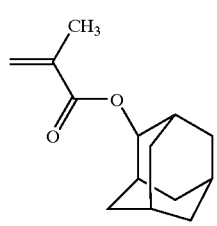
A-99
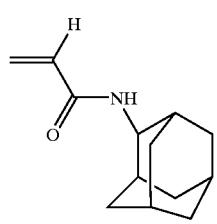
A-100
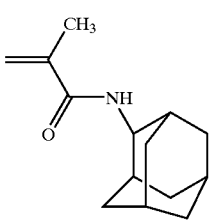
A-101
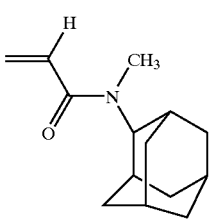
A-102
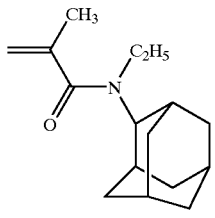
A-103
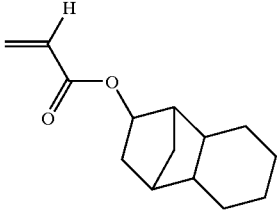
A-104
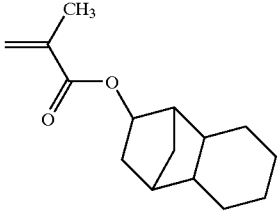
A-105
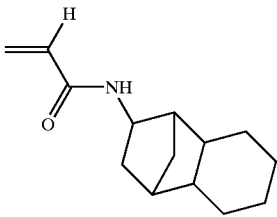
A-106
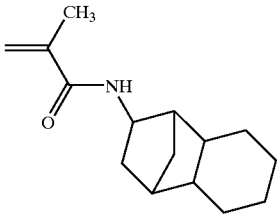
A-107
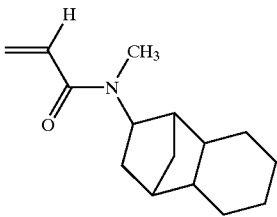
A-108

A-109
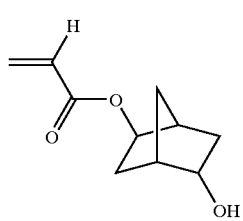
A-110
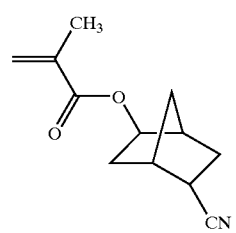
A-111
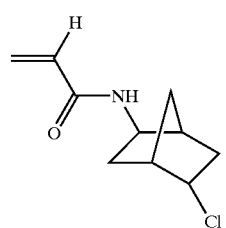
A-112
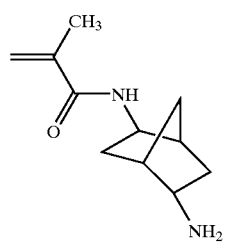
A-113
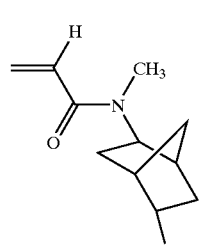
A-114
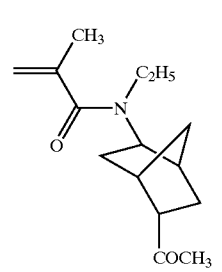
A-115
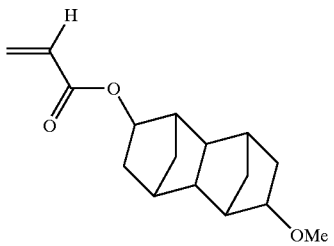
A-116
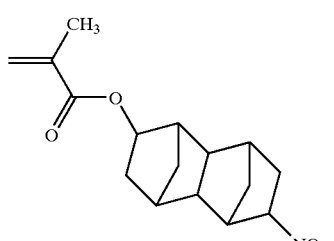
A-117
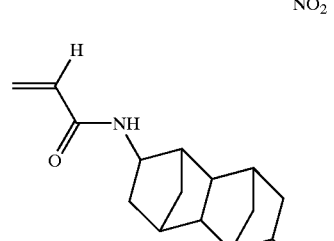
A-118
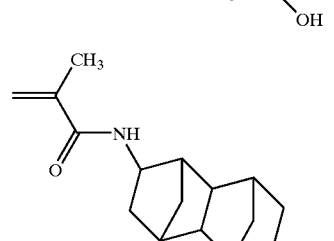
A-119
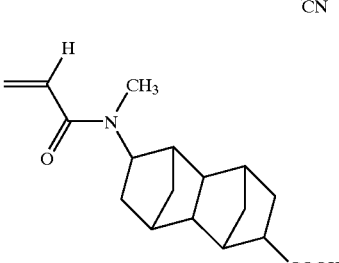
A-120
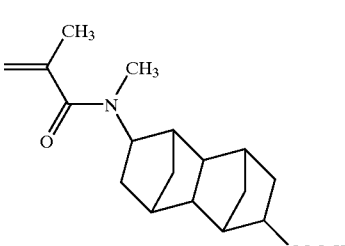

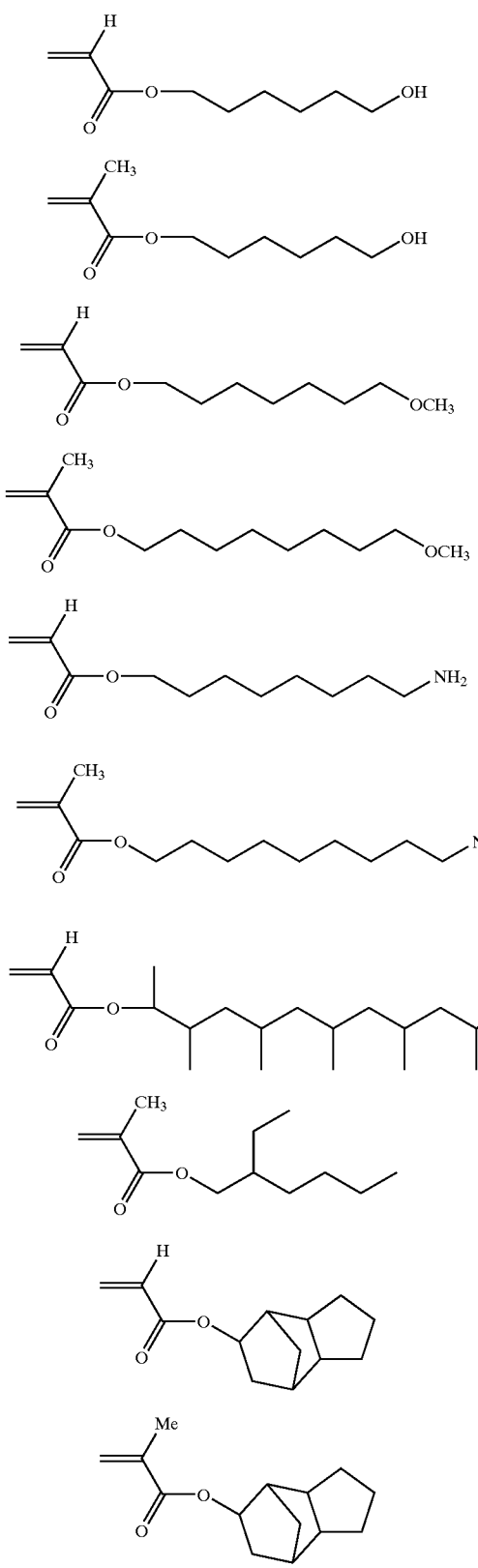

The poly(oxyalkylene) acrylate and/or poly(oxyalkylene) methacrylate, as essential components of the polymer compound in the present invention, are described below.

The polyoxyalkylene group can be represented by $(OR)_x$, wherein R represents an alkylene group having from 2 to 4 carbon atoms, and preferred examples thereof include —$CH_2CH_2$—, —$CH_2CH_2CH_2$—, —$CH(CH_3)CH_2$— and —$CH(CH_3)CH(CH_3)$—. In the poly(oxyalkylene) group, the oxyalkylene units each may be the same as in poly (oxypropylene), or two or more oxyalkylenes different from each other may be irregularly distributed. Furthermore, the oxyalkylene unit may be a linear or branched oxypropylene or oxyethylene unit or may be a block of linear or branched oxypropylene or oxyethylene unit. This poly(oxyalkylene) chain includes those linked through one or more linking bonds (for example, —CONH—Ph—NHCO— or —S—, wherein Ph represents a phenylene group). In the case where the linking bond has 3 or more valences, these provides means for obtaining a branched oxyalkylene unit. When this copolymer is used in the present invention, the poly (oxyalkylene) group suitably has a molecular weight of 250 to 3,000.

The poly(oxyalkylene) acrylate and the poly (oxyalkylene) methacrylate can be produced by reacting a commercially available hydroxypoly(oxyalkylene) material, for example, a material available on the market under the trade name of, for example, "Pluronic" (produced by Asahi Denka Kogyo K.K.), "Adeka Polyether" (produced by Asahi Denka Kogyo K.K.), "Carbowax" (produced by Gluco Products), "Toriton" (produced by Rohm and Haas) or "P.E.G" (produced by Dai-ichi Kogyo Seiyaku Co., Ltd.), with an acrylic acid, a methacrylic acid, an acryl chloride, a methacryl chloride or an acrylic anhydride according to a known method. Also, a poly(oxyalkylene) diacrylate or the like produced by a different known method may be used.

The fluorine-based polymer according to the present invention comprises the repeating unit corresponding to the monomer represented by formula (1) and the repeating unit corresponding to at least one of a poly(oxyalkylene) acrylate and a poly(oxyalkylene) methacrylate. The fluorine-based polymer preferably further comprises a repeating unit corresponding to at least one of a poly(oxyethylene)acrylate and a poly(oxyethylene) methacrylate, in view of improving the solubility in an alkali developer.

It is more preferably that the fluorine-based polymer comprises:
  the repeating unit corresponding to monomer represented by formula (1);
  the repeating unit corresponding to at least one of a poly(oxyalkylene) acrylate and a poly(oxyalkylene) methacrylate; and
  a repeating unit corresponding to at least one of a poly (oxyethylene) acrylate and a poly(oxyethylene) methacrylate. In the above case, the at least one of the poly(oxyalkylene) acrylate and the poly(oxyalkylene) methacrylate represents a monomer different from the at least one of a poly(oxyethylene) acrylate and a poly(oxyethylene) methacrylate.

It is still more preferably that the fluorine-based polymer comprises:
  the repeating unit corresponding to monomer represented by formula (1);
  the repeating unit corresponding to at least one of a poly(oxypropylene) acrylate and a poly(oxypropylene) methacrylate; and
  a repeating unit corresponding to at least one of a poly (oxyethylene) acrylate and a poly(oxyethylene) methacrylate.

The fluorine-based polymer preferably contains the repeating unit corresponding to the at least one of a poly (oxyethylene) acrylate and a poly(oxyethylene) methacrylate in an amount of 0.5 to 20 mol %, more preferably in an amount of 1 to 10 mol %, based on total amount of repeating units in the polymer.

In the present invention, in addition to those essential components, namely, the monomer represented by formula (1), the poly(oxyalkylene) acrylate and/or poly(oxyalkylene)methacrylate, and the monomer represented by formula (2), a monomer copolymerizable therewith can be reacted.

The copolymerization ratio of this copolymerizable monomer is preferably 20 mol % or less, more preferably 10 mol % or less, in all monomers.

For this monomer, those described in J. Brandrup, *Polymer Handbook 2nd ed.*, Chapter 2, pp. 1–483, Wiley Interscience (1975), can be used.

Examples thereof include compounds having one addition-polymerizable unsaturated bond selected from an acrylic acid, a methacrylic acid, acrylic acid esters, methacrylic acid esters, acrylamides, methacrylamides, allyl compounds, vinyl ethers and vinyl esters.

Specific examples thereof include the following monomers.

Acrylic Acid Esters

Methyl acrylate, ethyl acrylate, propyl acrylate, chloroethyl acrylate, 2-hydroxyethyl acrylate, trimethylol-propane monoacrylate, benzyl acrylate, methoxybenzyl acrylate, furfuryl acrylate and tetrahydrofurfuryl acrylate.

Methacrylic Acid Esters methyl methacrylate, ethyl methacrylate, propyl methacrylate, chloroethyl methacrylate, 2-hydroxyethyl methacrylate, trimethylolpropane monomethacrylate, benzyl methacrylate, methoxybenzyl methacrylate, furfuryl methacrylate and tetrahydrofurfuryl methacrylate.

Acrylamides

Acrylamide, N-alkylacrylamide (the alkyl group is an alkyl group having from 1 to 3 carbon atoms, e.g., methyl, ethyl, propyl), N,N-dialkylacrylamide (the alkyl group is an alkyl group having from 1 to 3 carbon atoms), N-hydroxyethyl-N-methylacrylamide and N-2-acetamidoethyl-N-acetylacrylamide.

Methacrylamides

Methacrylamide, N-alkylmethacrylamide (the alkyl group is an alkyl group having from 1 to 3 carbon atoms, e.g., methyl, ethyl, propyl), N,N-dialkylmethacrylamide (the alkyl group is an alkyl group having from 1 to 3 carbon atoms), N-hydroxyethyl-N-methylmethacrylamide and N-2-acetamidoethyl-N-acetylmethacrylamide.

Allyl Compounds allyl esters (e.g., allyl acetate, allyl caproate, allyl caprylate, allyl laurate, allyl palmitate, allyl stearate, allyl benzoate, allyl acetoacetate, allyl lactate) and allyloxy ethanol.

Vinyl Ethers

Alkyl vinyl ether (e.g., hexyl vinyl ether, octyl vinyl ether, decyl vinyl ether, ethyl hexyl vinyl ether, methoxy ethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether.

Vinyl Esters

Vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl lactate, vinyl-β-phenyl butyrate and vinyl cyclohexyl carboxylate.

Dialkyl Itaconates

Dimethyl itaconate, diethyl itaconate and dibutyl itaconate.

Dialkyl esters and monoalkyl esters of fumaric acid:

Dibutyl fumarate.

Others

Crotonic acid, itaconic acid, acrylonitrile, methacrylonitrile, maleylonitrile and styrene.

Some fluorine-based chemical products produced by electrolytic fluorination, which have been heretofore preferably used, are substances having low biodegradability and high biological cumulativeness and although the degree may be small, these are worried about to have a reproductive toxicity and growth toxicity. The fluorine-based chemical products according to the present invention are substances having higher environmental safety and this is advantageous in industry.

The amount of the fluoroaliphatic group-containing monomer represented by formula (1) used in the fluorine-based polymer for use in the present invention is 5 mol % or more, preferably from 5 to 70 mol %, still more preferably from 7 to 60 mol %, based on total of monomers in the fluorine-based polymer.

The amount of the essential component poly(oxyalkylene) acrylate and/or poly(oxyalkylene) methacrylate of the present invention is 10 mol % or more, preferably from 15 to 70 mol %, more preferably from 20 to 60 mol %, based on total of monomers of the fluorine-based polymer.

The amount of the monomer represented by formula (2) for use in the present invention, which is a preferred embodiment, is 3 mol % or more, preferably from 5 to 50 mol %, more preferably from 10 to 40 mol %, based on total of monomers of the fluorine polymer.

The weight average molecular weight of the fluorine-based polymer for use in the present invention is preferably from 3,000 to 100,000, more preferably from 6,000 to 80,000.

Furthermore, the amount used of the fluorine-based polymer for use in the present invention is preferably from 0.005 to 8% by weight, more preferably from 0.01 to 5% by weight, still more preferably from 0.05 to 3% by weight, based on the photosensitive composition (coating compositions exclusive of solvent). If the amount of the fluorine-based polymer added is less than 0.005% by weight, the effect cannot be attained satisfactorily, whereas if it exceeds 8% by weight, the coating may not be sufficiently dried and this adversely affects the performance (for example, sensitivity) as a photosensitive material.

The fluorine-based polymer for use in the present invention can be produced by a commonly known method. For example, the polymer may be produced by polymerizing the above-described monomer such as (meth)acrylate having a fluoroaliphatic group, or (meth)acrylate having a polyoxyalkylene group, in an organic solvent with the addition of a general-purpose radical polymerization initiator. Depending on the case, the polymer may be produced in the same manner as above by adding another addition-polymerizable unsaturated compound. According to the polymerizability of each monomer, dropwise polymerization of performing the polymerization while adding dropwise the monomer and an initiator in a reactor is also effective for obtaining a polymer having a uniform composition.

Specific examples of the structure of the fluorine-based polymer for use in the present invention are set forth below, however, the present invention is not limited thereto. In formulae, the numerical value indicates the molar ratio of each monomer component and Mw indicates the weight average molecular weight.

| Monomer 1 | Monomer 2 | Polymer |
|---|---|---|
| $-(CH_2-CH)_{40}-COO-CH_2CH_2-(CF_2CF_2)_2F$ | $-(CH_2-CH)_{60}-COO-(C_2H_4O)_{20}CH_3$ | P-1 Mw 15,000 |
| $-(CH_2-CH)_{50}-COO-CH_2CH_2-(CF_2CF_2)_2F$ | $-(CH_2-CH)_{50}-COO-(C_2H_4O)_7CH_3$ | P-2 Mw 15,000 |
| $-(CH_2-CH)_{30}-COO-CH_2CH_2-(CF_2CF_2)_2F$ | $-(CH_2HC)_{70}-COO-(C_3H_6O)_{20}CH_3$ | P-3 MW 8,000 |
| $-(CH_2-CH)_{40}-COO-CH_2CH_2-(CF_2CF_2)_2F$ | $-(CH_2-C(CH_3))_{60}-COO-(C_3H_6O)_{20}CH_3$ | P-4 Mw 30,000 |
| $-(CH_2-C(CH_3))_{60}-COO-CH_2CH_2-(CF_2CF_2)_2F$ | $-(CH_2-CH)_{40}-COO-(C_2H_4O)_{20}CH_3$ | P-5 Mw 20,000 |
| $-(CH_2-C(CH_3))_{30}-COO-CH_2CH_2-(CF_2CF_2)_2F$ | $-(CH_2-CH)_{70}-COO-(C_2H_4O)_7CH_3$ | P-6 Mw 6,000 |
| $-(CH_2-C(CH_3))_{40}-COO-CH_2CH_2-(CF_2CF_2)_2F$ | $-(CH_2-CH)_{60}-COO-(C_3H_6O)_{20}CH_3$ | P-7 Mw 50,000 |
| $-(CH_2-C(CH_3))_{20}-COO-CH_2CH_2-(CF_2CF_2)_2F$ | $-(CH_2-C(CH_3))_{80}-COO-(C_3H_6O)_{20}CH_3$ | P-8 MW 10,000 |
| $-(CH_2-CH)_{30}-COO-CH_2CH_2-(CF_2CF_2)_3F$ | $-(CH_2-CH)_{70}-COO-(C_2H_4O)_{20}CH_3$ | P-9 Mw 15,000 |
| $-(CH_2-CH)_{45}-COO-CH_2CH_2-(CF_2CF_2)_3F$ | $-(CH_2-CH)_{55}-COO-(C_2H_4O)_7CH_3$ | P-10 Mw 15,000 |
| $-(CH_2-CH)_{40}-COO-CH_2CH_2-(CF_2CF_2)_3F$ | $-(CH_2HC)_{60}-COO-(C_3H_6O)_{20}CH_3$ | P-11 Mw 7,000 |
| $-(CH_2-CH)_{35}-COO-CH_2CH_2-(CF_2CF_2)_3F$ | $-(CH_2-C(CH_3))_{65}-COO-(C_3H_6O)_{20}CH_3$ | P-12 Mw 20,000 |

-continued

| | | |
|---|---|---|
| -(CH₂-C(CH₃))₄₀- C(O)O-CH₂CH₂-(CF₂CF₂)₃F | -(CH₂-CH)₆₀- C(O)O-(C₂H₄O)₂₀CH₃ | P-13 Mw 15,000 |
| -(CH₂-C(CH₃))₃₀- C(O)O-CH₂CH₂-(CF₂CF₂)₃F | -(CH₂-CH)₇₀- C(O)O-(C₂H₄O)₇CH₃ | P-14 Mw 8,000 |
| -(CH₂-C(CH₃))₄₅- C(O)O-CH₂CH₂-(CF₂CF₂)₃F | -(CH₂-CH)₅₅- C(O)O-(C₃H₆O)₂₀CH₃ | P-15 Mw 40,000 |
| -(CH₂-C(CH₃))₂₀- C(O)O-CH₂CH₂-(CF₂CF₂)₃F | -(CH₂-C(CH₃))₈₀- C(O)O-(C₃H₆O)₂₀CH₃ | P-16 Mw 10,000 |
| -(CH₂-CH)₃₀- C(O)O-CH₂CH₂-(CF₂CF₂)₃F | -(CH₂-CH)₇₀- C(O)O-(C₂H₄O)₄CH₃ | P-17 Mw 15,000 |
| -(CH₂-CH)₄₀- C(O)O-CH₂CH₂-(CF₂CF₂)₃F | -(CH₂-CH)₆₀- C(O)O-(C₂H₄O)₄CH₃ | P-18 Mw 15,000 |
| -(CH₂-CH)₄₀- C(O)O-CH₂CH₂-(CF₂CF₂)₃F | -(CH₂HC)₆₀- C(O)O-(C₃H₆O)₇(C₂H₄O)₁₀CH₃ | P-19 Mw 20,000 |
| -(CH₂-CH)₃₅- C(O)O-CH₂CH₂-(CF₂CF₂)₃F | -(CH₂-C(CH₃))₆₅- C(O)O-(C₃H₆O)₇(C₂H₄O)₁₀CH₂ | P-20 Mw 25,000 |
| -(CH₂-C(CH₃))₄₀- C(O)NH-CH₂CH₂-(CF₂CF₂)₃F | -(CH₂-CH)₆₀- C(O)O-(C₂H₄O)₂₀CH₃ | P-21 Mw 15,000 |
| -(CH₂-C(CH₃))₃₀- C(O)NH-CH₂CH₂-(CF₂CF₂)₃F | -(CH₂-CH)₇₀- C(O)O-(C₂H₄O)₇CH₃ | P-22 Mw 8,000 |
| -(CH₂-CH(H))₄₅- C(O)NH-CH₂CH₂-(CF₂CF₂)₂F | -(CH₂-CH)₅₅- C(O)O-(C₃H₆O)₂₀CH₃ | P-23 Mw 40,000 |

-continued

| | | | |
|---|---|---|---|
| $-(CH_2-\underset{\underset{O}{\overset{\overset{CH_3}{\|}}{C}}-NH-CH_2CH_2-(CF_2CF_2)_2F}{C})_{20}$ | $-(CH_2-\underset{\underset{O}{\overset{\overset{CH_3}{\|}}{C}}-O-(C_3H_6O)_{20}CH_3}{C})_{80}$ | | P-24 Mw 10,000 |
| $-(CH_2-CH)_{30}-\underset{O}{C}-O-CH_2CH_2-(CF_2CF_2)_3F$ | $-(CH_2-CH)_{60}-\underset{O}{C}-O-(C_2H_4O)_{20}CH_3$ | $-(CH_2-CH)_{10}-\underset{O}{C}-O-C_{12}H_{25}$ | P-25 Mw 15,000 |
| $-(CH_2-CH)_{45}-\underset{O}{C}-O-CH_2CH_2-(CF_2CF_2)_3F$ | $-(CH_2-CH)_{45}-\underset{O}{C}-O-(C_2H_4O)_7CH_3$ | $-(CH_2-\underset{\underset{O}{\overset{\overset{CH_3}{\|}}{C}}-O-C_{12}H_{25}}{C})_{10}$ | P-26 Mw 15,000 |
| $-(CH_2-CH)_{40}-\underset{O}{C}-O-CH_2CH_2-(CF_2CF_2)_3F$ | $-(CH_2HC)_{50}-\underset{O}{C}-O-(C_3H_6O)_{20}CH_3$ | $-(CH_2-CH)_{10}-\underset{O}{C}-O-C_{12}H_{25}$ | P-27 Mw 9,000 |
| $-(CH_2-CH)_{35}-\underset{O}{C}-O-CH_2CH_2-(CF_2CF_2)_3F$ | $-(CH_2-\underset{\underset{O}{\overset{\overset{CH_3}{\|}}{C}}-O-(C_3H_6O)_{20}CH_3}{C})_{60}$ | $-(CH_2-\underset{\underset{O}{\overset{\overset{CH_3}{\|}}{C}}-O-C_{12}H_{25}}{C})_{5}$ | P-28 Mw 10,000 |
| $-(CH_2-\underset{\underset{O}{\overset{\overset{CH_3}{\|}}{C}}-O-CH_2CH_2-(CF_2CF_2)_3F}{C})_{40}$ | $-(CH_2-CH)_{45}-\underset{O}{C}-O-(C_2H_4O)_{20}CH_3$ | $-(CH_2-CH)_{15}-\underset{O}{C}-O-C_{12}H_{25}$ | P-29 Mw 15,000 |
| $-(CH_2-\underset{\underset{O}{\overset{\overset{CH_3}{\|}}{C}}-O-CH_2CH_2-(CF_2CF_2)_3F}{C})_{30}$ | $-(CH_2-CH)_{55}-\underset{O}{C}-O-(C_2H_4O)_7CH_3$ | $-(CH_2-\underset{\underset{O}{\overset{\overset{CH_3}{\|}}{C}}-O-C_{12}H_{25}}{C})_{15}$ | P-30 Mw 9,000 |
| $-(CH_2-\underset{\underset{O}{\overset{\overset{CH_3}{\|}}{C}}-O-CH_2CH_2-(CF_2CF_2)_3F}{C})_{45}$ | $-(CH_2-CH)_{50}-\underset{O}{C}-O-(C_3H_6O)_{20}CH_3$ | $-(CH_2-CH)_{5}-\underset{O}{C}-O-C_{12}H_{25}$ | P-31 Mw 30,000 |
| $-(CH_2-\underset{\underset{O}{\overset{\overset{CH_3}{\|}}{C}}-O-CH_2CH_2-(CF_2CF_2)_3F}{C})_{20}$ | $-(CH_2-\underset{\underset{O}{\overset{\overset{CH_3}{\|}}{C}}-O-(C_3H_6O)_{20}CH_3}{C})_{70}$ | $-(CH_2-\underset{\underset{O}{\overset{\overset{CH_3}{\|}}{C}}-O-C_{12}H_{25}}{C})_{10}$ | P-32 Mw 15,000 |
| $-(CH_2-CH)_{30}-\underset{O}{C}-O-CH_2CH_2-(CF_2CF_2)_3F$ | $-(CH_2-CH)_{60}-\underset{O}{C}-O-(C_2H_4O)_{20}CH_3$ | $-(CH_2-CH)_{10}-\underset{O}{C}-O-\text{cyclohexyl}$ | P-33 Mw 15,000 |
| $-(CH_2-CH)_{45}-\underset{O}{C}-O-CH_2CH_2-(CF_2CF_2)_3F$ | $-(CH_2-CH)_{45}-\underset{O}{C}-O-(C_2H_4O)_7CH_3$ | $-(CH_2-\underset{\underset{O}{\overset{\overset{CH_3}{\|}}{C}}-O-\text{tricyclodecyl}}{C})_{10}$ | P-34 Mw 15,000 |

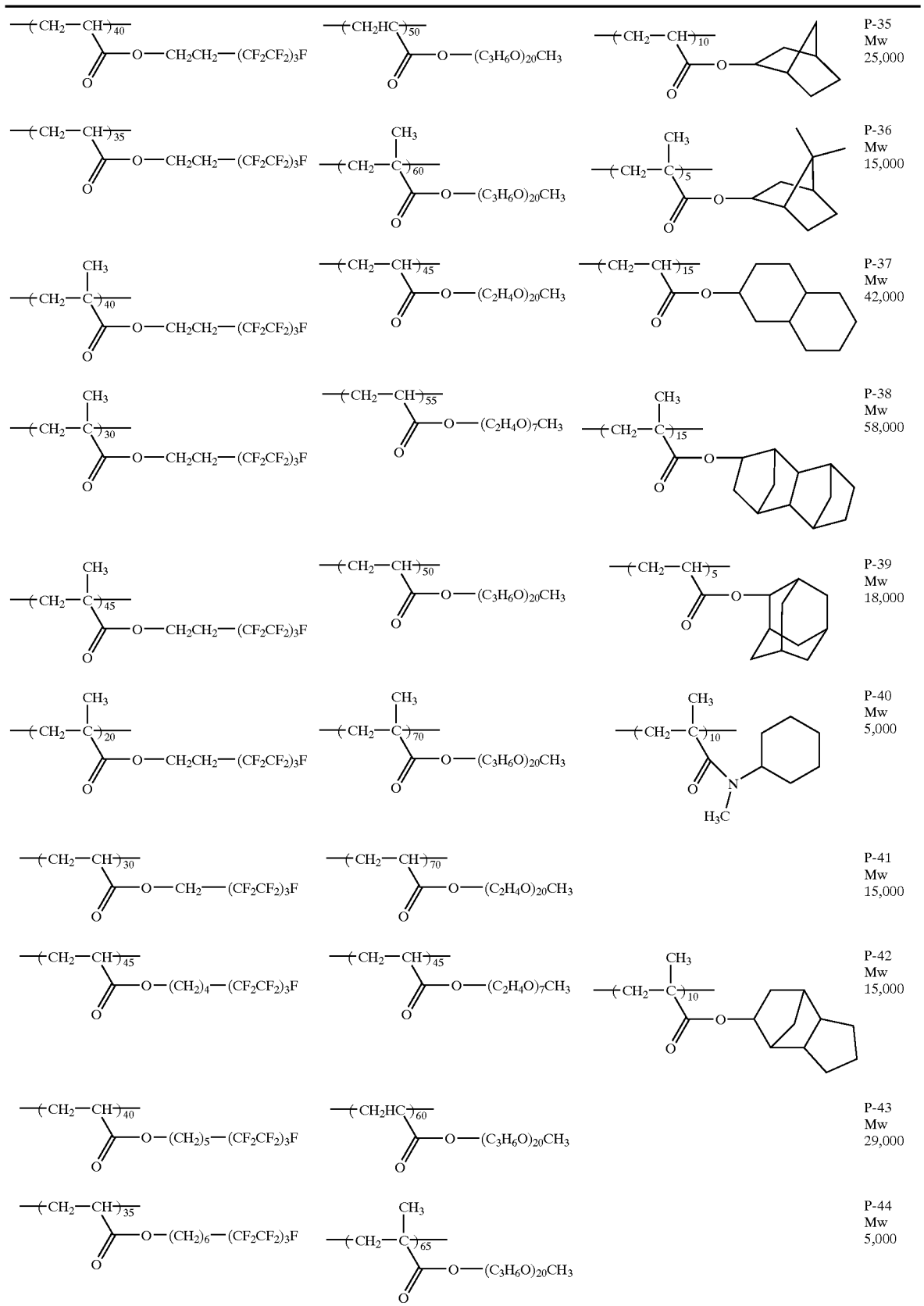

-continued

| Structure 1 | Structure 2 | Structure 3 | ID / Mw |
|---|---|---|---|
| $-(CH_2-C(CH_3))_{40}-C(=O)-S-CH_2CH_2-(CF_2CF_2)_3F$ | $-(CH_2-CH)_{60}-C(=O)-O-(C_2H_4O)_{20}CH_3$ | | P-45, Mw 32,000 |
| $-(CH_2-C(CH_3))_{30}-C(=O)-NH-CH_2CH_2-(CF_2CF_2)_3F$ | $-(CH_2-CH)_{55}-C(=O)-O-(C_2H_4O)_7CH_3$ | $-(CH_2-C(CH_3))_{15}-C(=O)-O-\text{(tetracyclododecyl)}$ | P-46, Mw 48,000 |
| $-(CH_2-C(CH_3))_{45}-C(=O)-O-CH_2CH_2-(CF_2CF_2)_2F$ | $-(CH_2-CH)_{50}-C(=O)-O-(C_3H_6O)_{20}CH_3$ | $-(CH_2-CH)_5-C(=O)-O-\text{(adamantyl)}$ | P-47, Mw 25,000 |
| $-(CH_2-C(CH_3))_{20}-C(=O)-O-CH_2CH_2-(CF_2CF_2)_2F$ | $-(CH_2-C(CH_3))_{70}-C(=O)-O-(C_3H_6O)_{20}CH_3$ | $-(CH_2-C(CH_3))_{10}-C(=O)-O-\text{cyclohexyl}$ | P-48, Mw 7,000 |
| $-(CH_2-CH)_{15}-C(=O)-O-CH_2-(CF_2CF_2)_3F$ | $-(CH_2-CH)_{15}-C(=O)-O-CH_2-(CF_2CF_2)_2F$ | $-(CH_2-CH)_{70}-C(=O)-O-(C_2H_4O)_{20}CH_3$ | P-49, Mw 15,000 |
| $-(CH_2-CH)_{40}-C(=O)-O-(CH_2)_2-(CF_2CF_2)_3F$ | $-(CH_2-CH)_{30}-C(=O)-O-(CH_2)_2-(CF_2CF_2)_2F$ | $-(CH_2-CH)_{30}-C(=O)-O-(C_2H_4O)_7CH_3$ | P-50, Mw 15,000 |
| $-(CH_2-CH)_{30}-C(=O)-O-(CH_2)_2-(CF_2CF_2)_3F$ | $-(CH_2HC)_{40}-C(=O)-O-(C_3H_6O)_{20}CH_3$ | $-(CH_2-CH)_{30}-C(=O)-O-(C_2H_4O)_7CH_3$ | P-51, Mw 32,000 |
| $-(CH_2-CH)_{20}-C(=O)-O-(CH_2)_2-(CF_2CF_2)_2F$ | $-(CH_2-C(CH_3))_{75}-C(=O)-O-(C_3H_6O)_{20}CH_3$ | $-(CH_2-C(CH_3))_5-C(=O)-O-H$ | P-52, Mw 8,000 |
| $-(CH_2-C(CH_3))_{40}-C(=O)-O-CH_2CH_2-(CF_2CF_2)_3F$ | $-(CH_2-CH)_{60}-C(=O)-O-(C_2H_4O)_{20}H$ | | P-53, Mw 22,000 |
| $-(CH_2-C(CH_3))_{30}-C(=O)-N(C_4H_9)-CH_2CH_2-(CF_2CF_2)_3F$ | $-(CH_2-CH)_{55}-C(=O)-O-(C_2H_4O)_7CH_3$ | $-(CH_2-C(CH_3))_{15}-C(=O)-NH_2$ | P-54, Mw 42,000 |
| $-(CH_2-CH(H))_{35}-C(=O)-O-CH_2CH_2-(CF_2CF_2)_2F$ | $-(CH_2-CH)_{15}-C(=O)-O-CH_2CH(C_2H_5)C_4H_9$ | | P-55, Mw 24,000 |

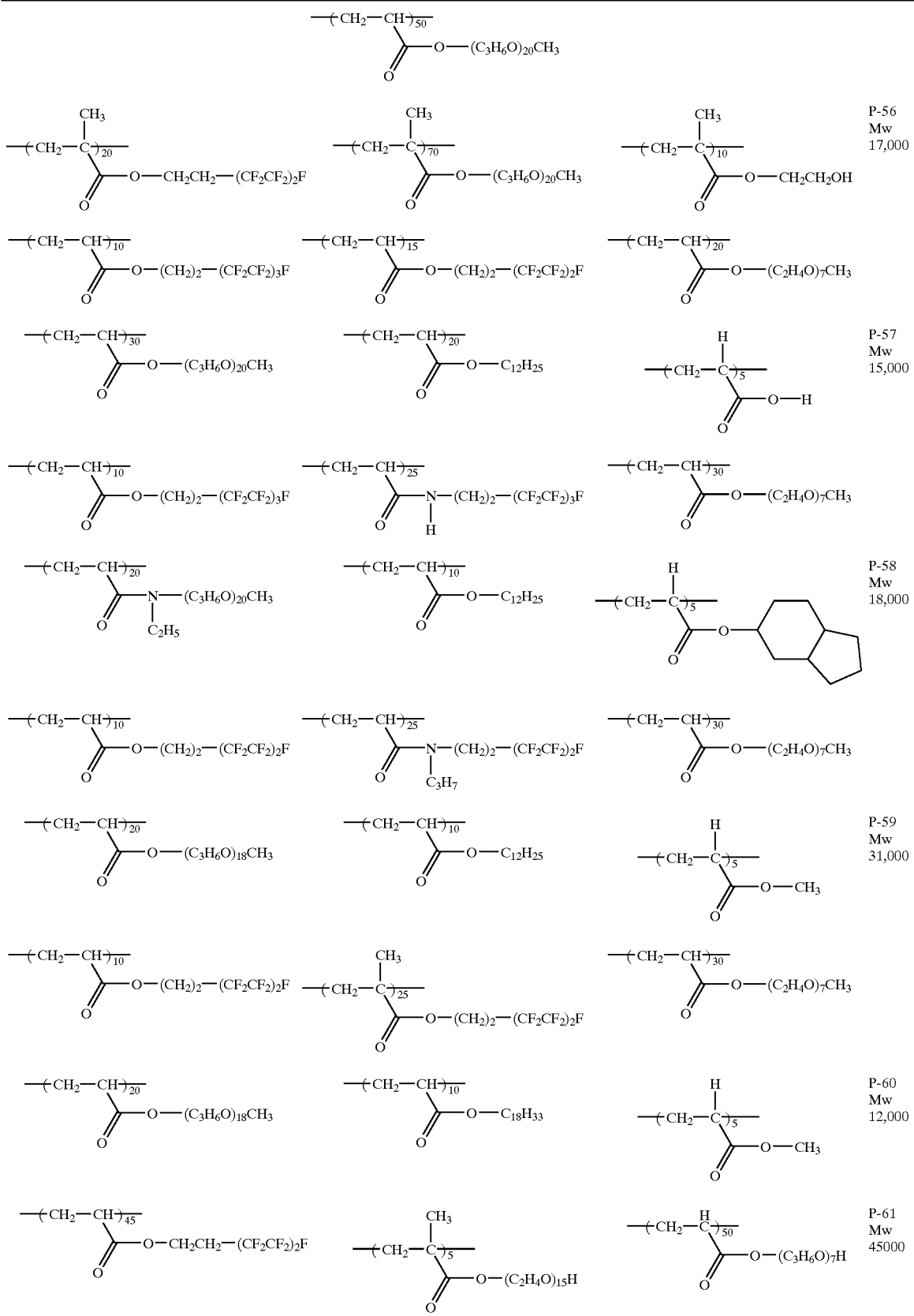

-continued

| | | | |
|---|---|---|---|
| $-(CH_2-CH)_{45}-$ $\|$ $\underset{O}{C}-O-CH_2CH_2-(CF_2CF_2)_3F$ | $-(CH_2-\underset{CH_3}{\overset{CH_3}{C}})_5-$ $\|$ $\underset{O}{C}-O-(C_2H_4O)_{15}H$ | $-(CH_2-\underset{H}{\overset{H}{C}})_{50}-$ $\|$ $\underset{O}{C}-O-(C_3H_6O)_7H$ | P-62 Mw 30,000 |
| $-(CH_2-CH)_{45}-$ $\|$ $\underset{O}{C}-O-CH_2CH_2-(CF_2CF_2)_3F$ | $-(CH_2-\underset{CH_3}{\overset{CH_3}{C}})_2-$ $\|$ $\underset{O}{C}-O-(C_2H_4O)_{15}H$ | $-(CH_2-\underset{H}{\overset{H}{C}})_{53}-$ $\|$ $\underset{O}{C}-O-(C_3H_6O)_7H$ | P-63 Mw 35,000 |
| $-(CH_2-\underset{CH_3}{\overset{CH_3}{C}})_{40}-$ $\|$ $\underset{O}{C}-O-CH_2CH_2-(CF_2CF_2)_2F$ | $-(CH_2-CH)_{10}-$ $\|$ $\underset{O}{C}-O-(C_2H_4O)_{15}H$ | $-(CH_2-\underset{CH_3}{\overset{CH_3}{C}})_{50}-$ $\|$ $\underset{O}{C}-O-(C_3H_6O)_7H$ | P-64 Mw 15,000 |
| $-(CH_2-\underset{CH_3}{\overset{CH_3}{C}})_{47}-$ $\|$ $\underset{O}{C}-O-CH_2CH_2-(CF_2CF_2)_3F$ | $-(CH_2-\underset{CH_3}{\overset{CH_3}{C}})_7-$ $\|$ $\underset{O}{C}-O-(C_2H_4O)_{15}H$ | $-(CH_2-\underset{H}{\overset{H}{C}})_{46}-$ $\|$ $\underset{O}{C}-O-(C_3H_6O)_7H$ | P-65 Mw 20,000 |
| $-(CH_2-CH)_{50}-$ $\|$ $\underset{O}{C}-O-CH_2CH_2-(CF_2CF_2)_3F$ | $-(CH_2-\underset{CH_3}{\overset{CH_3}{C}})_3-$ $\|$ $\underset{O}{C}-O-(C_2H_4O)_{11}H$ | $-(CH_2-\underset{H}{\overset{H}{C}})_{47}-$ $\|$ $\underset{O}{C}-O-(C_3H_6O)_7H$ | P-66 Mw 6,000 |
| $-(CH_2-CH)_{50}-$ $\|$ $\underset{O}{C}-O-CH_2CH_2-(CF_2CF_2)_2F$ | $-(CH_2-\underset{CH_3}{\overset{CH_3}{C}})_3-$ $\|$ $\underset{O}{C}-O-(C_2H_4O)_{11}H$ | $-(CH_2-\underset{H}{\overset{H}{C}})_{47}-$ $\|$ $\underset{O}{C}-O-(C_3H_6O)_7H$ | P-67 Mw 6,000 |
| $-(CH_2-CH)_{50}-$ $\|$ $\underset{O}{C}-O-CH_2CH_2-(CF_2CF_2)_2F$ | $-(CH_2-\underset{H}{\overset{H}{C}})_3-$ $\|$ $\underset{O}{C}-O-(C_2H_4O)_{11}H$ | $-(CH_2-\underset{H}{\overset{H}{C}})_{47}-$ $\|$ $\underset{O}{C}-O-(C_3H_6O)_7H$ | P-68 Mw 6,000 |

Other components necessary for the preparation of a photosensitive resin composition as the composition for the image-forming layer according to the present invention are described below.

The positive photosensitive resin composition may be any insofar as it changes in the solubility or swellability in a developer between before and after the exposure and the compound contained therein is preferably an o-quinonediazide compound. For example, in the case of a positive photosensitive resin composition containing an alkali-soluble resin and an o-quinonediazide compound, the o-quinonediazide compound is preferably a compound having at least one o-quinonediazide group and capable of increasing in the solubility in an alkali aqueous solution upon irradiation with actinic rays.

Various structures are known therefor and these are described in detail, for example, in J. KOSAR, *Light-Sensitive Systems*, pp. 336–352, John Wiley & Sons, Inc. (1965). For the photosensitive compound of the positive photosensitive resin composition, various sulfonic acid esters of a hydroxyl compound and an o-benzoquinonediazide or o-naphthoquinonediazide are particularly preferred.

Examples of the o-quinonediazide compound include an ester of 1,2-naphthoquinone-2-diazide-5-sulfonyl chloride and phenol-formaldehyde or cresol-formaldehyde resin; an ester of 1,2-naphthoquinone-2-diazide-5-sulfonyl chloride and pyrogallol.acetone resin described in U.S. Pat. No. 3,635,709; an ester of 1,2-naphthoquinone-2-diazide-5-sulfonyl chloride and resorcin-benzaldehyde resin described in JP-A-63-13528; an ester of 1,2-naphthoquinone-2-diazide-5-sulfonyl chloride and resorcin-pyrogallol.acetone co-condensation resin described in JP-B-62-44257 (the term "JP-B" as used herein means an "examined Japanese patent publication"); an esterification product of 1,2-naphthoquinone-2-diazide-5-sulfonyl chloride to polyester having a hydroxyl group at the terminal described in JP-B-56-45127; an esterification product of 1,2-naphthoquinone-2-diazide-5-sulfonyl chloride to a homopolymer of N-(4-hydroxyphenyl)methacrylamide or a copolymer with another copolymerizable monomer described in JP-B-50-24641; an ester of 1,2-naphthoquinone-2-diazide-5-sulfonyl chloride and bisphenol.formaldehyde resin described in JP-B-54-29922; an esterification product of 1,2-naphthoquinone-2-diazide-5-sulfonyl chloride to a homopolymer of p-hydroxystyrene or a copolymer with another copolymerizable monomer described in JP-B-52-36043; and an ester of 1,2-naphthoquinone-2-diazide-5-sulfonyl chloride and polyhydroxybenzophenone.

Other examples of known o-quinonediazide compounds which can be used in the present invention include those described in JP-A-63-80254, JP-A-58-5737, JP-A-57-111530, JP-A-57-111531, JP-A-57-114138, JP-A-57-142635, JP-A-51-36129, JP-B-62-3411, JP-B-62-51459 and JP-B-51-483. The content of the o-quinonediazide compound is usually from 5 to 60% by weight, preferably from 10 to 40% by weight, based on the entire solid content of the photosensitive resin composition.

The photosensitive compound other than the o-quinonediazide, which can be used, include a chemical amplification-type photosensitive material comprising a combination of a compound having an alkali-soluble group protected by an acid decomposable group and a photoacid generator. The photoacid generator used in the chemical amplification-type photosensitive material may be a known photoacid generator.

Examples thereof include onium salts such as diazonium salts described in S. I. Schlesinger, *Photogr. Sci. Eng.*, 18, 387 (1974), T. S. Bal et al., *Polymer*, 21, 423 (1980), etc., ammonium salts described in U.S. Pat. Nos. 4,069,055 and 4,069,056, JP-A-3-140140, etc., phosphonium salts described in D.C. Necker et al., *Macromolecules*, 17, 2468 (1984), C. S. Wen et al., *Teh, Proc. Conf. Rad. Curing ASIA*, p. 478, Tokyo, October (1988), U.S. Pat. Nos. 4,069,055 and 4,069,056, etc., iodonium salts described in J. V. Crivello et al., *Macromolecules*, 10 (6), 1307 (1977), *Chem. & Eng. News*, November 28, p. 31 (1988), European Patents 104, 143, 339,049 and 410,201, JP-A-2-150848, JP-A-2-296514, etc., sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., Polymer Bull., 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patent 370,693, 233,567, 297,443 and 297,442, U.S. Pat. Nos. 3,902,114, 4,933,377, 410,201, 339,049, 4,760,013, 4,734, 444 and 2,833,827, German Patent 2,904,626, 3,604,580 and 3,604,581, etc., selenonium salts described in J. V. Crivello et al., *Macromolecules*, 10 (6), 1307 (1977), J. V. Crivello et al., *J. Polymer Sci., Polymer Chem. Ed.*, 17, 1047 (1979), etc., and arsonium salts described in C. S. Wen et al., *Teh, Proc. Conf. Rad. Curing ASIA*, p. 478, Tokyo, October (1988), etc.; organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organic metals/organic halides described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), JP-A-2-161445, etc.; photo-acid generators having an o-nitrobenzyl type protective group described in S. Hayase et al., *J. Polymer Sci.*, 25, 753 (1987), E. Reichmanis et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24), 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Pat. Nos. 0,290,750, 046,083, 156, 535, 271,851 and 0,388,343, U.S. Pat. Nos. 3,901,710 and 4,181,531, JP-A-60-198538, JP-A-53-133022, etc.;

compounds which are photochemically decomposed to generate sulfonic acid, represented by iminosulfonate, described in M. TUNOOKA et al., *Polymer Preprints Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), European Patents 0,199,672, 84,515, 199,672, 044,115 and 0,101,122, U.S. Pat. Nos. 4,618,564, 4,371,605 and 4,431,774, JP-A-64-18143, JP-A-2-245756, Japanese Patent Application No. 3-140109, etc.; and disulfone compounds described in JP-A-61-166544.

The compound which decomposes upon irradiation with actinic rays or radiation to generate an acid is usually added in an amount of 0.01 to 40% by weight, preferably from 0.01 to 20% by weight, more preferably from 0.1 to 5% by weight, based on the total weight (exclusive of the coating solvent) of the photosensitive resin composition.

The compound having an alkali-soluble group protected by an acid decomposable group is a compound having a —C—O—C— or —C—O—Si— bond and examples thereof include the followings:

(a) compounds containing at least one member selected from the group consisting of an ortho-carboxylic acid ester and a carboxylic acid amide acetal, where the compound can have polymerizability and the member selected from the above-described group can be produced as a crosslinking element in the main chain or as a pendant substituent;

(b) oligomeric or polymer compounds containing a member selected from the group consisting of repeating acetal and ketal, in the main chain;

(c) compounds containing at least one member selected from the group consisting of enol ester and N-acylaminocarbonate;

(d) cyclic acetals or ketals of β-ketoester or β-ketoamide;

(e) compounds containing a member selected from the group consisting of silyl ethers;

(f) compounds containing a member selected from the group consisting of silyl enol ethers;

(g) monoacetals and monoketals with the aldehyde or ketone component having solubility of 0.1 to 100 g/liter in the developer, respectively;

(h) tertiary alcohol-based ethers; and (i) carboxylic esters and carbonates with the alcohol at the position of tertiary allyl or benzyl.

The compounds (a) capable of cleaving under the action of an acid, as a component of a light-irradiation sensitive mixture, are described in German Patents 2,610,842 and 2,928,636. Mixtures containing the compound (b) is described in German Pat. Nos. 2,306,248 and 2,718,254. The compounds (c) are described in Europe Patent Publications 0,006,626 and 0,006,627, the compounds (d) are described in Europe Patent 0,202,196, the compounds (e) are described in German Pat. Nos. 3,544,165 and 3,601,264, the compounds (f) are described in German Pat. Nos.

3,730,785 and 3,730,783, the compounds (g) are described in German Patent 3,730,783, the compounds (h) are described, for example, in U.S. Pat. No. 4,603,101, and the compounds (i) are described, for example, in U.S. Pat. No. 4,491,628 and J. M. Frechet, *J. Imaging Sci.*, 30, 59–64 (1986)).

The content of the compound protected by such an acid decomposable group is usually from 1 to 60% by weight, preferably from 5 to 40% by weight, based on the entire solid content of the photosensitive resin composition.

The photosensitive resin composition may contain a synthetic resin which is insoluble in water and soluble in an alkaline aqueous solution (hereinafter referred to as an "alkali-soluble resin"). Examples of the alkali-soluble resin include phenol-formaldehyde resin, cresol-form-aldehyde resin, phenol-cresol-formaldehyde co-condensation resin, phenol-modified xylene resin, polyhydroxystyrene, halogenated polyhydroxystyrene, a copolymer of N-(4-hydroxyphenyl)methacrylamide, a hydroquinone monomethacrylate copolymer, sulfonylimide-type polymers described in JP-A-7-28244 and carboxyl group-containing polymers described in JP-A-7-36184. In addition, various alkali-soluble polymer compounds such as acrylic resin having a phenolic hydroxyl group described in JP-A-51-34711, acrylic resin having a sulfonamide group described in JP-A-2-866 and a urethane-base resin may also be used. The alkali-soluble polymer compound preferably has a weight average molecular weight of 500 to 20,000 and a number average molecular weight of 200 to 60,000. These alkali-soluble polymer compounds may be used individually or in combination of two or more thereof and the amount added thereof is 80% by weight or less based on the entire composition.

A combination use with a condensation product of a phenol containing a substituent of an alkyl group having from 3 to 8 carbon atoms with formaldehyde, such as t-butylphenol formaldehyde resin and octylphenol formaldehyde resin, described in U.S. Pat. No. 4,123,279 is advantageous from the standpoint of enhancing the ink-receptivity of an image. This alkali-soluble resin is usually added in an amount of 90% by weight or less based on the total weight of the composition.

The photosensitive resin composition may contain, if desired, a cyclic acid anhydride for elevating the sensitivity, a printing out agent for obtaining a visible image immediately after the exposure, a dye serving as the image coloring agent, a filler and the like.

The photosensitive resin composition for use in the present invention preferably contains a cyclic acid anhydride, a phenol and an organic acid for elevating the sensitivity. Examples of the cyclic acid anhydride include phthalic anhydride, tetrahydrophthalic anhydride, hexahydrophthalic anhydride, 3,6-endoxy-Δ4-tetrahydro-phthalic anhydride, tetrachlorophthalic anhydride, maleic anhydride, chloromaleic anhydride, α-phenylmaleic anhydride, succinic anhydride and pyromellitic anhydride described in U.S. Pat. No. 4,115,128. Examples of the phenols include bisphenol A, p-nitrophenol, p-ethoxyphenol, 2,3,4-trihydroxybenzophenone, 4-hydroxybenzophenone, 2,4,4'-trihydroxybenzophenone, 4,4',4"-trihydroxytriphenylmethane, 4,4',3",4"-tetrahydroxy-3,5,3', 5'-tetramethyltriphenyl-methane.

Examples of the organic acids include sulfonic acids, sulfinic acids, alkylsulfuric acids, phosphonic acids, phosphinic acids, phosphates and carboxylic acids described in JP-A-60-88942 and JP-A-2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 1,4-cyclohexene-2,2-dicarboxylic acid, erucic acid, lauric acid, n-undecanoic acid and ascorbic acid. These cyclic acid anhydrides, phenols and organic acids preferably occupy from 0.05 to 15% by weight, more preferably from 0.1 to 5% by weight in the photosensitive resin composition.

Examples of the printing out agent for obtaining a visible image immediately after the exposure include a combination of a photosensitive compound capable of releasing an acid upon exposure and an organic dye of forming a salt with the acid and thereby changing the color tone.

Examples of the photosensitive compound capable of releasing an acid upon exposure include o-naphthoquinonediazide-4-sulfonic acid halogenide described in JP-A-50-36209; trihalomethyl-2-pyrone and trihalomethyl-5-triazine described in JP-A-53-36223; various o-naphthoquinonediazide compounds described in JP-A-55-62444; 2-trihalomethyl-5-allyl-1,3,4-oxadiazole compounds described in JP-A-55-77742; and diazonium salts. These compounds may be used individually or in combination and the amount added thereof is preferably from 0.3 to 15% by weight based on the total weight of the composition.

The photosensitive resin composition for use in the present invention can contain at least one organic dye capable of changing the color tone thereof by interacting with a photolytic product of a compound which photolyzes to generate an acidic substance. Examples of the organic dye which can be used include diphenylmethane-based, triallylmethane-based, thiazine-based, oxazine-based, phenazine-based, xanthene-based, anthraquinone-based, iminonaphtho-quinone-based and azomethine-based dyes.

Specific examples thereof include Brilliant Green, eosin, Ethyl Violet, Erythrosine B, Methyl Green, Crystal Violet, Basic Fuchsine, phenolphthalein, 1,3-diphenyltriazine, Alizarin Red S, Thymolphthalein, Methyl Violet 2B, Quinaldine Red, Rose Bengale, Thymolsulfophthalein, Xylenol Blue, Methyl Orange, Orange IV, diphenyl thiocarbazone, 2,7-dichlorofluorescein, Para Methyl Red, Congo Red, Benzopurpurine 4B, α-Naphthyl Red, Nile Blue 2B, Nile Blue A, phenacetarin, Methyl Violet, Malachite Green, Para Fuchsine, Oil Blue #603 (produced by Orient Chemical Industry Co., Ltd.), Oil Pink #312 (produced by Orient Chemical Industry Co., Ltd.), Oil Red 5B (produced by Orient Chemical Industry Co., Ltd.), Oil Scarlet #308 (produced by Orient Chemical Industry Co., Ltd.), Oil Red OG (produced by Orient Chemical Industry Co., Ltd.), Oil Red RR (produced by Orient Chemical Industry Co., Ltd.), Oil Green #502 (produced by Orient Chemical Industry Co., Ltd.), Spiron Red BEH Special (produced by Hodogaya Chemical Co., Ltd.), Victoria Pure Blue BOH (produced by Hodogaya Chemical Co., Ltd.), Patent Pure Blue (produced by Sumitomo Mikuni Chemical Co., Ltd.), Sudan Blue II (produced by BASF), m-Cresol Purple, Cresol Red, Rhodamine B, Rhodamine 6G, Fast Acid Violet R, Sulforhodamine B, Auramine, 4-p-diethylaminophenyliminonaphthoquinone, 2-carboxyanilino-4-p-diethylaminophenyliminonaphthoquinone, 2-carbostearylamino-4-p-dihydroxyethyl-aminophenyliminonaphthoquinone, p-methoxybenzoyl-p'-diethylamino-o'-methylphenyliminoacetanilide, cyano-p-diethylaminophenyliminoacetanilide, 1-phenyl-3-methyl-4-p-diethylaminophenylimino-5-pyrazolone and 1-β-naphthyl-4-p-diethylaminophenylimino-5-pyrazolone.

Particularly preferred organic dyes are triarylmethane dyes. Of triarylmethane dyes, the dyes described in JP-A-62-2932471 and Japanese Patent Application No. 4-112844, having a sulfonic acid compound as the counter anion, are useful. These dyes may be used individually or as a mixture and the amount added thereof is preferably from 0.3 to 15% by weight based on the total weight of the photosensitive resin composition. If desired, this organic dye may be used in combination with another dye or pigment and the amount used thereof is 70% by weight or less, preferably 50% by weight or less, based on the total weight of the dyes and pigments.

The case where the photosensitive resin composition for use in the present invention is used for the photosensitive layer of a photopolymerizable printing plate as a negative printing plate is described below. In the case where the photosensitive resin composition is a photopolymerizable photosensitive resin composition, the main components thereof include a compound containing an addition-polymerizable ethylenic double bond and a photopolymerization initiator, in addition to the above-described fluorine-based polymer. If desired, compounds such as thermal polymerization inhibitor may be added.

The compound containing an addition-polymerizable double bond can be freely selected from the compounds having at least one, preferably two or more, terminal ethylenic unsaturated bond(s). Examples thereof include compounds having a chemical form such as monomer, prepolymer, namely, dimer, trimer and oligomer, and a mixture or copolymer thereof. Examples of the monomer and its copolymer include esters of an unsaturated carboxylic acid (for example, an acrylic acid, a methacrylic acid, an itaconic acid, a crotonic acid, an isocrotonic acid or a maleic acid) and an aliphatic polyhydric alcohol compound, and an amide of an unsaturated carboxylic acid and an aliphatic polyvalent amine compound.

Specific examples of the ester monomer of an aliphatic polyhydric alcohol compound and an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri-(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol penta-acrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer;

methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane;

itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;

crotonic acid esters such as ethylene glycol dicrotonate, tetramethylene glycol dicrotonate, pentaerythritol dicrotonate and sorbitol tetradicrotonate; isocrotonic acid esters such as ethylene glycol diisocrotonate, pentaerythritol diisocrotonate and sorbitol tetraisocrotonate; maleic acid esters such as ethylene glycol dimaleate, triethylene glycol dimaleate, pentaerythritol dimaleate and sorbitol tetramaleate; and a mixture of these ester monomers.

Specific examples of the amide monomer of an aliphatic polyhydric amine compound and an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacryl-amide. Other examples include vinyl urethane compounds having two or more polymerizable vinyl groups within one molecule described in JP-B-48-41708, which are obtained by adding a vinyl monomer having a hydroxyl group represented by the following formula (A) to a polyisocyanate compound having two or more isocyanate groups within one molecule:

$$CH_2=C(R_5)COOCH_2CH(R_6)OH \qquad (A)$$

(wherein $R_5$ and $R_6$ each represents H or $CH_3$)

Also, polyfunctional acrylates and methacrylates such as urethane acrylates described in JP-A-51-37193, polyester acrylates described in JP-A-48-64183, JP-B-49-43191 and JP-B-52-30490 and epoxy acrylates obtained by reacting an epoxy resin with a (meth)acrylic acid may be used. Furthermore, those described as a photocurable monomer or oligomer in Nippon Secchaku Kyokaishi (Journal of Japan Adhesive Society), Vol. 20, No. 7, pp. 300–308 (1984) may be used.

The compound containing such a double bond is used in an amount of 5 to 70% by weight (hereinafter simply referred to as "%"), preferably from 10 to 50%, based on all components.

The photopolymerization initiator contained in the photopolymerizable photosensitive resin composition for use in the present invention may be appropriately selected according to the wavelength of light source used from various photopolymerization initiators known in patents and publications, and combination systems (photopolymerization initiation systems) of two or more photopolymerization initiators. For example, in the case of using light in the vicinity of 400 nm as the light source, benzyl, benzoin ether, Michler's ketone, anthraquinone, thioxanthone, acridine, phenazine and benzophenone are being widely used.

In the case of using a visible ray at 400 nm or more, an Ar laser, a second harmonic of semiconductor laser or an SHG-YAG laser as the light source, various photopolymerization initiation systems have been also proposed. Examples thereof include a certain kind of photoreducing dyes described in U.S. Pat. No. 2,850,445, such as Rose Bengale, eosin and erythrosine, and a combination system of a dye with a photopolymerization initiator, such as a composite initiation system of dye and amine (see, JP-B-44-20189), a combination system of hexaarylbiimidazole, radical generator and dye (see, JP-B-45-37377), a system of hexaarylbiimidazole and p-dialkylaminobenzylidene ketone (see, JP-B-47-2528 and JP-A-54-155292), a system of cyclic cis-α-dicarbonyl compound and dye (see, JP-A-48-84183), a system of cyclic triazine and merocyanine dye (see, JP-A-54-151024), a system of 3-ketocoumarin and activator (see, JP-A-52-112681 and JP-A-58-15503), a system of biimidazole, styrene derivative and thiol (see, JP-A-59-

140203), a system of organic peroxide and dye (see, JP-A-59-1504, JP-A-59-140203, JP-A-59-189340, JP-A-62-174203, JP-B-62-1641 and U.S. Pat. No. 4,766,055), a system of dye and activated halogen compound (see, JP-A-63-258903 and JP-A-2-63054), a system of dye and borate compound (see, JP-A-62-143044, JP-A-62-150242, JP-A-64-13140, JP-A-64-13141, JP-A-64-13142, JP-A-64-13143, JP-A-64-13144, JP-A-64-17048, JP-A-1-229003, JP-A-1-298348 and JP-A-1-138204), a system of dye having a rhodanine ring and radical generator (see, JP-A-2-179643 and JP-A-2-244050), a system of titanocene and 3-ketocoumarin dye (see, JP-A-63-221110), a combination system of titanocene, xanthene dye and addition-polymerizable ethylenic unsaturated compound containing an amino group or a urethane group (see, JP-A-4-221958 and JP-A-4-219756), a system of titanocene and specific merocyanine dye (see, JP-A-6-295061) and a system of titanocene and dye having a benzopyran ring (see, JP-A-8-334897). The photopolymerization initiator may be used is in an amount of 0.05 to 100 parts by weight, preferably from 0.1 to 70 parts by weight, more preferably from 0.2 to 50 parts by weight, per 100 parts by weight of the ethylenic unsaturated compound.

The photopolymerizable photosensitive resin composition of the present invention preferably contains, in addition to the above-described fundamental components, a small amount of thermal polymerization initiator so as to inhibit unnecessary thermal polymerization of the polymerizable ethylenic unsaturated compound during the production or storage of the photosensitive resin composition. Suitable examples of the thermal polymerization initiator include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butyl-phenol), N-nitrosophenylhydroxylamine primary cerium salt and N-nitrosophenylhydroxylamine aluminum salt. The amount of the thermal polymerization inhibitor added is preferably from about 0.01 to about 5% based on the weight of the entire composition. Also, if desired, a higher fatty acid derivative such as behenic acid and behenic acid amide may be added to allow it to be present partially on the surface of the photosensitive layer during the drying process after the coating, so that the polymerization inhibition due to oxygen can be prevented. The amount of the higher fatty acid derivative added is preferably from about 0.5 to about 10% of the entire composition.

In the lithographic printing plate where a photosensitive layer is formed using a photopolymerizable photosensitive resin composition of the present invention, an oxygen-shielding protective layer may be provided on the photopolymerizable photosensitive layer for the purpose of preventing the polymerization inhibition due to oxygen.

Examples of the water-soluble vinyl polymer contained in the oxygen-shielding protective layer include polyvinyl alcohol, partial ester, ether and acetal of polyvinyl alcohol, and a copolymer thereof containing an unsubstituted vinyl alcohol unit in a substantial amount of giving necessary water solubility. Examples of the polyvinyl alcohol include those having a hydrolysis degree of 71 to 100% and a polymerization degree of 300 to 2,400.

Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd. Examples of the above-described copolymer include polyvinyl acetate chloroacetate or propionate hydrolyzed to 88 to 100%, polyvinyl formal, polyvinyl acetal and a copolymer thereof. Examples of other useful polymers include polyvinyl pyrrolidone, gelatin and gum arabic. These may be used individually or in combination.

In the present invention, the solvent for use in coating the oxygen-shielding protective layer is preferably pure water, however, an alcohol such as methanol or ethanol, or a ketone such as acetone or methyl ethyl ketone may also be mixed with pure water. The solid concentration in coating solution is suitable from 1 to 20% by weight. The oxygen-shielding protective layer of the present invention may further contain known additives such as a surfactant for elevating the coatability, and a water-soluble plasticizer for improving the physical properties of film. Examples of the water-soluble plasticizer include propionamide, cyclohexanediol, glycerin and sorbitol. Also, a water-soluble (meth)acrylic monomer may be added. The amount of the oxygen-shielding protective layer coated is suitably from about $0.1/m^2$ to about $15/m^2$, more preferably from $1.0/m^2$ to about $5.0/m^2$, in terms of the dry weight.

The present invention can be used not only for the above-described positive lithographic printing plate precursor (sometimes called a "positive PS plate") having an image forming layer formed of a photosensitive resin composition using a compound having quinonediazide or an alkali-soluble group protected by an acid decomposable group or the negative PS plate using a photopolymerization system but also, for example, for the following lithographic printing plate materials in the same manner:

(1) a negative lithographic printing plate material using diazo resin;

(2) a negative lithographic printing plate material using a photo-crosslinking resin;

(3) a negative laser direct drawing-type lithographic printing material containing an alkali-soluble binder, an acid generator and an acid (heat) crosslinkable compound;

(4) a positive laser direct drawing-type lithographic printing material containing a light-heat converting agent, an alkali-soluble binder and if desired, a heat-decomposable substance which, in the state of being not decomposed, substantially decreases the solubility of the alkali-soluble binder; and (5) a negative laser direct drawing-type lithographic printing plate containing a light-heat converting agent, a heat radical generator and a radical polymerizable compound.

In particular, the heat-mode laser direct drawing-type lithographic printing plates (4) and (5) have high usefulness because the after-heating which is a problem of lithographic printing plate precursor commercially available under the common name of Thermal CTP can be dispensed with, however, due to heat diffusion to the substrate or low heat reactivity, the discrimination between the image area and the non-image area is disadvantageously deficient and the stability against the scratching is deficient. The effect of the fluorine-based polymer for use in the present invention is very useful for solving the problem of materials suffering from the deficient discrimination and stability against the scratching. More specifically, a particularly preferred practical embodiment of the present invention is "a lithographic printing plate precursor comprising an aluminum substrate having provided thereon a photosensitive layer containing a light-heat converting agent and a binder resin, wherein the photosensitive layer can be increased or decreased in the solubility in an alkaline developer upon exposure to laser rays and contains the fluorine-based polymer for use in the present invention". A more preferred embodiment is "a lithographic printing plate precursor comprising an aluminum substrate having provided thereon a photosensitive layer containing a light-heat converting agent, a heat radical generator and a radical polymerizable compound, wherein the photosensitive layer can be decreased in the solubility in an alkaline developer upon exposure to laser rays and contains the fluorine-based polymer for use in the present invention".

The materials used in respective cases are sequentially described in detail below Examples of the diazo resin for use in (1) include diazo resin represented by a salt of a condensate between diazodiarylamine and an activate carbonyl compound. Those which are photosensitive, water-insoluble and organic solvent-soluble are preferred.

Particularly suitable examples of the diazo resin include an organic acid salt or an inorganic acid salt of a condensate between 4-diazodiphenylamine, 4-diazo-3-methyldiphenylamine, 4-diazo-4'-methyldiphenylamine, 4-diazo-3'-methyldiphenylamine, 4-diazo-4'-methoxydiphenyl-amine, 4-diazo-3-methyl-4'-ethoxydiphenylamine, 4-diazo-3-methoxydiphenylamine or the like and formaldehyde, para-formaldehyde, acetoaldehyde, benzaldehyde, 4,4'-bis-methoxymethyl diphenyl ether or the like.

Examples of the organic acid used here include methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid and 2-hydroxy-4-methoxybenzophenone-5-sulfonic acid. Examples of the inorganic acid include hexafluorophosphoric acid, tetrafluoroboric acid and thiocyanic acid. In addition, diazo resin having a main chain of polyester group described in JP-A-54-30121; diazo resin obtained by reacting a polymer having a carboxylic acid anhydride residue with a diazo compound having a hydroxyl group described in JP-A-61-273538; and diazo resin obtained by reacting a polyisocyanate compound with a diazo compound having a hydroxyl group may also be used.

The amount of the diazo resin used is preferably from 0 to 40% by weight based on the solid content of the composition. If desired, two or more diazo resins may be used in combination. In the preparation of a negative photosensitive resin composition, an organic polymer binder is usually used in combination. Examples of the organic polymer binder include acrylic resin, polyamide resin, polyester resin, epoxy resin, polyacetal resin, polystyrene resin and novolak resin. Furthermore, for the purpose of improving the performance, known additives such as thermal polymerization preventing agent, dye, pigment, plasticizer and stability improver may be added.

Suitable examples of the dye include basic oil-soluble dyes such as Crystal Violet, Malachite Green, Victoria Blue, Methylene Blue, Ethyl Violet and Rhodamine B. Examples of the commercially available product include "Victoria Pure Blue BOH" (produced by Hodogaya Chemical Co., Ltd.) and "Oil Blue #603" (produced by Orient Chemical Industry Co., Ltd.). Examples of the pigment include Phthalocyanine Blue, Phthalocyanine Green, Dioxazine Violet and Quinacridone Red.

Examples of the plasticizer include diethyl phthalate, dibutyl phthalate, dioctyl phthalate, tributyl phosphate, trioctyl phosphate, tricresyl phosphate, tri(2-chloroethyl) phosphate and tributyl citrate. Examples of known stability improvers include phosphoric acid, phosphorous acid, oxalic acid, tartaric acid, malic acid, citric acid, dipicolinic acid, polyacrylic acid, benzenesulfonic acid and toluenesulfonic acid. In general, the amount of these additives is preferably from 0 to 30% by weight based on the solid content of the photosensitive resin composition, though this may vary depending on the use end thereof.

The photo-crosslinking resin for use in (2) is preferably a photo-crosslinking resin having affinity for an aqueous alkali developer. Examples of the photo-crosslinking resin which can be used include a copolymer having a cinnamic acid group and a carboxyl group described in JP-B-54-15711; a polyester resin having a phenylene-diacrylic acid residue and a carboxyl group described in JP-A-60-165646; a polyester resin having a phenylene-diacrylic acid residue and a phenolic hydroxyl group described in JP-A-60-203630; a polyester resin having a phenylenediacrylic acid residue and sodium iminodisulfonyl group described in JP-B-57-41858; a polymer having an azide group and a carboxyl group on the side chain described in JP-A-59-208552; and a polymer having a maleimide group on the side chain.

The alkali-soluble binder and the acid generator for use in (3) may be the same as the materials used for the above-described positive PS plate using a compound having an alkali-soluble group protected by an acid-decomposable group. The acid (heat)-crosslinkable compound means a compound which undergoes crosslinking in the presence of an acid and examples thereof include aromatic compounds and heterocyclic compounds, which are poly-substituted by a hydroxymethyl group, an acetoxymethyl group or an alkoxymethyl group. In particular, compounds obtained by the condensation of a phenol and an aldehyde under the basic conditions are preferred. Among these compounds, preferred are a compound obtained by the condensation of phenol and formaldehyde under the basic conditions, a compound obtained in the same manner from m-cresol and formaldehyde, a compound obtained from bisphenol A and formaldehyde, a compound obtained from 4,4'-bisphenol and formaldehyde, and the compounds described as the resol resin in British Patent 2,082,339.

The acid-crosslinkable compound preferably has a weight average molecular weight of 500, to 100,000 and a number average molecular weight of 200 to 50,000. Other preferred examples include aromatic compounds substituted by an alkoxymethyl or oxylanylmethyl group disclosed in EP-A-0212482, monomers, oligomer-melamine-formaldehyde condensates and urea-formaldehyde condensates disclosed in EP-A-0133126, DE-A-3634671 and German Patent 3,711,362, and alkoxy-substituted compounds disclosed in EP-A-0212482. Still other preferred examples include melamine-formaldehyde derivatives having at least two free N-hydroxymethyl, N-alkoxymethyl or N-acyloxymethyl groups. Among these, N-alkoxymethyl derivatives are particularly preferred.

A low molecular weight or oligomer silanol can be used as a silicon-containing crosslinking agent. Examples thereof include dimethyl- and diphenyl-silane diols, and oligomers already subjected to precondensation and at the same time, having such a unit. For example, those disclosed in EP-A-0377155 can be used. Among the aromatic compounds and heterocyclic compounds poly-substituted by an alkoxymethyl group, preferred are compounds having an alkoxymethyl group at the position adjacent to the hydroxyl group, where the alkoxy group in the alkoxymethyl group has 18 or less carbon atoms. Particularly preferred examples thereof include the compounds represented by the following formulae (B) to (E):

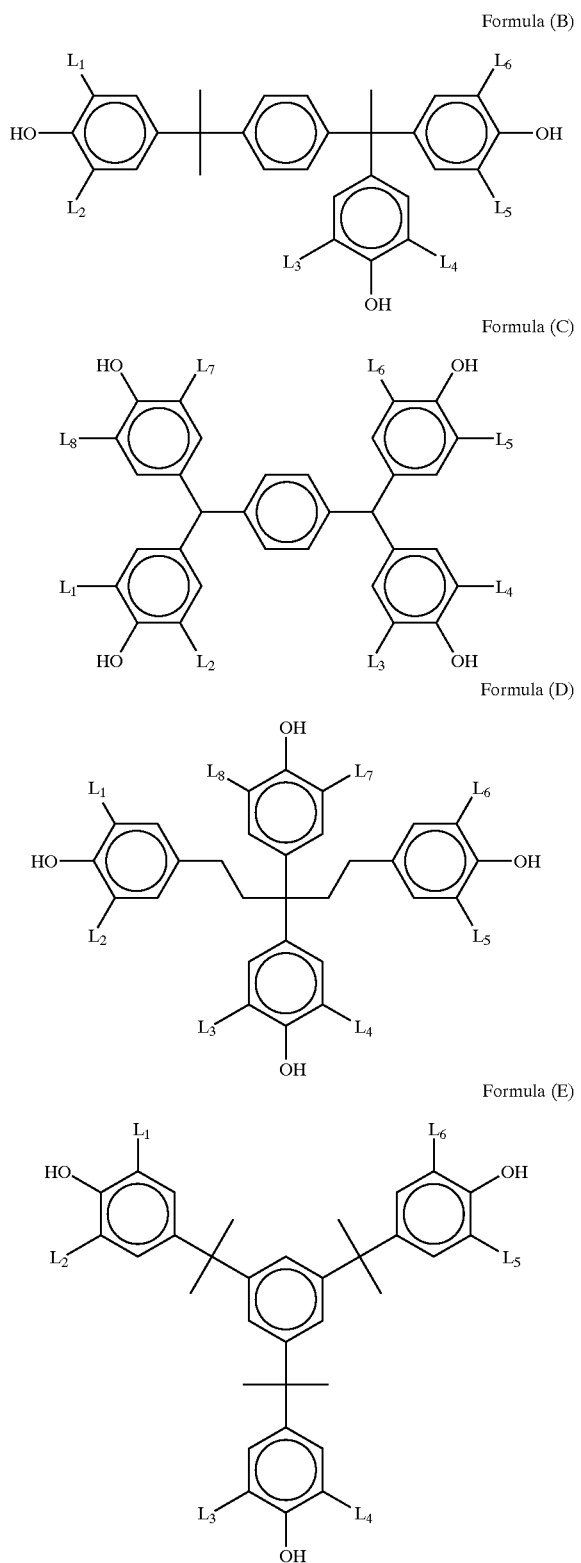

wherein $L_1$ to $L_8$, which may be the same or different, each represents an alkoxymethyl group substituted by an alkoxy group having 18 or less carbon atoms, such as methoxymethyl and ethoxyethyl. These compounds are advantageous in that the crosslinking efficiency is high and the press life can be improved. These heat-crosslinking compounds may be used individually or in combination of two or more thereof. The acid-crosslinkable compound for use in the present invention is added in an amount of 5 to 80% by weight, preferably from 10 to 75% by weight, more preferably from 20 to 70% by weight, based on the entire solid content of the lithographic photosensitive material. If the amount of the acid-crosslinkable compound added is less than 5% by weight, the photosensitive layer of the obtained lithographic printing plate material changes for the worse, whereas if it exceeds 80% by weight, disadvantageous results may occur in view of the stability during storage.

The alkali-soluble binder for use in (4) may be the same as the materials used for the above-described positive PS plate using quinonediazide. For the heat-decomposable substance which, in the state of being not decomposed, substantially decreases the solubility of the alkali-soluble binder, various onium salts are and quinonediazide compounds are used because of their excellent activity of decreasing the solubility of the alkali-soluble binder. Examples of the onium salt include diazonium salt, ammonium salt, phosphonium salt, iodonium salt, sulfonium salt, selenonium salt and arsonium salt.

Suitable examples of the onium salt for use in the present invention include diazonium salts described in S. I. Schlesinger, *Photogr. Sci. Eng.*, 18, 387 (1974), T. S. Bal et al., *Polymer*, 21, 423 (1980), JP-A-5-158230, etc., ammonium salts described in U.S. Pat. Nos. 4,069,055 and 4,069,056, JP-A-3-140140, etc., phosphonium salts described in D.C. Necker et al., *Macromolecules*, 17, 2468 (1984), C. S. Wen et al., *Teh, Proc. Conf. Rad. Curing ASIA*, p. 478, Tokyo, October (1988), U.S. Pat. Nos. 4,069,055 and 4,069,056, etc., iodonium salts described in J. V. Crivello et al., *Macromolecules*, 10 (6) 1307 (1977), *Chem. & Eng. News*, November 28, p. 31 (1988), European Patent 104,143, U.S. Pat. Nos. 339,049 and 410,201, JP-A-2-150848, JP-A-2-296514, etc., sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patent 370,693, 233,567, 297,443 and 297,442, U.S. Pat. Nos. 3,902,114, 4,933,377, 410,201, 339,049, 4,760,013, 4,734,444 and 2,833,827, German Patent 2,904,626, 3,604,580 and 3,604,581, JP-A-7-28237, etc., selenonium salts described in J. V. Crivello et al., *Macromolecules*, 10 (6), 1307 (1977), J. V. Crivello et al., *J. Polymer Sci., Polymer Chem. Ed.*, 17, 1047 (1979), etc., and arsonium salts described in C. S. Wen et al., *Teh, Proc. Conf. Rad. Curing ASIA*, p. 478, Tokyo, October (1988), etc.

Among these, diazonium salts are preferred in the present invention. Suitable diazonium salts include those described in JP-A-5-158230. Suitable quinonediazides include o-quinonediazide compounds.

The o-quinonediazide compound for use in the present embodiment is a compound having at least one o-quinonediazide group, which increases in the alkali solubility by the thermal decomposition. For this compound, those having various structures may be used. The o-quinonediazide compound improves the solubility of the photosensitive system by virtue of two effects, namely, that the o-quinonediazide compound loses the function of preventing the dissolution of the alkali-soluble binder and that the o-quinonediazide compound itself is changed into an alkali-soluble substance. For the o-quinonediazide compound for use in the present invention, for example, the compounds described in J. Koser, *Light-Sensitive Systems*, pp. 339–352, John Wiley & Sons. Inc. may be used, but particularly, sulfonic acid esters and sulfonic amides of o-quinonediazide obtained by the reaction with various aromatic polyhydroxy compounds or aromatic amino compounds are preferred. In addition, esters of benzoquinone-(1,2)-diazidesulfonic acid chloride or naphthoquinone-(1,2)-diazide-5-sulfonic acid chloride with pyrogallol-acetone resin described in JP-B-43-28403, and esters of benzoquinone-(1,2)-diazidesulfonic acid chloride or naphthoquinone-(1,2)-diazide-5-sulfonic acid chloride with phenol-formaldehyde resin described in U.S. Pat. Nos. 3,046,120 and 3,188,210 may be suitably used.

Furthermore, esters of naphthoquinone-(1,2)-diazide-4-sulfonic acid chloride with phenol-formaldehyde resin or cresol-formaldehyde resin, and esters of naphthoquinone-(1,2)-diazide-4-sulfonic acid chloride with pyrogallol-acetone resin may also be suitably used. Other useful examples of the o-quinonediazide compound include those described in a large amount of patents and publications such as JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,825, British Pat. Nos. 1,227,602, 1,251,345, 1,267,005, 1,329,888 and 1,330,932, and German Patent 854,890.

The amount added of the o-quinonediazide compound for use in the present invention is preferably from 1 to 50% by weight, more preferably from 5 to 30% by weight, still more preferably from 10 to 30% by weight, based on the entire solid content of the lithographic printing plate material. These compounds may be used individually but may also be used as a mixture of a few compounds thereof. If the amount of the o-quinonediazide compound added is less than 1% by weight, the image recording property may change for the worse, whereas if it exceeds 50% by weight, the image area may deteriorate in the durability or the sensitivity may decrease.

Example of the counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid and para-toluenesulfonic acid. Among these, preferred are alkylaromatic sulfonic acids such as hexafluorophosphoric acid, triisopropylnaphthalenesulfonic acid and 2,5-dimethylbenzenesulfonic acid. The amount added of the above-described compound other than the o-quinonediazide compound is preferably from 1 to 50% by weight, more preferably from 5 to 30% by weight, still more preferably from 10 to 30% by weight, based on the entire solid content of the lithographic printing plate material.

Specific examples of the raw materials for use in (5) include those described above as examples for the photopolymerization system. Many photopolymerization initiators are useful also as a heat radical generator. In addition, azobis compounds (e.g., azobisisobutyronitrile), diazonium compounds and the like may also be used as a thermal polymerization initiator. The addition-polymerizable compounds may also common. The light-heat converting agent may be any substance insofar as it can absorb light of the exposure light source and therefore, dyes exemplified with respect to the photopolymerization system may all be applied. However, the high-output laser light used actually for the heat-mode exposure is predominantly a (near) infrared light source of 750 nm or more. Various IR absorbents may be available, however, heptamethine cyanine dyes, phthalocyanines, carbon black and the like are most preferred.

According to various purposes, the composition of the present invention may further contain various additives, for example, a resin having a hydrophobic group for improving the inking property of image, such as octylphenol formaldehyde resin, tert-butylphenol-form-aldehyde resin, tert-butylphenol-benzaldehyde resin, rosin-modified novolak resin, o-naphthoquinonediazidesulfonic acid ester of the modified novolak resin; and a plasticizer for improving the flexibility of the coating film, such as dibutyl phthalate, dioctyl phthalate, butyl glycolate, tricresyl phosphate and dioctyl adipate. The amount added of these additives is preferably from 0.01 to 30% by weight based on the total weight of the composition.

Furthermore, the composition may contain a known resin for more improving the abrasion resistance of the film. Example of this resin include polyvinyl acetal resin, polyurethane resin, epoxy resin, vinyl chloride resin, nylon, polyester resin and acrylic resin. These resins may be used individually or in combination. The amount added thereof is preferably from 2 to 40% by weight based on the total weight of the composition.

The photosensitive resin composition for use in the present invention may contain an anionic surfactant described in JP-A-62-251740 and JP-A-4-68355, or an amphoteric surfactant described in JP-A-59-121044 and JP-A-4-13149. Specific examples of the anionic surfactant include sorbitan tristearate, sorbitan monopalmitate, sorbitan trioleate, stearic acid monoglyceride, polyoxyethylene sorbitan monooleate and polyoxyethylene nonylphenyl ether, and specific examples of the amphoteric surfactant include alkyldi(aminoethyl) glycine, alkylpolyaminoethylglycine hydrochloride, Amorgen K (trade name, produced by Dai-ich Kogyo Co., Ltd., N-tetradecyl-N,N-betaine type), 2-alkyl-N-carboxyethyl-N-hydroxyethyl-imidazolium betaines and Lebon 15 (trade name, produced by Sanyo Chemical Industries Co., Ltd., alkylimidazoline type) The proportion of the nonionic surfactant or amphoteric surfactant occupying in the photosensitive resin composition is preferably from 0.05 to 15% by weight, more preferably from 0.1 to 5% by weight.

Improvement of Coating Surface Properties

The photosensitive resin composition of the present invention may contain a surfactant for improving the coating surface properties, for example, the fluorine-based surfactant described in JP-A-62-170950 can be added. The amount added thereof is preferably from 0.001 to 1.0% by weight, more preferably from 0.005 to 0.5% by weight, based on the entire photosensitive resin composition.

Furthermore, the photosensitive resin composition for use in the present invention may contain a yellow dye, preferably a yellow dye such that the absorbance at 417 nm is at least 70% of the absorbance at 436 nm.

In preparing a photosensitive material for a lithographic printing plate from a photosensitive resin composition comprising a fluorine-based polymer according to the present invention, the photosensitive resin composition is first provided on an appropriate support to form an image-forming layer. More specifically, the photosensitive resin composition is dissolved or dispersed in a single or mixed solvent described below, coated on a support and then dried.

Although any commonly known organic solvent may be used, those having a boiling point of 40 to 200° C., particularly from 60 to 160° C., are selected in view of advantage at the drying. Of course, it is preferred to select a solvent which can dissolve the surfactant for use in the present invention.

Examples of the organic solvent include alcohols such as methyl alcohol, ethyl alcohol, n- or iso-propyl alcohol, n- or iso-butyl alcohol and diacetone alcohol; ketones such as acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone and acetylacetone; hydrocarbons such as benzene, toluene, xylene, cyclohexane and methoxybenzene; acetic acid esters such as ethyl acetate, n- or iso-propyl acetate, n- or iso-butyl acetate, ethylbutyl acetate and hexyl acetate; halides such as methylene dichloride, ethylene dichloride and monochlorobenzene; ethers such as isopropyl ether, n-butyl ether, dioxane, dimethyldioxane and tetrahydrofuran;

polyhydric alcohols and derivatives thereof such as ethylene glycol, methyl cellosolve, methyl cellosolve acetate, ethyl cellosolve, diethyl cellosolve, cellosolve acetate, butyl cellosolve, butyl cellosolve acetate, methoxymethoxyethanol, diethylene glycol monomethyl ether, diethylene glycol dimethyl ether, diethylene glycol methyl ethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether and 3-methyl-3-methoxybutanol; and special solvents such as dimethyl sulfoxide and N,N-dimethylformamide. These solvents are suitably used individually or in combination. The solid concentration in the coating composition is suitably from 2 to 50% by weight.

The composition of the present invention is preferably coated to a dry weight of 0.3 to 4.0 g/m$^2$ using a coating method such as roll coating, dip coating, air knife coating, gravure coating, gravure offset coating, hopper coating, blade coating, wire doctor coating and spray coating. As the coated amount is smaller, the exposure amount for image formation may be smaller but the film strength decreases. As the coated amount is increased, the photosensitive film becomes stronger and when used as a printing plate, a printing plate capable of printing a large number of sheets (high impression capacity) can be obtained, though a larger amount of exposure is necessary.

The photosensitive resin composition coated on a support is usually dried with hot air. The drying temperature is from 30 to 200° C., preferably from 40 to 140° C. The drying temperature may be kept constant during drying or may be elevated stepwise. In some cases, the drying with demoisturized air may bring about good results. The hot air is supplied to the coating surface at a rate of 0.1 to 30 m/sec, preferably from 0.5 to 20 m/sec.

Matting Layer

On the surface of the thus-formed photosensitive layer (image-forming layer), a matting layer is preferably provided for the purpose of reducing the evacuating time upon contact exposure using a vacuum flame and preventing blurring. To speak specifically, a method of providing a matting layer described in JP-A-50-125805, JP-B-57-6582 and JP-B-61-28986, or a method of heat-fusing solid powder described in JP-B-62-62337 may be used.

The support used for a photosensitive lithographic printing plate and the like is a dimensionally stable plate-form material and materials heretofore used as a support of printing plates may be suitably used. Examples of such a support include paper, paper laminated with plastic (for example, polyethylene, propylene or polystyrene), a metal plate such as aluminum (including aluminum alloy), zinc, iron and copper, a plastic film such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal, and paper or plastic film having laminated or deposited thereon a metal described above. Among these, an aluminum plate is preferred. The aluminum plate includes a pure aluminum plate and an aluminum alloy plate. Various aluminum alloys can be used and examples thereof include alloys of aluminum with a metal such as silicon, manganese, magnesium, chromium, zinc, lead, bismuth and nickel. These alloy compositions contains not only small amounts of iron and titanium but also negligibly small amounts of impurities.

The support is surface-treated, if desired. For example, in the case of a photosensitive lithographic printing plate, a hydrophilization treatment is applied to the support surface. Furthermore, in the case of a support having a metal surface, particularly aluminum surface, the support is preferably subjected to a surface treatment such as graining, soaking in an aqueous solution of sodium silicate, potassium fluorozirconate, phosphate or the like, or anodization. An aluminum plate subjected to graining and then to soaking in an aqueous sodium silicate solution described in U.S. Pat. No. 2,714,066, and an aluminum plate subjected to anodization and then to soaking in an aqueous alkali metal silicate solution described in U.S. Pat. No. 3,181,461 may also be suitably used. The anodization is performed by passing a current using the aluminum plate as an anode in an electrolytic solution comprising, for example, an aqueous or non-aqueous solution of an inorganic acid such as phosphoric acid, chromic acid, sulfuric acid or boric acid, or an organic acid such as oxalic acid or sulfamic acid. These aqueous or non-aqueous solutions may be used individually or in combination of two or more thereof.

The silicate electrodeposition described in U.S. Pat. No. 3,658,662 is also effective. These hydrophilization treatments are performed not only to render the support surface hydrophilic but also to prevent a harmful reaction with the photosensitive resin composition coated thereon or to improve the adhesion to the photosensitive layer. In advance of the graining of the aluminum plate, the surface may be subjected to a pre-treatment, if desired, so as to remove the rolling oil on the surface or reveal the clean aluminum surface. In the former case, a solvent such as trichlene, or a surfactant is used and in the latter case, a method of using an alkali etchant such as sodium hydroxide and potassium hydroxide is widely used.

With respect to the graining method, mechanical, chemical and electrochemical methods all are effective. The mechanical method includes ball polishing, blast polishing and brush polishing of rubbing a water dispersion slurry of abrasive such as pumice by a nylon brush. As the chemical method, a method of soaking the plate in a saturated aqueous solution of mineral acid aluminum salt described in JP-A-54-31187 is suitable and as the electrochemical method, a method of performing a.c. electrolysis in an acidic electrolytic solution such as hydrochloric acid, nitric acid or a combination thereof is preferred. Among these surface roughening methods, a surface roughening treatment using a combination of mechanical surface roughening and electrochemical surface roughening described in JP-A-55-

137993 is preferred because the ink-receptive image can firmly adhere to the support. The graining by the above-described method is preferably performed so that the aluminum plate surface can have a center line surface roughness (Ra) of from 0.3 to 1.0 μm. The thus-grained aluminum plate is, if desired, washed with water and subjected to chemical etching.

For the lithographic printing plate precursor of the present invention, an aluminum substrate subjected to an electrochemical surface roughening treatment using an aqueous solution containing a hydrochloric acid is particularly preferably used. When a substrate treated as such is used, the obtained printing plate can have very excellent scumming property on the non-image area or blanket at the time of printing. By using this substrate in combination with the image-forming layer having excellent discrimination between the image area and the non-image area of the present invention, the excellent scumming property and long press life can be attained at the same time.

The substrate surface-roughened by an electrochemical treatment using an aqueous solution containing hydrochloric acid as the electrolytic solution, which is a preferred practical embodiment of the present invention, is described in detail below. In the case of an electrochemical surface-roughening treatment using an electrolytic solution mainly comprising hydrochloric acid, a double structure is readily formed, where small pits having an average opening diameter of 0.01 to a few μm and a depth/average opening diameter ratio of 0.1 to 0.5 are formed and at the same time, large corrugations having an average opening diameter of a few to tens of μm are formed, and this surface-roughened state is advantageous in view of difficulty in scumming and press life. The electrolytic solution may contain, if desired, a nitrate, a chloride, an amine, an aldehyde, a phosphoric acid, a chromic acid, a boric acid, an acetic acid, an oxalic acid or the like and among these, an acetic acid is particularly preferred. In the electrochemical surface-roughening treatment, the voltage applied is preferably from 1 to 50 V, more preferably from 5 to 30 V, and the current density (peak value) is preferably from 5 to 200 A/dm$^2$, more preferably from 20 to 150 A/dm2. The quantity of electricity is, in total throughout all processing steps, preferably from 10 to 2,000 C/dm$^2$, more preferably from 200 to 1,000 C/dm$^2$. The temperature is preferably from 10 to 60° C., more preferably from 15 to 45° C. The frequency is preferably from 10 to 200 Hz, more preferably from 40 to 150 Hz. The hydrochloric acid concentration is preferably from 0.1 to 5% and the waveform of current used for the electrolysis is appropriately selected from sine wave, rectangular wave, trapezoidal wave, serrate wave and the like according to the objective surface-roughened shape. The wave form is more preferably a rectangular wave.

The electrochemical surface-roughening treatment using a hydrochloric acid-containing aqueous solution as the electrolytic solution can also be used in combination with a mechanical surface-roughening treatment or an electrochemical surface-roughening treatment different in the conditions.

The mechanical surface-roughening treatment is preferably performed in advance of a dissolution treatment using the above-described aqueous alkali solution before the electrochemical surface-roughening treatment. The method for performing the mechanical surface-roughening treatment is not particularly limited but brush polishing and honing polishing are preferred. In the brush polishing, for example, a cylindrical brush planted with bristles having a bristle size of 0.2 to 1 mm is rotated and pressed to the aluminum plate surface while feeding a slurry prepared by dispersing abrasives in water to the contact area, thereby performing the surface-roughening treatment. In the honing polishing, a slurry prepared by dispersing abrasives in water is ejected under pressure and collided against the aluminum plate surface from the oblique direction, thereby performing the surface-roughening treatment. Furthermore, the mechanical surface-roughening treatment may also be performed by attaching a previously surface-roughened sheet to the aluminum plate surface and applying a pressure thereto to transfer the roughened surface pattern.

In the case where the mechanical surface-roughening treatment is performed, the above-described solvent-degreasing treatment or emulsion-degreasing treatment may be omitted.

Examples of the electrochemical surface-roughening treatment under different conditions include a electrochemical surface-roughening treatment mainly using a nitric acid.

The acidic aqueous solution mainly comprising a nitric acid may be those usually used for the electrochemical surface-roughening treatment using a d.c. or a.c. current. For example, a solution obtained by adding at least one of nitric acid compounds such as aluminum nitrate, sodium nitrate and ammonium nitrate to an aqueous nitric acid solution having a nitric acid concentration of 5 to 15 g/liter, to a concentration from 0.01 g/liter to the saturation, may be used. In the acidic aqueous solution mainly comprising a nitric acid, a metal or the like contained in the aluminum alloy, such as iron, copper, manganese, nickel, titanium, magnesium and silicon, may be dissolved.

The acidic aqueous solution mainly comprising a nitric acid is preferably a solution containing a nitric acid, an aluminum salt and a nitrate salt and obtained by adding aluminum nitrate and ammonium nitrate to an aqueous nitric acid solution having a nitric acid concentration of 5 to 15 g/liter such that the aluminum ion is from 1 to 15 g/liter, preferably from 1 to 10 g/liter, and the ammonium ion is from 10 to 300 ppm. These aluminum ion and ammonium ion spontaneously increase during the electrochemical surface-roughening treatment. At this time, the liquid temperature is preferably from 10 to 95° C., more preferably from 40 to 80° C.

In the surface-roughened substrate for use in the present invention, small pits out of the surface-roughened shapes preferably have an average opening diameter of 0.01 to 3 μm, more preferably from 0.05 to 2 μm, still more preferably from 0.05 to 1.0 μm. Within this range, satisfactory printing ensured with difficulty in scumming and long press life can be attained.

The ratio of the average depth of small pits to the average opening diameter is preferably from 0.1 to 0.5, more preferably from 0.1 to 0.3, still more preferably from 0.15 to 0.2. Within this range, the difficulty in scumming and the press life are prevented from deteriorating at the printing.

The large corrugations out of the surface-roughened shapes preferably have an average opening diameter of 3 to 20 μm, more preferably from 3 to 17 μm, still more preferably from 4 to 10 μm. Within this range, the difficulty in scumming and the press life are prevented from deteriorating at the printing and also, the scumming property advantageously does not deteriorate.

The etching solution is usually selected from aqueous solutions of base or acid capable of dissolving aluminum. In this case, the coating formed on the etched surface must be different from the aluminum derived from the etching solution component. Preferred examples of the etchant include, as a basic substance, sodium hydroxide, potassium hydroxide, trisodium phosphate, disodium phosphate, tripotassium phosphate and dipotassium phosphate; and as an acidic substance, sulfuric acid, persulfuric acid, phosphoric acid, hydrochloric acid and salts thereof. However, metals less ionizable than aluminum, such as salts of zinc, chromium, cobalt, nickel or copper, are not preferred because an unnecessary film is formed on the etching surface. The etchant is most preferably used such that the aluminum or alloy used dissolves at a rate of 0.3 to 40 g/m$^2$ per the soaking time of 1 minute with the concentration and the temperature used. The dissolution rate, however, may be in excess of or less than this range.

Etching is performed by soaking the aluminum plate in the above-described etching solution or coating the etching solution on the aluminum plate, and the etching treatment is preferably performed to have an etching amount of 0.5 to 1.0 g/m$^2$. The etchant is preferably an aqueous solution of a base because of its high etching rate. In this case, smut is generated and therefore, the plate is usually subjected to a desmutting treatment. Examples of the acid for use in the desmutting treatment include nitric acid, sulfuric acid, phosphoric acid, chromic acid, hydrofluoric acid and borofluoric acid. The etched aluminum plate is, if desired, subjected to water washing and anodization. The anodization may be performed by a method conventionally used in this field. To speak specifically, a d.c. or a.c. current is passed to aluminum in an aqueous or non-aqueous solution of sulfuric acid, phosphoric acid, chromic acid, oxalic acid, sulfamic acid, benzenesulfonic acid or a combination of two or more thereof, whereby an anodic oxide film can be formed on the aluminum support surface.

The anodization treatment conditions vary depending on the electrolytic solution used and cannot be indiscriminately specified, however, suitable conditions are generally such that the electrolytic solution concentration is from 1 to 80% by weight, the liquid temperature is from 5 to 70° C., the current density is from 0.5 to 60 A/dm$^2$, the voltage is from 1 to 100 V, and the electrolysis time is from 30 seconds to 50 minutes. Among the anodization treatments, the method of performing anodization at a high current density in sulfuric acid described in British Patent 1,412,768 and the method of performing anodization using phosphoric acid as the electrolysis bath described in U.S. Pat. No. 3,511,661 are preferred. The thus surface roughened and further anodized aluminum plate may be hydrophilized, if desired. Preferred examples of the hydrophilization method include a treatment with an alkali metal silicate such as an aqueous sodium silicate solution disclosed in U.S. Pat. Nos. 2,714,066 and 3,181,461, a treatment with potassium fluorozirconate disclosed in JP-B-36-22063 and a treatment with polyvinylphosphonic acid disclosed in U.S. Pat. No. 4,153,461.

Organic Undercoat Layer

In the photosensitive lithographic printing plate of the present invention, an organic undercoat layer is preferably provided before coating a photosensitive layer, so that the residual photosensitive layer in the non-image area can be reduced. The organic compound for use in the organic undercoat layer is selected from, for example, carboxymethyl cellulose, dextrin, gum arabic, amino group-containing phosphonic acids (e.g., 2-aminoethylphosphonic acid), organic phosphonic acids (e.g., phenylphosphonic acid, naphthylphosphonic acid, alkylphosphonic acid, glycerophosphonic acid, methylenediphosphonic acid, ethylenediphosphonic acid) which may have a substituent, organic phosphoric acids (e.g., phenylphosphoric acid, naphthylphosphoric acid, alkylphosphoric acid, glycerophosphoric acid) which may have a substituent, organic phosphinic acids (e.g., phenylphosphinic acid, naphthylphosphinic acid, alkylphosphinic acid, glycerophosphinic acid) which may have a substituent, amino acids (e.g., glycine, β-alanine), and hydrochlorides of hydroxyl group-containing amine, such as hydrochloride of triethanolamine. These compounds may be used as a mixture of two or more thereof.

Also, at least one compound selected from the group consisting of polymer compounds having a structural unit represented by poly(p-vinylbenzoate) may be used. Specific examples thereof include a copolymer of p-vinylbenzoate and vinyl benzyl triethyl ammonium salt, and a copolymer of p-vinylbenzoate and vinyl benzyl trimethyl ammonium chloride.

The organic undercoat layer can be formed by the following method, that is, a method of dissolving the above-described organic compound in water, an organic solvent such as methanol, ethanol or methyl ethyl ketone, or a mixed solvent thereof, coating the obtained solution on an aluminum plate and then drying the solution or a method of dissolving the organic compound in water, an organic solvent such as methanol, ethanol or methyl ethyl ketone, or a mixed solvent thereof, dipping an aluminum plate in the obtained solution to allow the organic compound to adsorb, washing the aluminum plate with water or the like and then drying the solution to provide an organic undercoat layer. In the former method, the solution of the organic compound in a concentration of 0.005 to 10% by weight can be coated by various methods. For example, any method such as bar coater coating, spin coating, spray coating and curtain coating may be used. In the latter method, the concentration of the solution is from 0.01 to 20% by weight, preferably from 0.05 to 5% by weight, the dipping temperature is from 20 to 90° C., preferably 25 to 50° C., and the dipping time is from 0.1 second to 20 minute, preferably from 2 seconds to 1 minute.

The solution used here may be adjusted to a pH of 1 to 12 using a basic substance such as ammonia, triethylamine and potassium hydroxide, or an acidic substance such as hydrochloric acid or phosphoric acid. For the purpose of improving the tone reproducibility of the photosensitive lithographic printing plate, a yellow dye may be added to the solution. Furthermore, a compound represented by the following formula (a) may also be added. Formula (a)

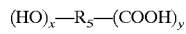

wherein $R_5$ represents an arylene group having 14 or less carbon atoms, which may have a substituent, and x and y each independently represents an integer of 1 to 3. Specific examples of the compound represented by formula (a) include 3-hydroxybenzoic acid, 4-hydroxybenzoic acid, salicylic acid, 1-hydroxy-2-naphthoic acid, 2-hydroxy-1-naphthoic acid, 2-hydroxy-3-naphthoic acid, 2,4-dihydroxybenzoic acid and 10-hydroxy-9-anthracene carboxylic acid. The dry coverage of the organic undercoat layer is suitably from 1 to 100 mg/m$^2$, preferably from 2 to 70 mg/m$^2$. If the coverage is less than 2 mg/m$^2$, sufficiently high printing impression cannot be obtained. The same results if the coverage exceeds 100 mg/m$^2$.

Backcoat

On the back surface of the support, a backcoat is provided, if desired. Examples of the backcoat which is preferably used include a coating layer comprising an organic polymer compound described in JP-A-5-45885 and a coating comprising a metal oxide obtained by the hydrolysis and polycondensation of an organic or inorganic metal compound described in JP-A-6-35174. Of these coating layers, a coating layer comprising a metal oxide obtained from an alkoxy compound of silicon, such as $Si(OCH_3)_4$, $Si(OC_2H_5)_4$, $Si(OC_3H_7)_4$ and $Si(OC_4H_9)_4$, is preferred because the silicon compound is inexpensively and easily available and the resistance to developer is high.

The thus-manufactured lithographic printing plate is usually subjected to image exposure and development processing. Examples of the light source for an actinic ray used for the image exposure include a mercury lamp, a metal halide lamp, a xenon lamp, a chemical lamp and a carbon arc lamp. Examples of the radiation include electron beam, X ray, ion beam and far infrared ray. Also, g-line, i-line, deep-UV light and high-density energy beam (laser beam) may be used. Examples of the laser beam include helium/neon laser, argon laser, krypton laser, helium/cadmium laser, and KrF excimer laser. In the case of a laser direct drawing-type printing print, a light source emitting light having an emission wavelength from near infrared to infrared is preferred, and solid laser and semiconductor laser are more preferred.

Examples of the developer for use in the present invention include the developers described in JP-B-57-7427. The developer is suitably an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia, or an organic alkali agent such as monoethanolamine or diethanolamine. The developer is added such that the alkali solution has a concentration of 0.1 to 10% by weight, preferably from 0.5 to 5% by weight.

The lithographic printing plate of the present invention is useful particularly when a developer containing substantially no silicate is used. The developer containing silicate can elevate the discrimination between the image area and the non-image area and is being widely used but has a problem in that insoluble scum is generated with use over a long period of time, the pH of the developer is limited to high pH and this is not preferred in view of working environment. By incorporating the fluorine-based polymer for use in the present invention, a sufficiently distinct discrimination can be obtained without using a silicate developer. That is, a preferred practical embodiment is "a plate-making method comprising imagewise exposing a lithographic printing plate precursor having an image-forming layer containing the fluorine-based polymer for use in the present invention and processing the plate precursor with a developer containing substantially no silicate". The "developer containing substantially no silicate" as used herein means a developer having an $SiO_2$ content of 0.5% by weight or less, preferably 0.1% by weight or less, more preferably 0.01% by weight or less.

The developer for the lithographic printing plate using the photosensitive resin composition of the present invention is preferably a developer containing (a) at least one sugar selected from non-reducing sugars and (b) at least one base and having a pH of 9.0 to 13.5. This developer is described in detail below. Unless otherwise indicated, the term "developer" as used herein means not only a development initiating solution (developer in a narrow sense) but also a developer replenisher.

This developer is preferably constructed such that the main components comprise at least one compound selected from non-reducing sugars and at least one base and the pH of the solution is in the range from 9.0 to 13.5. The non-reducing sugars are a sugar having no free aldehyde or ketone group and not showing the reducing property. These sugars are classified into trehalose-type oligosaccharides in which reducing groups are bonded to each other, glycosides in which the reducing group of a sugar is bonded to a non-sugar, and sugar alcohols obtained by hydrogenating and thereby reducing a sugar. Any type of these sugars may be suitably used. The trehalose-type oligosaccharides include saccharose and trehalose. The glycoside includes alkyl glycosides, phenol glycosides and mustard oil glycoside. The sugar alcohol includes D,L-arabitol, ribitol, xylitol, D,L-sorbitol, D,L-mannitol, D,L-iditol, D,L-talitol, dulcitol and allodulcitol. In addition, maltitol obtained by the hydrogenation of a disaccharide, and a reduced form (reduced sugar) obtained by the hydrogenation of an oligosaccharide may be suitably used. Among these non-reducing sugars, sugar alcohol and saccharose are preferred, and D-sorbitol, saccharose and reduced sugar are preferred because of their buffering action in an appropriate pH range and inexpensiveness.

These non-reducing sugars may be used individually or in combination of two or more thereof. The proportion thereof occupying in the developer is preferably from 0.1 to 30% by weight, more preferably from 1 to 20% by weight.

If the concentration is less than this range, a sufficiently high buffering action may not be obtained, whereas if the concentration exceeds this range, preparation to a high concentration is difficult, the material cost disadvantageously rises and furthermore, when the reducing sugar is used in combination with a base, discoloration to brown takes place in aging and the pH gradually lowers, as a result, the developability decreases.

The base used in combination with the non-reducing sugar includes conventionally known alkali agents. Examples thereof include inorganic alkali agents such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate and ammonium borate, and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkali agents may be used individually or in combination of two or more thereof. Among these, preferred are sodium hydroxide and potassium hydroxide because the pH can be adjusted over a wide pH range by controlling the ratio of the alkali agent based on the non-reducing sugar. Also, trisodium phosphate, tripotassium phosphate, sodium carbonate and potassium carbonate are preferred because of their buffering action. The alkali agent is added such that pH of the developer falls within the range of 9.0 to 13.5. The pH is more preferably from 10.0 to 13.2, though the amount of the alkali agent added is determined according to the desired pH and the kind and amount of the non-reducing sugar added.

In the developer, an alkaline buffer solution comprising a weak acid exclusive of saccharides and a strong base may further be used in combination. The weak acid for use in the buffer solution preferably has a dissociation constant (pKa) of 10.0 to 13.2. This weak acid is selected from those described, for example, in *Ionization Constants of Organic Acids in Aqueous Solution*, Pergamon Press. Examples thereof include alcohols such as 2,2,3,3-tetrafluoropropanol-1 (pKa: 12.74), trifluoro-ethanol (pKa: 12.37) and trichloroethanol (pKa: 12.24); aldehydes such as pyridine-2-aldehyde (pKa: 12.68) and pyridine-4-aldehyde (pKa: 12.05); compounds having a phenolic hydroxyl group, such as salicylic acid (pKa: 13.0), 3-hydroxy-2-naphthoic acid (pKa: 12.84), catechol (pKa: 12.6), gallic acid (pKa: 12.4), sulfosalicylic acid (pKa: 11.7), 3,4-dihydroxysulfonic acid (pKa: 12.2), 3,4-dihydroxybenzoic acid (pKa: 11.94), 1,2,4-trihydroxybenzene (pKa: 11.82), hydroquinone (pKa: 11.56), pyrogallol (pKa: 11.34), o-cresol (pKa: 10.33), resorcinol (pKa: 11.27), p-cresol (pKa: 10.27) and m-cresol (pKa: 10.09);

oximes such as 2-butanone oxime (pKa: 12.45), acetoxime (pKa: 12.42), 1,2-cycloheptanedione dioxime (pKa: 12.3), 2-hydroxybenzaldoxime (pKa: 12.10), dimethylglyoxime (pKa: 11.9), ethanediamide dioxime (pKa: 11.37) and acetophenone oxime (pKa: 11.35); nucleic acid-related substances such as adenosine (pKa: 12.56), inosine (pKa: 12.5), guanine (pKa: 12.3), cytosine (pKa: 12.2), hypoxanthine (pKa: 12.1) and xanthine (pKa: 11.9); and other weak acids such as diethylaminomethylphosphonic acid (pKa: 12.32), 1-amino-3,3,3-trifluorobenzoic acid (pKa: 12.29), isopropylidenediphosphonic acid (pKa: 12.10), 1,1-ethylidenediphosphonic acid (pKa: 11.54), 1-hydroxy-1,1-ethylidenediphosphonate (pKa: 11.52), benzimidazole (pKa: 12.86), thiobenzamide (pKa: 12.8), picoline thioamide (pKa: 12.55) and barbituric acid (pKa: 12.5).

Among these weak acids, preferred are sulfosalicylic acid and salicylic acid. The base which is suitably used in combination with the weak acid includes sodium hydroxide, ammonium hydroxide, potassium hydroxide and lithium hydroxide. These alkali agents are used individually or in combination of two or more thereof. These various alkali agents are used by selecting the concentration and combination and thereby adjusting the pH to fall in the desired range.

If desired, the developer may contain various surfactants and organic solvents so as to accelerate the development and improve the dispersion of development scum or the ink-receptivity of image area on the printing plate. Preferred surfactant include anionic, cationic, nonionic and amphoteric surfactants.

Preferred examples of the surfactant include nonionic surfactants such as polyoxyethylene alkyl ethers, polyoxyethylene alkylphenyl ethers, polyoxyethylene polystyrylphenyl ethers, polyoxyethylene-polyoxypropylene alkyl ethers, fatty acid partial esters of glycerol, fatty acid partial esters of sorbitan, fatty acid partial esters of pentaerythritol, propylene glycol mono-fatty acid esters, fatty acid partial esters of sucrose, fatty acid partial esters of polyoxyethylene sorbitan, fatty acid partial esters of polyoxyethylene sorbitol, fatty acid esters of polyethylene glycol, fatty acid partial esters of polyglycerol, polyoxyethylated castor oil, fatty acid partial esters of polyoxyethylene glycerol, fatty acid diethanolamides, N,N-bis-2-hydroxyalkylamines, polyoxy-ethylene alkylamines, fatty acid esters of triethanolamine and trialkylamine oxides;

anionic surfactants such as fatty acid salts, abietates, hydroxyalkanesulfonates, alkanesulfonates, dialkylsulfosuccinates, straight-chained alkylbenzene sulfonates, branched alkylbenzene sulfonates, alkylnaphthalene sulfonates, alkylphenoxypolyoxyethylene propylsulfonates, polyoxyethylene alkylsulfophenyl ether salts, N-methyl-N-oleyltaurine sodium salts, N-alkylsulfosuccinic acid monoamide disodium salts, petroleum sulfonates, sulfurized beef tallow oil, sulfuric acid ester salts of fatty acid alkyl ester, alkylsulfuric acid ester salts, sulfuric acid ester salts of polyoxyethylene alkyl ether, sulfuric ester salts of fatty acid monoglyceride, sulfuric acid ester salts of polyoxyethylene alkylphenyl ether, sulfuric acid ester salts of polyoxyethylene styrylphenyl ether, alkylphosphoric acid ester salts, phosphoric acid ester salts of polyoxyethylene alkyl ether, phosphoric acid ester salts of polyoxyethylene alkylphenyl ether, partially saponified products of styrene-maleic acid anhydride copolymer, partially saponified products of olefin-maleic acid anhydride copolymer, and naphthalene sulfonate-formalin condensates; cationic surfactants such as alkylamine salts, quaternary ammonium salts (e.g., tetrabutylammonium bromide), polyoxyethylene-alkylamine salts and polyethylene polyamine derivatives; and amphoteric surfactants such as carboxybetaines, aminocarboxylic acids, sulfobetaines, aminosulfuric acid esters and imidazoline derivatives. In these surfactants, the "polyoxyethylene" can be read as polyoxyalkylene such as polyoxymethylene, polyoxypropylene and polyoxybutylene.

Among these surfactants, preferred are fluorine-based surfactants containing a perfluoroalkyl group within the molecule. Examples of this fluorine-based surfactant include anionic surfactants such as perfluoroalkyl carboxylate, perfluoroalkyl sulfonate and perfluoro-alkylphosphoric acid ester; amphoteric surfactants such as perfluoroalkylbetaine; cationic surfactants such as perfluoroalkyltrimethylammonium salt; and nonionic surfactants such as perfluoroalkylamine oxide, perfluoroalkyl ethylene oxide adduct, oligomer containing a perfluoroalkyl group and a hydrophilic group, oligomer containing a perfluoroalkyl group and a lipophilic group, oligomer containing a perfluoroalkyl group, a hydrophilic group and a lipophilic group, and urethane containing a perfluoroalkyl group and a lipophilic group. These surfactants can be used individually or in combination of two or more thereof. The surfactant is added to the developer in an amount of 0.001 to 10% by weight, preferably from 0.01 to 5% by weight.

In the developer, various development stabilizers may be used. Preferred examples thereof include polyethylene glycol adducts of sugar alcohol, tetraalkylammonium salts (e.g., tetrabutylammonium hydroxide), phosphonium salts (e.g., tetrabutylphosphonium bromide) and iodonium salts (e.g., diphenyliodonium chloride) described in JP-A-6-282079. Other examples include anionic or amphoteric surfactants described in JP-A-50-51324, water-soluble cationic polymers described in JP-A-55-95946, water-soluble amphoteric polyelectrolytes described in JP-A-56-142528.

Still other examples include alkylene glycol-added organic boron compounds described in JP-A-59-84241, water-soluble surfactants of polyoxyethylene-polyoxypropylene block polymer type described in JP-A-60-111246, alkylenediamine compounds substituted by polyoxyethylene-polyoxypropylene described in JP-A-60-129750, polyethylene glycol having a weight average molecular weight of 300 or more described in JP-A-61-215554, fluorine-containing surfactants having a cationic group described in JP-A-63-175858, water-soluble ethylene oxide adducts obtained by adding 4 mol or more of ethylene oxide to an acid or an alcohol described in JP-A-2-39157, and water-soluble polyalkylene compounds.

The developer may further contain an organic solvent, if desired. The organic solvent is selected from those having a water solubility of about 10% by weight or less, preferably 5% by weight or less. Examples thereof include 1-phenylethanol, 2-phenylethanol, 3-phenyl-l-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine and N-phenyldiethanolamine. The organic solvent content is from 0.1 to 5% by weight based on the total weight of the solution used. The amount used thereof is closely related to the amount of surfactant. As the amount of the organic solvent increases, the amount of the surfactant is preferably increased, because if the organic solvent is used in a large amount with a small amount of surfactant, the organic solvent cannot dissolve completely and accordingly, good developability cannot be ensured.

The developer may further contain a reducing agent for the purpose of preventing scumming of the printing plate. The reducing agent is particularly effective in the development of a negative working photosensitive lithographic printing plate containing a photosensitive diazonium salt compound. Preferred examples of the organic reducing agent include phenolic compounds such as thiosalicylic acid, hydroquinone, metol, methoxyquinone, resorcin and 2-methylresorcin; and amine compounds such as phenylenediamine and phenylhydrazine. Preferred examples of the inorganic reducing agent include sodium salt, potassium salt, ammonium salt and the like of sulfurous acid, hydrogensulfite, phosphorous acid, hydrogenphosphite, dihydrogenphosphite, thiosulfuric acid and dithionous acid. Of these reducing agents, sulfites are particularly effective in preventing the scumming. The reducing agent is preferably used in an amount of 0.05 to 5% by weight based on the running developer.

The developer may further contain an organic carboxylic acid, preferably an aliphatic or aromatic carboxylic acid having from 6 to 20 carbon atoms. Specific examples of the aliphatic carboxylic acid include caproic acid, enanthylic acid, caprylic acid, lauric acid, myristic acid, palmitic acid and stearic acid. Among these, an alkanoic acid having from 8 to 12 carbon atoms is preferred. The aliphatic carboxylic acid may be an unsaturated fatty acid having a double bond in the carbon chain or may have a branched carbon chain. The aromatic carboxylic acid is a compound having a benzene, naphthalene or anthracene ring substituted with a carboxyl group. Specific examples thereof include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid and 2-naphthoic acid. Among these, hydroxynaphthoic acid is particularly effective.

The aliphatic or aromatic carboxylic acid is preferably used in the form of a sodium, potassium or ammonium salt so as to improve the water solubility. The organic carboxylic acid content in the developer for use in the present invention is not particularly limited, but if the content is less than 0.1% by weight, the effect cannot be satisfactorily brought out, whereas if it exceeds 10% by weight, not only the improvement cannot be elevated any more but also when other additives are used in combination, their dissolution may be inhibited. Accordingly, the amount added is preferably from 0.1 to 10% by weight, more preferably from 0.5 to 4% by weight, based on the running developer.

The developer may further contain an antiseptic, a coloring agent, a thickener, a defoaming agent, a hard water softener and the like. Examples of the hard water softener include polyphosphoric acid and a sodium, potassium or ammonium salt thereof; aminopolycarboxylic acids such as ethylenediaminetetraacetic acid, diethylenetriaminepentaacetic acid, triethylenetetraminehexaacetic acid, hydroxyethylethylenediaminetriacetic acid, nitrilotriacetic acid, 1,2-diaminocyclohexanetetraacetic acid and 1,3-diamino-2-propanoltetraacetic acid, and a sodium, potassium or ammonium salt thereof; and other hard water softeners such as aminotri(methylenephosphonic acid), ethylenediaminetetra(methylenephosphonic acid), diethylenetriaminepenta(methylenephosphonic acid), triethylenetetraminehexa(methylenephosphonic acid), hydroxyethylethylenediaminetri(methylenephosphonic acid) and 1-hydroxyethane-1,1-diphosphonic acid, and a sodium, potassium or ammonium salt thereof.

The optimum amount of the hard water softener varies depending on the chelating ability thereof and the hardness and amount of hard water used, however, the amount used thereof is generally from 0.01 to 5% by weight, preferably 0.01 to 0.5% by weight, based on the running developer. If the amount added is less than this range, the expected effect may not be satisfactorily attained, whereas if the amount added exceeds this range, adverse effects may arise, such as color slipping. The balance of the developer is water. In view of transportation, it is advantageous to prepare the developer as a concentrated solution reduced in the water content than that on use and dilute the developer with water on use. If the case is so, the developer is suitably diluted to a concentration degree of causing no separation nor precipitation of each component.

As the developer for a lithographic printing plate using the photosensitive resin composition of the present invention, a developer described in JP-A-6-282079 may also be used. This developer comprises an alkali metal silicate having an $SiO_2/M_2O$ (M is an alkali metal) molar ratio of 0.5 to 2.0 and a water-soluble ethylene oxide adduct compound obtained by adding 5 mol or more of ethylene oxide to a sugar alcohol having 4 or more hydroxyl groups. The sugar alcohol is a polyhydric alcohol corresponding to a sugar where the aldehyde group and the ketone group are reduced to a primary alcohol group and a secondary alcohol group, respectively. Specific examples of the sugar alcohol include D,L-threitol, erythritol, D,L-arabitol, ribitol, xylitol, D,L-sorbitol, D,L-mannitol, D,L-iditol, D,L-talitol, dulcitol and allodulcitol. Also, diglycerol, triglycerol, tetraglycerol, pentaglycerol and hexaglycerol resulting from condensation of sugar alcohol may be used. The above-described water-soluble ethylene oxide adduct compound can be obtained by adding 5 mol or more of ethylene oxide to one mole of sugar alcohol. If desired, the ethylene oxide adduct compound may be block-copolymerized with propylene oxide within the permissible solubility range. These ethylene oxide adduct compounds may be used individually or in combination of two or more thereof. The amount of the water-soluble ethylene oxide adduct compound added is suitably from 0.001 to 5% by weight, preferably from 0.001 to 2% by weight, based on the (running) developer.

In order to accelerate development or improve the dispersion of development scum or the ink-receptivity of image area, this developer may further contain various surfactants or organic solvents described above.

The PS plate developed with a developer having the above-described composition is then subjected to a post-treatment with washing water, a rinsing solution containing a surfactant or the like, and a finisher or protective gum solution mainly comprising gum arabic, a starch derivative or the like. The post-treatment of the PS plate of the present invention may be performed by variously combining these treatments.

Recently, in the plate-making and printing industries, an automatic developing machine for PS plates is being widely used for the purpose of rationalization and standardization of the plate-making operation. The automatic developing machine generally comprises a development part and a post-treatment part, where a PS plate transportation unit, a tank for housing each processing solution and a spraying unit are provided and while horizontally transporting an exposed PS plate, each processing solution is pumped up and sprayed through spray nozzles to perform the development and post-treatment. In recent years, a method of transporting and dipping a PS plate in a processing solution tank filled with a processing solution by means of submerged guide rolls, thereby performing the development processing, and a method of water-washing the PS plate after the development by feeding a small fixed amount of water to the plate surface and re-using the waste water as diluting water of the developer stock solution are also known.

In this automatic processing, the processing may also be performed while replenishing respective replenishers for the processing solutions in accordance with the processed amount, the operation time and the like. A disposable processing system of performing the processing with substantially unused processing solutions may also be used. The lithographic printing plate obtained through such processing is mounted on an offset printing machine and used for the printing of a large number of sheets.

The present invention is described in greater detail below by referring to Examples, however, the present invention should not be construed as being limited thereto. Unless otherwise indicated, the percents in Examples below all are % by weight.

EXAMPLES 1 TO 12 AND COMPARATIVE EXAMPLES 1 TO 3

A 0.24 mm-thick aluminum plate (according to JIS A 1050) was brush-grained with a rotary nylon brush described below while feeding to the aluminum surface a water suspension of pumice stones having an average particle size of about 2.1 $\mu$m. The first brush had a bristle length of 100 mm, a bristle diameter of 0.95 mm and a bristle density of 70 pieces/cm$^2$, and the second brush had a bristle length of 80 mm, a bristle diameter of 0.295 mm and a bristle density of 670 pieces/cm$^2$. The brush rolls each was rotated at 250 rpm. Subsequently to the brush-graining, the aluminum plate was thoroughly rinsed with water, etched by dipping it in 10% sodium hydroxide at 60° C. for 25 seconds, washed with running water, rinsed by neutralization with 20% nitric acid and washed with water. This aluminum plate was then subjected to an electrolytic surface-roughening treatment using a sine-wave alternating electric current under the condition of 12.7 V with an anode-time electricity of 160 coulomb/dm$^2$ in an aqueous 1% nitric acid solution. The surface roughness of the resulting plate was measured and found to be 0.79 $\mu$m (Ra indication). Thereafter, the plate was dipped in an aqueous 1% sodium hydroxide solution at 40° C. for 30 seconds, desmutted by immersing it in an aqueous 30% sulfuric acid solution at 60° C. for 40 seconds, and then anodized in an aqueous 20% sulfuric acid solution by passing a direct current at a current density of 2 A/dm$^2$ such that the oxide film was formed to a weight of 1.6 g/m$^2$, whereby a substrate was prepared.

On the surface of the thus-treated substrate, Undercoat Solution (A) having the following composition was coated and dried at 80° C. for 30 seconds. The coverage after drying was 10 mg/m$^2$.

Undercoat Solution (A)

| | |
|---|---|
| β-Alanine | 0.10 g |
| Methanol | 40 g |
| Pure water | 60 g |

As such, Substrate (I) was manufactured. On this Substrate (I), a photosensitive solution (composition) shown in Table 1 below was coated to 12 ml/m$^2$ by rod coating and then dried at 100° C. for 1 minute to obtain a positive working photosensitive lithographic printing plate precursor. The coated amount after the drying was 1.15 g/m$^2$. Furthermore, a matting layer was formed thereon as described in JP-B-61-28986 so as to shorten the vacuum contact time.

TABLE 1

| | |
|---|---|
| Esterification product of 1,2-diazonaphthoquinone-5-sulfonyl chloride and pyrogallol-acetone resin (described in Example 1 of U.S. Pat. No. 3,635,709) | 0.8 g |
| Cresol-formaldehyde novolak resin (mata and para ratio: 6:4, weight average molecular weight: 8,000) | 1.5 g |
| Phenol-formaldehyde resin (weight average molecular weight: 15,000) | 0.3 g |
| Poly [N-(p-aminosulfonylphenyl)-acrylamide-co-n-butyl acrylate-co-diethylene glycol monomethyl ether methacrylate (molar ratio of monomers in the order: 40:40:20, average molecular weight: 40,000, number average molecular weight: 20,000) | 0.2 g |
| p-n-Octylphenol-formaldehyde resin (described in U.S. Pat. No. 4,123,279) | 0.02 g |
| Naphthoquinonediazide-1,2-diazido-4-sulfonyl chloride | 0.01 g |
| Tetrahydrophthalic anhydride | 0.02 g |
| Pyrogallol | 0.05 g |
| 4-[p-N, N-Bis(ethoxycarbonyl-methyl)aminophenyl]-2, 6-bis(trichloromethyl)-S-triazine | 0.07 g |
| Dye obtained by changing the counter anion of Victoria Pure Blue BOH (produced by Hodogaya Chemical Co., Ltd.) to 1-naphthalenesulfonic acid | 0.045 g |
| Fluorine-based polymer (see Table 2) | shown in Table 2 |
| MEK/1-methoxy-2-propanol | 15 g/10 g |

TABLE 2

| | Fluorine-Based Polymer (corresponding to Polymer No. in the specification) | Amount Added (in terms of solid content in fluorine-based polymer: g) |
|---|---|---|
| Photosensitive Material 1 (Invention) | P-1 | 0.03 g |
| Photosensitive Material 2 (Invention) | P-9 | 0.02 g |
| Photosensitive Material 3 (Invention) | P-23 | 0.1 g |
| Photosensitive Material 4 (Invention) | P-25 | 0.01 g |

TABLE 2-continued

| | Fluorine-Based Polymer (corresponding to Polymer No. in the specification) | Amount Added (in terms of solid content in fluorine-based polymer: g) |
|---|---|---|
| Photosensitive Material 5 (Invention) | P-42 | 0.01 g |
| Photosensitive Material 6 (Invention) | P-57 | 0.06 g |
| Photosensitive Material 7 (Invention) | P-61 | 0.01 g |
| Photosensitive Material 8 (Invention) | P-62 | 0.01 g |
| Photosensitive Material 9 (Invention) | P-63 | 0.01 g |
| Photosensitive Material 10 (Invention) | P-64 | 0.02 g |
| Photosensitive Material 11 (Invention) | P-65 | 0.05 g |
| Photosensitive Material 12 (Invention) | P-66 | 0.1 g |
| Photosensitive Material R1 (Comparison) | R-1 (having structure shown below) | 0.01 g |
| Photosensitive Material R2 (Comparison) | R-2 (having structure shown below) | 0.01 g |
| Photosensitive Material R3 (Comparison) | not added | none |

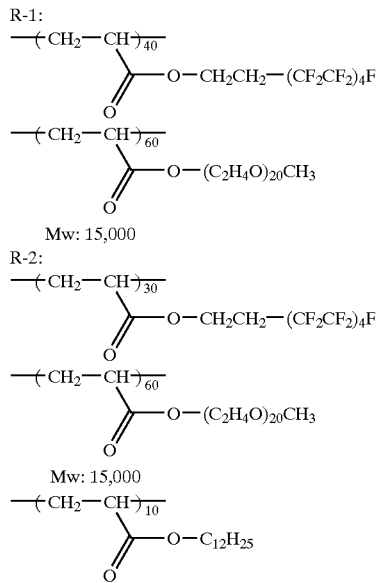

R-1, R-2 structures; Mw: 15,000

Each of photosensitive solutions obtained above was vigorously shaken within a bottle and bubbling was observed. In the evaluation of bubbling property, samples where serious bubbling took place and bubbles did not disappear even with passage of 30 minutes after the sample was left standing were rated X; samples where serious bubbling occurred but bubbles disappeared within 20 minutes after the sample was left standing were rated ◯; and samples where bubbling was less generated and bubbles disappeared within 5 minutes after the solution was left standing were rated ⊙.

Furthermore, surface state on the photosensitive layer-coated surface of each photosensitive printing plate thus manufactured was observed with an eye.

The surface state was shown by the number of pinholes generated per 1 m².

The results obtained are shown in Table 3.

TABLE 3

| | Photosensitive Material | Bubbling Property | Surface State |
|---|---|---|---|
| Example 1 | Photosensitive Material 1 | ◯ | 5 pinholes or less |
| Example 2 | Photosensitive Material 2 | ◯ | 5 pinholes or less |
| Example 3 | Photosensitive Material 3 | ◯ | 5 to 10 pinholes |
| Example 4 | Photosensitive Material 4 | ⊙ | 5 pinholes or less |
| Example 5 | Photosensitive Material 5 | ⊙ | 5 pinholes or less |
| Example 6 | Light Sensitive Material 6 | ⊙ | 5 pinholes or less |
| Example 7 | Photosensitive Material 7 | ⊙ | 3 pinholes or less |
| Example 8 | Photosensitive Material 8 | ⊙ | 2 pinholes or less |
| Example 9 | Photosensitive Material 9 | ⊙ | 2 pinholes or less |
| Example 10 | Photosensitive Material 10 | ⊙ | 3 pinholes or less |
| Example 11 | Photosensitive Material 11 | ⊙ | 3 pinholes or less |
| Example 12 | Light Sensitive Material 12 | ⊙ | 3 pinholes or less |
| Comparison 1 | Light Sensitive Material R1 | X | 20 pinholes or more |
| Comparison 2 | Photosensitive Material R2 | X | 20 pinholes or more |
| Comparison 3 | Photosensitive Material R3 | ◯ | mottled and uneven film throughout the surface |

As apparent from Table 3, by the addition of the fluorine-based polymer according to the present invention, the photosensitive material can exhibit excellent defoaming property with reduced bubbling and a lithographic printing plate precursor having excellent uniformity of the image-forming layer can be obtained.

EXAMPLES 13 TO 19 AND COMPARATIVE EXAMPLES 4 AND 5

Photosensitive Materials 13 to 19, R4 and R5 as lithographic printing plate precursors were manufactured thoroughly in the same manner as in the manufacture of Photosensitive Material 1 except for changing the fluorine-based polymer as shown in Table 4.

TABLE 4

| | Fluorine-Based Polymer (corresponding to Polymer No. in the specification) | Amount Added (in terms of solid content in fluorine-based polymer: g) |
|---|---|---|
| Photosensitive Material 13 (Invention) | P-6 | 0.02 g |
| Photosensitive Material 14 (Invention) | P-12 | 0.04 g |
| Photosensitive | P-54 | 0.05 g |

TABLE 4-continued

| | Fluorine-Based Polymer (corresponding to Polymer No. in the specification) | Amount Added (in terms of solid content in fluorine-based polymer: g) |
|---|---|---|
| Material 15 (Invention) | | |
| Photosensitive Material 16 (Invention) | P-39 | 0.01 g |
| Photosensitive Material 17 (Invention) | P-47 | 0.02 g |
| Photosensitive Material 18 (Invention) | P-67 | 0.02 g |
| Photosensitive Material 19 (Invention) | P-68 | 0.02 g |
| Light Sensitive Material R4 (Comparison) | R-3 (having structure shown below) | 0.01 g |
| Light Sensitive Material R5 (Comparison) | R-4 (having structure shown below) | 0.01 g |

R-3:

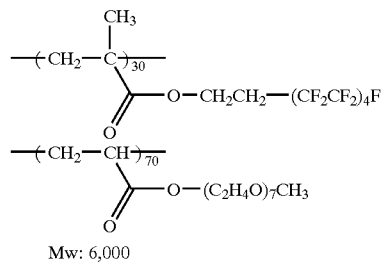

Mw: 6,000

R-4:

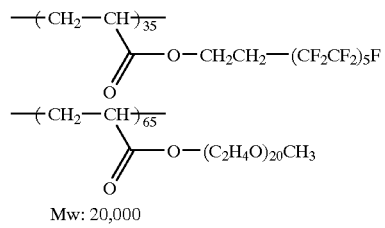

Mw: 20,000

The thus-prepared photosensitive lithographic printing plate precursors were evaluated as follows. Each photosensitive lithographic printing plate precursor was exposed by a metal halide lamp of 3 kW from a distance of 1.5 m for 1 minute through an original having a solid part and a halftone part, and then developed at 30° C. for 12 seconds in a PS processor 900 V manufactured by Fuji Photo Film Co., Ltd. in which the developer shown below and FP2W (1:1) as finisher produced by Fuji Photo Film Co., Ltd. were charged, to manufacture lithographic printing plates. Subsequently, printing was practiced using a printer R201 manufactured by Rholand and an ink GEOS-G(N) produced by Dainippon Ink & Chemicals, Inc. and the inking property was determined by counting the number of sheets until a sufficiently high ink density could be obtained on the image part at the initiation of printing. As the numerical value is smaller, the lithographic printing plate is better. Furthermore, the printing was performed until thinning started to occur in the solid part of the printed matter and the press life was evaluated by determining the number of sheets printed until the first occurrence of thinning. As the number of sheets printed is larger, the lithographic printing plate is more excellent.

Separately, 1 m² of each lithographic printing plate precursor was thoroughly exposed and developed with 100 ml of a developer and the generation of sludge in the developer after the processing was observed. The results are shown in Table 5.

(Developer Composition)

| Pure water | 90% by weight |
|---|---|
| D-Sorbitol | 6% by weight |
| KOH | 2.5% by weight |

TABLE 5

| | Photosensitive Material | Inking Property, number of sheets | Press Life, number of sheets | Generation of Sludge |
|---|---|---|---|---|
| Example 13 | Photosensitive Material 13 | 12 | 170,000 | none |
| Example 14 | Photosensitive Material 14 | 14 | 140,000 | none |
| Example 15 | Photosensitive Material 15 | 10 | 180,000 | none |
| Example 16 | Photosensitive Material 16 | 13 | 150,000 | none |
| Example 17 | Photosensitive Material 17 | 17 | 160,000 | none |
| Example 18 | Photosensitive Material 18 | 8 | 180,000 | none |
| Example 19 | Photosensitive Material 19 | 8 | 180,000 | none |
| Comparative Example 4 | Photosensitive Material R4 | 25 | 120,000 | generated and impracticable |
| Comparative Example 5 | Photosensitive Material R5 | 30 | 100,000 | generated and impracticable |

As seen from Table 5, the lithographic printing plate precursor of the present invention gives a lithographic printing plate satisfied in the inking property, the press life and the prevention of generation of sludge. This reveals that the lithographic printing plate precursor of the present invention holds excellent solubility and dispersibility in developer while exerting high inking property and high impression capacity by virtue of the high hydrophobicity.

EXAMPLES 20 TO 22 AND COMPARATIVE EXAMPLE 6

Photosensitive Materials 20 to 22, and R6 as a lithographic printing plate precursor were prepared thoroughly in the same manner as Photosensitive Material 1 except for changing the fluorine-based polymer as shown in Table 6.

TABLE 6

| | Fluorine-Based Polymer (corresponding to Polymer No. in the specification) | Amount Added (in terms of solid content in fluorine-based polymer: g) |
|---|---|---|
| Photosensitive Material 20 (Invention) | P-55 | 0.01 g |
| Photosensitive Material 21 (Invention) | P-58 | 0.05 g |
| Photosensitive Material 22 (Invention) | P-60 | 0.1 g |
| Light Sensitive | R-5 (having structure | 0.1 g |

TABLE 6-continued

| Fluorine-Based Polymer (corresponding to Polymer No. in the specification) | Amount Added (in terms of solid content in fluorine-based polymer: g) |
|---|---|
| Material R6 (Comparison) | shown below) |

R-5:

—(CH$_2$—C(CH$_3$))$_{10}$—C(=O)—O—CH$_2$CH$_2$—(CF$_2$CF$_2$)$_4$F

—(CH$_2$—CH)$_{25}$—C(=O)—O—CH$_2$CH$_2$—(CF$_2$CF$_2$)$_5$F

—(CH$_2$—CH)$_{30}$—C(=O)—O—(C$_2$H$_4$O)$_7$CH$_3$

—(CH$_2$—CH)$_{20}$—C(=O)—O—(C$_3$H$_6$O)$_{18}$CH$_3$

—(CH$_2$—CH)$_{10}$—C(=O)—O—C$_{18}$H$_{33}$        —(CH$_2$—CH)$_5$—C(=O)—O—CH$_3$

Mw: 12,000

The thus-prepared photosensitive lithographic printing plate precursors were evaluated as follows. Each photosensitive lithographic printing plate precursor was exposed by a metal halide lamp of 3 kW from a distance of 1 m for 1 minute through a step wedge (difference in density between steps: 0.15) manufactured by Fuji Photo Film Co., Ltd. and then developed with an aqueous solution having an SiO$_2$/K$_2$O molar ratio of 1.16 and an SiO$_2$ concentration of 1.4% at 30° C. for 12 seconds, and the sensitivity was expressed by the clear step number. As the step number is higher, the sensitivity is higher. The gradation is expressed by the difference between the clear step number and the solid step number of the sample evaluated above on the sensitivity. As the obtained value is higher, the contrast is higher. Separately, exposure and development were performed in the same manner as in the evaluation of sensitivity above except that solutions having a pH reduced or increased by 0.2 based on the above-described developer were used, and the development latitude was evaluated by expressing the change in the solid step number depending on the pH. As the obtained value is smaller, the development latitude is broader. The results are shown in Table 7.

TABLE 7

| | Photosensitive Material | Sensitivity | Gradation | Development Latitude |
|---|---|---|---|---|
| Example 20 | Photosensitive Material 20 | 6.0 | 5.5 | 5 |
| Example 21 | Photosensitive Material 21 | 5.75 | 4.5 | 6 |
| Example 22 | Photosensitive Material 22 | 6.0 | 4.5 | 5 |
| Comparative Example 6 | Photosensitive Material R6 | 6.0 | 6.5 | 7 |

As apparent from Table 7, in Examples 20 to 22, high contrast and good development latitude are exhibited without reducing the sensitivity.

EXAMPLES 23 AND 24

A 0.30 mm-thick aluminum plate formed of a construction material 1S was subjected to graining of the surface using a No. 8 nylon brush and a water suspension of 800-mesh pumice stones and then thoroughly washed with water. Subsequently, the aluminum plate was etched by dipping it in 10% sodium hydroxide at 70° C. for 60 seconds, washed with running water, rinsed by neutralization with 20% HNO$_3$ and washed with water. This aluminum plate was then subjected to an electrolytic surface-roughening treatment using a sine-wave alternating electric current under the condition of 12.7 V with an anode-time electricity of 300 coulomb/dm$^2$ in an aqueous 1% nitric acid solution. The surface roughness of the resulting plate was measured and found to be 0.45 μm (Ra indication). Thereafter, the plate was desmutted by immersing it in an aqueous 30% H$_2$SO$_4$ solution at 55° C. for 2 minutes, and then anodized in an aqueous 20% H$_2$SO$_4$ solution for 50 seconds at a current density of 5 A/dm$^2$ by disposing an anode on the grained surface, as a result, the thickness was 2.7 g/m$^2$.

The resulting plate was further immersed in an aqueous solution containing 2.5% by weight of No. 3 sodium silicate (SiO$_2$: 28–30%, Na$_2$O: 9–10%, Fe: 0.02% or less) and having a pH of 11.2 at 70° C. for 13 seconds, followed by washing with water. At this time, the silicate amount was 10 mg/m$^2$. In this measurement, the Si element amount was determined by fluorescent X-ray analysis. Thereafter, a liquid composition (sol solution) of GC process was prepared by the following procedure. In a beaker, the components shown below were weighed and stirred at 25° C. for 20 minutes.

| | |
|---|---|
| Si(OC$_2$H$_5$)$_4$ | 38 g |
| 3-Methacryloxypropyltrimethoxysilane | 13 g |
| Aqueous 85% phosphoric acid solution | 12 g |
| Ion exchanged water | 15 g |
| Methanol | 100 g |

The prepared solution was transferred to a three-neck flask and after fixing a reflux condenser, the three-neck flask was dipped in an oil bath at room temperature. While stirring the contents of the three-neck flask by a magnetic stirrer, the temperature was elevated to 50° C. over 30 minutes. The solution was further reacted for 1 hour while keeping the bath temperature at 50° C. to obtain a liquid composition (sol solution). The obtained sol solution was diluted with methanol/ethylene glycol (20/1 by weight) to 0.5% by weight, coated on a substrate by a wheeler and then dried at 100° C. for 1 minute. At this time, the coated amount was 4 mg/m². In the measurement of this coated amount, the Si element amount was determined by the fluorescent X-ray analysis and the value obtained was used as the coated amount. On the thus-treated aluminum plate, High-Sensitivity Polymerizable Composition 1 having a composition shown below was coated to a dry coated weight of 1.5 g/m² and dried at 100° C. for 1 minute to form a photosensitive layer.

[Photopolymerizable Composition 1]

| | |
|---|---|
| Tetramethylolmethane tetraacrylate | 1.5 g |
| Linear organic high molecular polymer (B1): allyl methacrylate/methacrylic acid copolymer (copolymerization molar ratio: 80/20, weight average molecular weight: 45,000) | 2.0 g |
| Sensitizer (C1) | 0.15 g |

[Structure of Sensitizer C1 with 4-methyl coumarin linked to barbiturate with Et₂N group, (n)C₄H₉ and (n)-C₄H₉ substituents]

($\lambda_{max}$ THF 479 nm, $\varepsilon = 6.9 \times 10^4$)

| | |
|---|---|
| Photopolymerization Initiator (D1) | 0.2 g |

[Structure of titanocene initiator with pyrrolyl-substituted difluorophenyl ligands]

| | |
|---|---|
| IRGACURE 907 (E1) (produced by Ciba-Geigy) | 0.4 g |
| Fluorine-based Polymer (see Table 8) | 0.2 g |
| ε-Phthalocyanine/(B1) dispersion | 0.2 g |
| Methyl ethyl ketone | 9.0 g |
| Propylene glycol monomethyl ether acetate | 7.5 g |
| Toluene | 11.0 g |

TABLE 8

| | Fluorine-Based Polymer (corresponding to Polymer No. in the specification) | Amount Added (in terms of solid content in fluorine-based polymer: g) |
|---|---|---|
| Example 23 (Invention) | P-5 | 0.2 g |
| Example 24 (Invention) | P-63 | 0.2 g |

On each of the thus-formed photosensitive layers, an aqueous solution containing 3% by weight of polyvinyl alcohol (saponification degree: 98 mol %, polymerization degree: 500) was coated as an oxygen-shielding protective layer to a dry coated weight of 2.5 g/m²₁ and then dried at 120° C. for 3 minutes to obtain a photopolymerizable lithographic printing plate precursor. The photosensitive layer had good layer uniformity. On the other hand, when the fluorine-base polymer (P-5) was excluded from the above-described photosensitive layer composition, the layer was mottled and uneven. (Comparative Example 7) Furthermore, a comparative photosensitive solution was prepared thoroughly in the same manner except for changing P-5 to R-1. As a result, although the photosensitive materials where P-5 and P-63 each was added were reduced in the bubbling property, the photosensitive material where R-1 was added exhibited poor defoaming property. (Comparative Example 8).

The obtained plates each was exposed under the conditions of 4,000 dpi and 175 lines/inch in 1% steps from 1 to 99% for respective two portions using XLP4000 (Ar laser: 75 mW, 488 nm) manufactured by Optonics. Thereafter, the plate was subjected to after-heat-treatment by exposing it to 120° C. for 20 seconds.

The development was performed by immersing the plate in the following developer at 25° C. for 30 seconds.

(Developer)

| | |
|---|---|
| 1K Potassium silicate | 30 g |
| Potassium hydroxide | 15 g |
| Water | 1,000 g |

Thereafter, the plate surface was treated with GU-7 (produced by Fuji Photo Film Co., Ltd.) gumming solution 2-fold diluted with water. The quantity of plate surface energy necessary for reproducing 1% under the conditions of 4,000 dpi and 175 lines/inch was determined as the sensitivity of the sample and found to be 0.2 mJ, revealing that the sensitivity was sufficiently high for the practical use. The dot quality with this exposure amount was also good and unnecessary fogging or flare was not observed. A press life test was performed using a printer SORKZ manufactured by Heidelberg Inc. and an ink KRAFT G(N) produced by Dainippon Ink & Chemicals, Inc., and as a result, 180,000 sheets or more of good printed matters could be obtained.

The obtained plate material was stored at 60° C. for 3 days and then similarly exposed, developed and printed. Thereafter, aging stability was evaluated with an eye, as a result, the press life, scumming property and image quality were good and not changed from those of the photosensitive material immediately after the coating.

The heat-crosslinking lithographic printing plate precursor is described below by referring to Examples.

<Structure of Crosslinking Agent [KZ-1]>

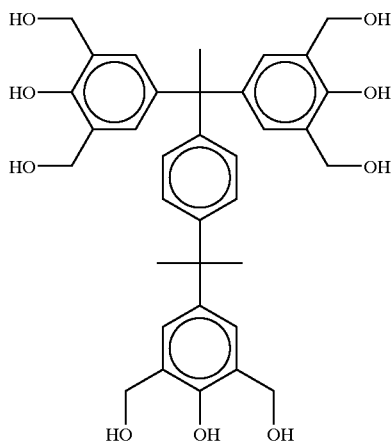

<Purchase of Binder Polymer [BP-1]>

MARCA LINKER M S-4P (trade name) (poly(p-hydroxystyrene)) produced by Maruzene Sekiyu Kagaku K.K. was purchased and designated as [BP-1].

EXAMPLES 25 AND 26

A 0.30 mm-thick aluminum plate (construction material 1050) was degreased by the washing with trichloroethylene and then, this surface was grained using a nylon brush and a water suspension of 400-mesh pumice stones and then thoroughly washed with water. The resulting plate was etched by immersing it in an aqueous 25% sodium hydroxide solution at 45° C. for 9 seconds and after washing with water, further immersed in 2% $HNO_3$ for 20 seconds, followed by washing with water. At this time, the etched amount of the grained surface was about 3 g/m². On this plate, an anodic oxide film was provided by passing a direct current of 3 g/m² at a current density of 15 A/dm² in an electrolytic solution of 7% $H_2SO_4$, and then the plate was washed with water and dried.

On the resulting aluminum plate, an undercoat solution shown below was coated and dried at 80° C. for 30 seconds. The dry coverage was 10 mg/m².

Undercoat Solution

| | |
|---|---|
| β-Alanine | 0.1 g |
| Phenylphosphonic acid | 0.05 g |
| Methanol | 40 g |
| Pure water | 60 g |

Then, Solution [G] shown below was prepared, coated on the undercoated aluminum plate and then dried at 100° C. for 1 minute to obtain a negative lithographic printing plate precursor. The coated surface was uniform and good. The dry coverage was 1.5 g/m².

Solution [G]

| | |
|---|---|
| Fluorine-based Polymer (see Table 9) | 0.05 g |
| Acid Generator [SH-1] | 0.3 g |
| Crosslinking Agent [KZ-1] | 0.5 g |
| Binder Polymer [BP-1] | 1.5 g |
| Infrared Absorbent [IK-1] | 0.07 g |
| AIZEN SPILON BLUE C-RH (produced by Hodogaya Chemical Co., Ltd.) | 0.035 g |
| Methyl ethyl ketone | 12 g |
| Methyl alcohol | 10 g |
| 1-Methoxy-2-propanol | 8 g |

The structures of Acid Generator [SH-1] and Infrared Absorbent [IK-1] used are shown below.

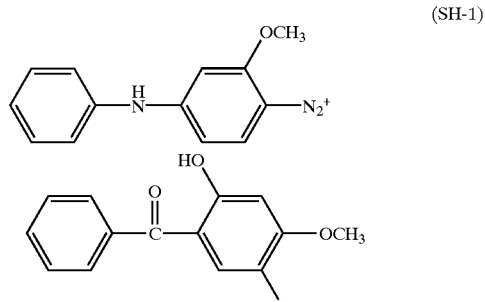

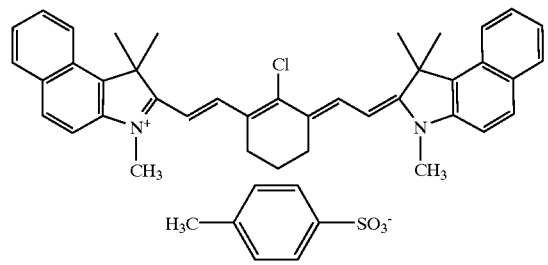

TABLE 9

| | Fluorine-Based Polymer (corresponding to Polymer No. in the specification) | Amount Added (in terms of solid content in fluorine-based polymer: g) |
|---|---|---|
| Example 25 (Invention) | P-19 | 0.05 g |
| Example 26 (Invention) | P-66 | 0.05 g |

The surface of the thus-obtained negative lithographic printing plate precursor was touched with a hand and thereafter, scan-exposed by a semiconductor laser of emitting an infrared ray at a wavelength of approximately from 820 to 850 nm. After the exposure, the plate was heat-treated at 110° C. for 30 seconds using a panel heater and then developed with a developer DP-4 (1:8 water dilution) produced by Fuji Photo Film Co., Ltd. After the image formation, the portion touched by a hand was examined with an eye whether the image was slipped or not, as a result, generation of image slipping was not observed.

COMPARATIVE EXAMPLE 9

A solution was prepared in the same manner as in Example 25 except for not using the fluorine-based polymer P-19 in the solution [B] used in Example 25. The obtained solution was coated on the undercoated aluminum plate used in Example 25 and dried at 100° C. for 1 minute to obtain a negative lithographic printing plate material. The coated surface was mottled and uneven. On this lithographic printing plate precursor, an image was formed by the same operation as in Example 25. After the image formation, the portion touched by a hand was examined with an eye whether or not the image was slipped, as a result, generation of a distinctive image slipping was observed.

The thermal positive lithographic printing plate precursor is described below by referring to Examples.

[Preparation of Copolymer 1]

Into a 20 ml-volume three-neck flask with a stirrer, a condenser and a dropping funnel, 4.61 g (0.0192 mol) of N-(p-aminosulfonylphenyl)methacrylamide, 2.94 g (0.0258 mol) of ethyl methacrylate, 0.80 g (0.015 mol) of acrylonitrile and 20 g of N,N-dimethylacetamide were charged and while heating at 65° C. in a hot water bath, the mixture was stirred. To this mixture, 0.15 g of "V-65" (produced by Wako Pure Chemical Industries, Ltd.) was added and while keeping at 65° C., the mixture was stirred for 2 hours in a nitrogen stream. To this reaction mixture, a mixture containing 4.61 g of N-(p-aminosulfonyl-phenyl) methacrylamide, 2.94 g of ethyl methacrylate, 0.80 g of acrylonitrile, N,N-dimethylacetamide and 0.15 g of "V-65" was further added dropwise through the dropping funnel over 2 hours.

After the completion of dropwise addition, the obtained mixture was further stirred at 65° C. for 2 hours. After the completion of reaction, 40 g of methanol was added to the mixture and cooled and the obtained mixture was charged into 2 liter of water while stirring the water. After stirring the mixture for 30 minutes, the precipitate was taken out by filtration and dried to obtain 15 g of a white solid. The weight average molecular weight (polystyrene standard) of this specific Copolymer 1 was measured by gel permeation chromatography and found to be 53,000.

[Manufacture of Substrate]

A 0.3 mm-thick aluminum plate (construction material 1050) was degreased by the washing with trichloroethylene and then, this surface was grained using a nylon brush and a water suspension of 400-mesh pumice stones, followed by thorough water washing. The resulting plate was etched by immersing it in an aqueous 25% sodium hydroxide solution at 45° C. for 9 seconds and after washing with water, further immersed in 20% nitric acid for 20 seconds, followed by washing with water. At this time, the etched amount of the grained surface was about 3 g/m². On this plate, an anodic oxide film was provided by passing a direct current of 3 g/m² at a current density of 15 A/dm² in an electrolytic solution of 7% sulfuric acid, and then the plate was washed with water and dried. On the resulting aluminum plate, an undercoat solution shown below was coated and dried at 90° C. for 1 minute. The dry coated amount of the coating was 10 mg/m².

Undercoat Solution

| β-Alanine | 0.5 g |
| Methanol | 95 g |
| Water | 5 g |

After further treating the plate with an aqueous 2.5% by weight sodium silicate solution at 30° C. for 10 seconds, an undercoat solution shown below was coated thereon and the coating was dried at 80° C. for 15 seconds to obtain a substrate. The dry coverage of the coating was 15 mg/m².

Undercoat Solution

| Compound shown below | 0.3 g |
| Methanol | 100 g |
| Water | 1 g |

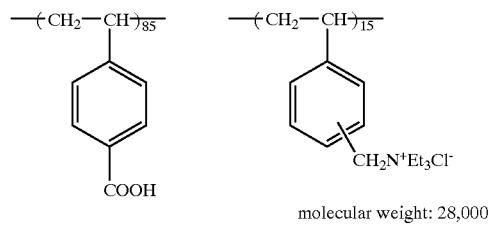

molecular weight: 28,000

EXAMPLES 27 AND 28

Photosensitive Solution 1 shown below was prepared. On the substrate obtained above, Photosensitive Solution 1 was coated to a coated amount of 1.8 g/m². As a result, a lithographic printing plate precursor having excellent coated surface state of the photosensitive layer was obtained.

| Photosensitive Solution 1 | |
| --- | --- |
| Fluorine-based Polymer (see Table 10) | 0.02 g |
| Copolymer 1 shown above | 0.75 g |
| m, p-Cresol novolak (m, p ratio: 6/4, weight average molecular weight: 3,500, containing 0.5% by weight of unreacted cresol) | 0.25 g |
| p-Toluenesulfonic acid | 0.003 g |
| Tetrahydrophthalic acid anhydride | 0.03 g |
| Cyanine Dye (IK-1) | 0.017 g |
| Dye obtained by changing the counter anion of Victoria Pure Blue BOH to 1-naphthalenesulfonic acid | 0.015 g |
| γ-Butyl lactone | 10 g |
| Methyl ethyl ketone | 10 g |
| 1-Methoxy-2-propanol | 1 g |

TABLE 10

| | Fluorine-Based Polymer (corresponding to Polymer No. in the specification) | Amount Added (in terms of solid content in fluorine-based polymer: g) |
| --- | --- | --- |
| Example 27 (Invention) | P-26 | 0.02 g |
| Example 28 (Invention) | P-62 | 0.02 g |

The obtained lithographic printing plate precursor was evaluated on the development stability against external scratches by the following method. The photosensitive surface of the lithographic printing plate precursor was scratched using a continuous load-type scratch strength tester "Model SB62" (manufactured by Shinto Kagaku) in such a manner that a filter paper "No. 5C" (produced by Advantec Toyo Co.) was attached to a 1 cm-square planar portion of a scratching jig which came to abut the printing plate, a load of 100 g was placed thereon and the plate was scratched at a speed of 6 cm/second. Subsequently, the plate was exposed to a 5% halftone image using a semiconductor layer having an output of 500 mW, a wavelength of 830 nm and a beam size of 17 μm (1/e²), at a main scanning speed of 5 m/sec and then developed with a developer "DP-4" (1:8) produced by Fuji Photo Film Co., Ltd. for 30 seconds. The obtained image formed good dots and the image part at the scratched portion was not dissolved at all. From this, the lithographic printing plate of the present invention was verified to have high development stability against external scratches.

Furthermore, in the Example 27, the photosensitive solution was less bubbled and the coated surface state was good by having 5 or less pinholes per 1 m². In the Example 28, the photosensitive solution was less bubbled and the coated surface state was good by having 3 or less pinholes per 1 m².

COMPARATIVE EXAMPLE 10

A lithographic printing plate precursor was obtained in the same manner as in Example 27 except for not using the fluorine-based polymer. The coated surface was mottled and uneven. This lithographic printing plate precursor was evaluated on the development stability against external scratches in the same manner as in Example 27. In the scratched portion, the unexposed halftone area which had to originally have an image was removed by the development.

COMPARATIVE EXAMPLE 11

A lithographic printing plate precursor was obtained in the same manner as in Example 27 except for changing the fluorine-based polymer to R-2. The photosensitive solution had high bubbling property and the time spent for reaching the disappearance of bubbles was 30 minutes or more, revealing poor production aptitude. This lithographic printing plate precursor was evaluated on the development stability against external scratches in the same manner as in Example 27. In the scratched portion, the unexposed halftone area which had to originally have an image was removed by the development.

It is seen from the results of Examples 27 and 28, and Comparative Examples 10 and 11 that by the addition of the specific fluorine-based polymer, the photosensitive solution exhibits excellent results in the bubbling property and defoamability and gives good surface state, and the photosensitive layer before development is improved in the stability against external scratches.

The thermal positive lithographic printing plate precursor of radial polymerization system is described below by referring to Examples.

[Preparation of Support]

A molten alloy according to JIS A 1050 containing 99.5% or more of aluminum, 0.30% of Fe, 0.10% of Si, 0.02% of Ti and 0.013% of Cu was purified and then cast. In the purifying treatment, a degassing treatment and a treatment with a ceramic tube filter were performed so as to remove unnecessary gases such as hydrogen in the molten alloy. The casting was performed by the DC casting method. The solidified ingot having a plate thickness of 500 nm was scalped in 10 nm from the surface to prepare an aluminum rolled plate. By controlling the roughness of the roll for rolling, the center line average surface roughness (Ra) after cold rolling was adjusted to 0.2 μm. Thereafter, the planarity was improved by applying a tension lever.

The plate was then surface-treated to prepare a lithographic printing plate support.

First, the rolling oil on the aluminum surface was removed by a degreasing treatment with an aqueous 10% sodium aluminate solution at 50° C. for 30 seconds and then subjected to removal of smuts by neutralization in an aqueous 30% sulfuric acid solution at 50° C. for 30 seconds.

Thereafter, in order to have good adhesion between the support and the photosensitive layer and at the same time, to impart water retentivity to the non-image area, a treatment for roughening the support surface, so-called gaining was performed. While keeping an aqueous solution containing 1% nitric acid and 0.5% aluminum nitrate at 45° C., an aluminum web was flown through the aqueous solution and on the way, electrically grained by passing a sine-wave alternating current from an indirect power feed cell at a current density of 20 A/dm² and a duty ratio of 1:1 and thereby supplying an anode-side electricity of 240 C/dm². Thereafter, the support was etched with an aqueous 10% sodium aluminate solution at 50° C. for 30 seconds and then desmutted by neutralization in an aqueous 30% sulfuric acid solution at 50° C. for 30 seconds.

Furthermore, in order to elevate the resistance against abrasion and chemicals and improve the water retentivity, an oxide film was formed on the support by anodization. More specifically, the aluminum web was passed through an electrolytic solution using an aqueous 20% sulfuric acid solution at 35° C. as the electrolyte and on the way, electrolyzed by feeding a direct current of 14 A/dm² from the indirect power feed cell to form an anodic oxide film of 2.5 g/m².

"Undercoating"

On this aluminum support, an undercoat solution shown below was coated by a wire bar to a dry coverage solid content of 5 mg/m² and dried at 90° C. for 30 seconds using a hot air-type dryer.

<Undercoat Solution>

| | |
|---|---|
| 2-Aminoethylphosphonic acid | 0.1 g |
| Phenylphosphonic acid | 0.1 g |
| Methanol | 75 g |
| Water | 25 g |

EXAMPLES 29 AND 30

On the thus-undercoated support, a coating solution for a photosensitive layer shown below was coated by a wire bar and dried at 115° C. for 45 seconds using a hot air-type dryer to obtain a negative lithographic printing plate precursor. The coated surface had excellent uniformity. The coated amount was 1.3 g/m².

<Coating Solution for Photosensitive Layer>

| | |
|---|---|
| Light-heat converting agent (Cyanine Dye TN-1) | 0.10 g |
| Heat radical generator (Sulfonium Salt Compound TN-2) | 0.30 g |
| Addition-polymerizable unsaturated compound (dipentaerythritol hexaacrylate) | 1.00 g |
| Alkali-soluble binder polymer (a copolymer of allyl methacrylate and methacrylic acid, the copolymerization molar ratio: 83:17, weight average molecular weight: 125,000) | 1.2 g |
| Coloring agent (naphthalene sulfonate of Victoria Pure Blue) | 0.04 g |
| Fluorine-based Polymer (see Table 11) | (see Table 11) |
| Methyl ethyl ketone | 10.0 g |
| 1-Methoxy-2-propanol | 8.0 g |

Structure of Cyanine Dye TN-1:

-continued

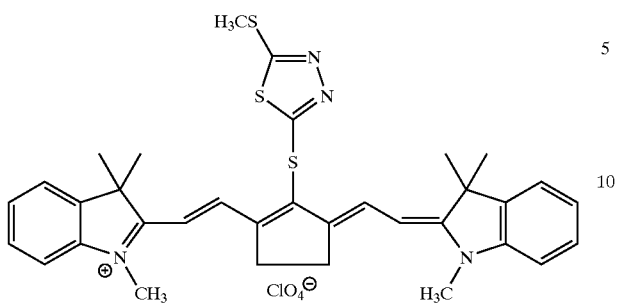

Structure of Sulfonium Salt Compound TN-2:

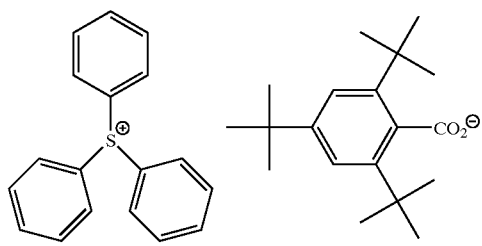

TABLE 11

| | Fluorine-Based Polymer (corresponding to Polymer No. in the specification) | Amount Added (in terms of solid content in fluorine-based polymer: g) |
|---|---|---|
| Example 29 (Invention) | P-38 | 0.005 g |
| Example 30 (Invention) | P-61 | 0.01 g |

The obtained negative lithographic printing plate precursor was exposed to a 50% halftone image using a TRBND-SETTER 3244VFS. a laser exposure equipment, manufactured by Creo Co. Ltd., where a water cooling-type 40W infrared semiconductor laser was mounted. The conditions in the exposure were such that the output was 9 W, the revolution number of the outer surface drum was 210 rpm, the one-side energy was 100 in mJ/cm$^2$ and the resolution was 2,400 dpi.

The exposed lithographic printing plate precursor was then developed using an automatic developing machine Stablon 900 N manufactured by Fuji Photo Film Co., Ltd. The developer and the replenisher used each had the following composition, the developing bath temperature was 30° C. and the finisher used was a 1:1 water diluted solution (pH: 10.8) of FN-6 produced by Fuji Photo Film Co., Ltd. A uniform and good halftone image could be obtained. Using the obtained lithographic printing plate, printing was performed in a printing machine Heidel SOR-M manufactured by Heidelberg Inc., as a result, in Example 29, 110,000 sheets or more of printed matters could be obtained, and in Example 30, 120,000 sheets or more of printed matters could be obtained.

| <Developer> | |
|---|---|
| Potassium carbonate | 10 g |
| Sodium dibutylnaphthalnesulfonate | 10 g |
| Ethylene glycol mononaphthyl ether | 20 g |
| Sodium sulfite | 3 g |
| Potassium hydroxyethane-diphosphonate | 2 g |
| Silicone SA730 (a surfactant produced by Toshiba Silicone) | 0.1 g |
| Water | 954.9 g |
| <Replenisher> | |
| Sodium carbonate monohydrate | 13 g |
| Sodium salt of ethylene glycol mononaphthyl ether monosulfate | 10 g |
| Ethylene glycol monododecyl ether | 20 g |
| Sodium sulfite | 3 g |
| Tetrasodium ethylenediaminetetraacetate | 1 g |
| Water | 953 g |

Furthermore, the photosensitive solution of this Examples 29 and 30 exhibited low bubbling property and spent 5 minutes or less until the bubbles disappeared, thus, verified to have satisfactory production aptitude.

COMPARATIVE EXAMPLE 12

A lithographic printing plate precursor was manufactured thoroughly in the same manner as in Example 29 except for removing the fluorine-based polymer from the photosensitive solution prepared above. The image-forming layer had insufficient uniformity. Furthermore, exposure and development were performed in the same manner as in Example 29, as a result, a scratch was generated in the halftone image area.

COMPARATIVE EXAMPLE 13

A lithographic printing plate precursor was manufactured thoroughly in the same manner as in Example 29 except for changing the fluorine-based polymer in the photosensitive solution prepared above to R-4. The bubbling property was high and 30 minutes or more was necessary until the bubbles disappeared, revealing poor production aptitude. The image-forming layer was insufficient in the uniformity. Furthermore, exposure and development were performed in the same manner as in Example 29, as a result, a scratch was generated in the halftone image area.

It is seen from the results in Example 29 and 30, and Comparative Examples 12 and 13 that by the use of the fluorine-based polymer of the present invention, a thermal negative lithographic printing plate having a uniform surface state and improved in the developer resistance of the image area can be obtained.

EXAMPLES 31 AND 32

[Preparation of Aluminum Substrate]

A 0.24 mm-thick aluminum plate according to JIS1050 was subjected to a pretreatment, a surface-roughening treatment, a hydrophilic film-forming treatment and if desired, an after-treatment in this order to manufacture an aluminum substrate for use in a lithographic printing plate precursor.

<Surface-Roughening Treatment>

The aluminum plate surface was surface-roughened using a nylon brush having a bristle diameter of 0.72 mm and a bristle length of 80 mm and a water suspension of pumice stones having an average particle size of about 15 to 35 µm and then thorough washed with water. Thereafter, the aluminum plate was etched by dipping it in an aqueous 10% sodium hydroxide solution at 70° C. for 30 seconds, washed with running water, rinsed by neutralization with an aqueous 20% nitric acid solution and then washed with water. The thus mechanically surface-roughened aluminum plate was further subjected to the following electrochemical surface-roughening treatment.

In an aqueous hydrochloric acid solution prepared by adding aluminum chloride to hydrochloric acid such that the hydrochloric acid concentration was 7.5 g/liter and the aluminum ion concentration was 5 g/liter, the aluminum plate mechanically surface-roughened above was subjected to an a.c. electrolysis at a liquid temperature of 35° C. by applying an alternating current using a radial cell. The alternating current used was a sine wave generated by adjusting the current and voltage of a commercial current at a frequency of 60 Hz using an induction voltage regulator and a transformer. The total quantity of electricity when the aluminum plate was serving as the anode was 50 C/dm$^2$ and the Qc/Qa in one cycle of the alternating current was 0.95.

The concentrations of hydrochloric acid and aluminum ion in the aqueous hydrochloric acid solution were kept constant by: determining the relationship of the temperature, electric conductivity and ultrasonic wave propagation velocity with the hydrochloric acid and aluminum ion concentrations; adding a concentrated hydrochloric acid having a concentration of 35% and water to the inside of an electrolytic cell body from a circulation tank, so that the temperature, electric conductivity and ultrasonic wave propagation velocity of the solution may be predetermined value; and overflowing the excess aqueous hydrochloric acid solution. Subsequently, the aluminum plate was subjected to an etching treatment using an alkali solution containing 5% of sodium hydroxide and 0.5% of aluminum ion at a liquid temperature of 45° C. such that the amount dissolved of aluminum plate on the surface-roughened surface was 0.1 g/m$^2$ and the amount dissolved on the surface opposite the surface-roughened surface was 0.05 g/m$^2$.

On both surfaces of the aluminum plate subjected to the etching treatment, an aqueous sulfuric acid solution containing 300 g/liter of sulfuric acid and 5 g/liter of aluminum ion at a liquid temperature of 50° C. was sprayed to perform a desmutting treatment.

<Production of Substrate>

The thus surface-roughened aluminum plate was subjected to an anodization treatment at a sulfuric acid concentration of 170 g/liter (containing 0.5% of aluminum ion), a liquid temperature of 30° C. and a current density of 5 A/dm$^2$ for 70 seconds and then washed with water. The amount of anodic oxide film formed was 3.5 g/m$^2$. Then, the aluminum plate was dipped in an aqueous sodium hydroxide solution at a pH of 13 and a liquid temperature of 30° C. for 30 seconds and then washed with water. Furthermore, the aluminum plate was dipped in 2.5% No. 3 sodium silicate at 25° C. for 14 seconds and then washed with water, thereby producing a substrate.

The surface-roughened shape of aluminum substrate obtained in Production Example and the physical property values of the hydrophilic film were described below together with respective measuring methods.

<Measuring Methods of Average Opening Diameter of Large Corrugations, Average Opening Diameter of Small Pits, and Ratio of Average Depth of Small Pits to Average Opening Diameter of Small Pits>

These values all were determined by taking an SEM photograph of the aluminum substrate surface. For determining the average opening diameter d2 (µm) of large corrugations, an SEM photographic at a magnification of 1,000 was used, corrugations having a clearly distinguishable contour were measured one by one on the long diameter and the short diameter, the average thereof was designated as the opening diameter of corrugation, and the sum of opening diameters of large corrugations measured in the SEM photograph was divided by 50 as the number of large corrugations measured. The SEM used was T-20 manufactured by Japan Electron Optics Laboratory Co., Ltd.

For determining the average opening diameter d1 (µm) of small pits, an SEM photograph at a magnification of 30,000 was used and the same operation as in the case of determining the opening diameter of large corrugations was performed. The SEM used here was S-900 manufactured by Hitachi Ltd.

For determining the ratio h/d1 of the average depth h (µm) of small pits to the average opening diameter d1 (µm) of small pits, an SEM photograph of the cross section at a magnification of 30,000 was used and an average of 50 portions measured was used.

The values in Production Example were as follows:
Average opening diameter of large corrugations: 17 µm
Average opening diameter of small pits: 0.05 µm
Ratio of average depth of small pits to average opening diameter of small pits: 0.20

On the thus-obtained substrate, coating was provided in the same manner as in Examples 27 and 29 to manufacture lithographic printing plate precursors and through plate-making, lithographic printing plates of Examples 31 and 32 were obtained. Each lithographic printing plate obtained was mounted on a plate cylinder of a printing machine Heidel SOR-M manufactured by Heidelberg Inc. and printing was performed by feeding a fountain solution, then feeding ink and further feeding paper. Subsequently, the printing machine was stopped and the printing plate while remaining attaching to the plate cylinder was allowed to stand at room temperature for 1 hour. Thereafter, the printing was re-started. After the re-starting, the number of printing sheets printed until a good printed matter free of staining was obtained was 8 and 10, respectively, and these are a sufficiently small number.

By incorporating a specific fluorine-based polymer into the image-forming layer, the lithographic printing plate precursor of the present invention can have all of such favorable properties that the photosensitive layer provided can have excellent uniformity without causing any production failures due to bubbling or the like, the surface in the image area is sufficiently hydrophobic, the developer resistance, inking property and press life are excellent, and the removability of non-image area is high. The positive lithographic printing plate precursor as one practical embodiment of the present invention can show a high-contrast image forming property without reducing the sensitivity in the non-image area and therefore, is satisfied in the wide development latitude. Furthermore, the negative lithographic printing plate precursor can have sufficiently high developer resistance in the image area.

The entire disclosure of each and every foreign patent application from which the benefit of foreign priority has been claimed in the present application is incorporated herein by reference, as if fully set forth.

What is claimed is:

1. A lithographic printing plate precursor comprising:
   a support; and
   an image-forming layer including a fluoroaliphatic group-containing copolymer, wherein the fluoroaliphatic group-containing copolymer contains a repeating unit corresponding to monomer (i) and a repeating unit corresponding to monomer (ii):
(i) a fluoroaliphatic group-containing monomer represented by formula (1) below, and
(ii) at least one of a poly(oxyalkylene) acrylate and a poly(oxyalkylene) methacrylate:

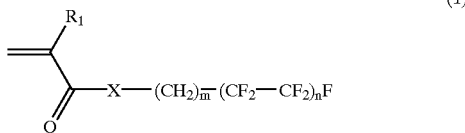

(1)

wherein $R_1$ represents a hydrogen atom or a methyl group; X represents an oxygen atom, a sulfur atom or —$N(R_2)$—; m represents an integer of 1 to 6; n represents an integer of 2 or 3; and $R_2$ represents a hydrogen atom or an alkyl group having 1 to 4 carbon atoms.

2. The lithographic printing plate precursor as described in claim 1, wherein the alkylene group in each of the poly(oxyalkylene) acrylate and the poly(oxyalkylene) methacrylate has 2 to 4 carbon atoms.

3. The lithographic printing plate precursor as described in claim 1, wherein the poly(oxyalkylene) group in each of the poly(oxyalkylene) acrylate and the poly(oxyalkylene) methacrylate has a weight average molecular weight of 250 to 3,000.

4. The lithographic printing plate precursor as described in claim 1, wherein the fluoroaliphatic group-containing copolymer contains the repeating unit corresponding to the monomer (i) in an amount of 5 mol % or more, based on the total amount of repeating units in the polymer.

5. The lithographic printing plate precursor as described in claim 1, wherein the fluoroaliphatic group-containing copolymer contains the repeating unit corresponding to the monomer (ii) in an amount of 10 mol % or more, based on the total amount of repeating units in the polymer.

6. The lithographic printing plate precursor as described in claim 1, wherein the fluoroaliphatic group-containing copolymer has a weight average molecular weight of 3,000 to 100,000.

7. The lithographic printing plate precursor as described in claim 1, wherein the image forming layer includes the fluoroaliphatic group-containing copolymer in an amount of 0.005 to 8 weight %, based on the weight of the image forming layer.

8. The lithographic printing plate precursor as described in claim 1, wherein the fluoroaliphatic group-containing copolymer contains:
the repeating unit corresponding to monomer (i);
the repeating unit corresponding to monomer (ii); and
a repeating unit corresponding to at least one of a poly(oxyethylene) acrylate and a poly(oxyethylene) methacrylate.

9. The lithographic printing plate precursor as described in claim 1, wherein the support is an aluminum substrate, and the image forming layer is a photosensitive layer containing a light-heat converting agent and a binder resin, in which the photosensitive layer can increase or decrease in solubility in an alkaline developer upon exposure to laser beams.

10. The lithographic printing plate precursor as described in claim 1, wherein the support is an aluminum substrate, and the image forming layer is a photosensitive layer containing a light-heat converting agent, a heat radical generator and a radical polymerizable compound, in which the photosensitive layer can decrease in solubility in an alkaline developer upon exposure to laser beams.

11. A lithographic printing plate precursor comprising:
a support; and
an image-forming layer including a fluoroaliphatic group-containing polymer,
wherein the fluoroaliphatic group-containing polymer contains a repeating unit corresponding to monomer (i), a repeating unit corresponding to monomer (ii) and a repeating unit corresponding to monomer (iii):
(i) a fluoroaliphatic group-containing monomer represented by formula (1) below,
(ii) at least one of a poly(oxyalkylene) acrylate and a poly(oxyalkylene) methacrylate, and
(iii) a monomer: copolymerizable with the monomers (i) and (ii); and represented by formula (2) below:

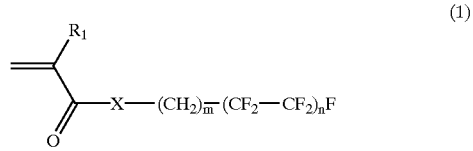

(1)

wherein $R_1$ represents a hydrogen atom or a methyl group; X represents an oxygen atom, a sulfur atom or —$N(R_2)$—; m represents an integer of 1 to 6; n represents an integer of 2 or 3; and $R_2$ represents a hydrogen atom or an alkyl group having 1 to 4 carbon atoms,

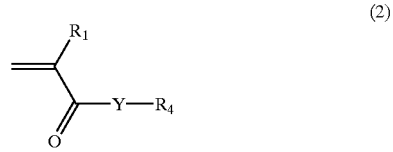

(2)

wherein $R_3$ represents a hydrogen atom or a methyl group, Y represents a divalent linking group, and $R_4$ represents a linear, branched or cyclic alkyl group having 4 to 20 carbon atoms.

12. The lithographic printing plate precursor as described in claim 11, wherein the alkylene group in each of the poly(oxyalkylene) acrylate and the poly(oxyalkylene) methacrylate has 2 to 4 carbon atoms.

13. The lithographic printing plate precursor as described in claim 11, wherein the poly(oxyalkylene) group in each of the poly(oxyalkylene) acrylate and the poly(oxyalkylene) methacrylate has a weight average molecular weight of 250 to 3,000.

14. The lithographic printing plate precursor as described in claim 11, wherein the fluoroaliphatic group-containing copolymer contains the repeating unit corresponding to the monomer (i) in an amount of 5 mol % or more, based on the total amount of repeating units in the polymer.

15. The lithographic printing plate precursor as described in claim 11, wherein the fluoroaliphatic group-containing copolymer contains the repeating unit corresponding to the monomer (ii) in an amount of 10 mol % or more, based on the total amount of repeating units in the polymer.

16. The lithographic printing plate precursor as described in claim 11, wherein the fluoroaliphatic group-containing copolymer contains the repeating unit corresponding to the monomer (iii) in an amount of 3 mol % or more, based on the total amount of repeating units in the polymer.

17. The lithographic printing plate precursor as described in claim 11, wherein the fluoroaliphatic group-containing copolymer has a weight average molecular weight of 3,000 to 100,000.

18. The lithographic printing plate precursor as described in claim 11, wherein the image forming layer includes the fluoroaliphatic group-containing copolymer in an amount of 0.005 to 8 weight %, based on the weight of the image forming layer.

19. The lithographic printing plate precursor as described in claim 11, wherein the fluoroaliphatic group-containing copolymer contains:

the repeating unit corresponding to monomer (i);

the repeating unit corresponding to monomer (ii);

the repeating unit corresponding to monomer (iii); and a repeating unit corresponding to at least one of a poly(oxyethylene) acrylate and a poly(oxyethylene) methacrylate.

20. The lithographic printing plate precursor as described in claim 11 wherein the support is an aluminum substrate, and the image forming layer is a photosensitive layer containing a light-heat converting agent and a binder resin, in which the photosensitive layer can increase or decrease in solubility in an alkaline developer upon exposure to laser beams.

21. The lithographic printing plate precursor as described in claim 11, wherein the support is an aluminum substrate, and the image forming layer is a photosensitive layer containing a light-heat converting agent, a heat radical generator and a radical polymerizable compound, in which the photosensitive layer can decrease in the solubility in an alkaline developer upon exposure to laser beams.

* * * * *